(12) United States Patent
Todd, II et al.

(10) Patent No.: US 10,651,634 B2
(45) Date of Patent: May 12, 2020

(54) APPARATUS AND METHOD FOR SECURING AN ENCLOSURE

(71) Applicant: DeWalch Technologies, Inc., Houston, TX (US)

(72) Inventors: Tyler Dean Todd, II, Houston, TX (US); Aditya Kumar Palthi, Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 13/686,881

(22) Filed: Nov. 27, 2012

(65) Prior Publication Data

US 2013/0242469 A1  Sep. 19, 2013

Related U.S. Application Data

(63) Continuation-in-part of application No. 12/378,879, filed on Feb. 20, 2009, and a continuation of
(Continued)

(51) Int. Cl.
*H02G 3/08* (2006.01)
*B65D 55/14* (2006.01)
(Continued)

(52) U.S. Cl.
CPC ............. *H02B 1/063* (2013.01); *G01R 11/04* (2013.01); *G01R 11/24* (2013.01); *H02B 1/03* (2013.01);
(Continued)

(58) Field of Classification Search
CPC ............. H02G 3/08; H02G 3/081; H05K 5/00; H05K 5/02; H05K 5/0208; H05K 5/0221;
(Continued)

(56) References Cited

U.S. PATENT DOCUMENTS 1,177,728 A    4/1916  Synder
4,080,811 A *  3/1978  Nielsen, Jr. ..................... 70/164
(Continued)

OTHER PUBLICATIONS

ISR and Written Opinion for International Application No. PCT/US2012/066687 filed Nov. 27, 2012 (10 pages).
(Continued)

*Primary Examiner* — Angel R Estrada
(74) *Attorney, Agent, or Firm* — DeWalch Technologies, Inc.

(57) ABSTRACT

The present invention relates to an apparatus and method for securing a box cover to a watthour meter socket box. In certain embodiments, the apparatus has a clamping member that fits over a wall of a meter box and a lock housing that locks to the clamping member after a box cover has been installed thereby securing the cover to the box. Further embodiments relate to a clamping member and a lock housing wherein the clamping member generally comprises a clamp, clamp actuating member, and fastening shelf, and wherein the clamp actuating member may comprise a lever or threaded member to attach the clamping member to a wall of a meter box base. The box cover is secured to the meter box base when the clamping member is secured to the wall and used in combination with the lock housing and a locking shaft.

56 Claims, 30 Drawing Sheets

Related U.S. Application Data application No. 11/705,653, filed on Feb. 12, 2007, now abandoned, and a continuation-in-part of application No. 10/823,285, filed on Apr. 13, 2004, now Pat. No. 7,176,376, and a continuation-in-part of application No. 11/434,665, and a continuation-in-part of application No. PCT/US2006/018783, filed on May 16, 2006, now abandoned.

(60) Provisional application No. 60/793,104, filed on Apr. 19, 2006, provisional application No. 60/681,200, filed on May 16, 2005.

(51) Int. Cl.
```
B23P 11/00      (2006.01)
H05K 5/02       (2006.01)
H02B 1/06       (2006.01)
G01R 11/04      (2006.01)
G01R 11/24      (2006.01)
H02B 1/03       (2006.01)
```

(52) U.S. Cl.
CPC ......... *H05K 5/0208* (2013.01); *H05K 5/0221* (2013.01)

(58) Field of Classification Search
CPC ...... H05K 5/0217; G01R 11/04; G01R 11/24; F16B 441/005; F16B 41/005; H01R 13/6277; H01R 13/6271; H01R 13/627; H01R 13/6397; H02B 1/063; H02B 1/03
USPC ......... 174/480, 481, 50, 53, 135, 58, 38, 57; 70/2, 6–14, 158–173, 370, 386, 77, 63, 70/451, 466; 248/906, 551, 552, 553; 439/535, 536; 220/3.2, 3.3, 3.8, 4.02; 292/281, 282; 361/600, 601, 659, 672
See application file for complete search history.

(56) References Cited

U.S. PATENT DOCUMENTS

| | | | |
|---|---|---|---|
| 6,742,365 B1* | 6/2004 | Sullivan et al. | 70/2 |
| 6,763,691 B1* | 7/2004 | Rafferty | 70/164 |
| 6,931,893 B2* | 8/2005 | Agbay | 70/2 |
| 6,976,373 B1* | 12/2005 | Sullivan et al. | 70/2 |
| 7,021,090 B1* | 4/2006 | Nolle et al. | 70/2 |
| 7,176,376 B2* | 2/2007 | Stachowiak, Jr. | 174/50 |
| 7,377,134 B1* | 5/2008 | Sullivan et al. | 70/2 |
| 2005/0224250 A1 | 10/2005 | Stachowiak | |
| 2007/0205012 A1 | 9/2007 | Stachowiak | |

OTHER PUBLICATIONS

Image File Wrapper—Bibliographic Data Sheets from Pair—for International Application No. PCT/US2012/066687 filed Nov. 27, 2012 (4 pages).
Ad/Brochure/etc.—Brooks, Seals & Locking Devices for Electric Utility Companies, (1999) (pp. 1-8; and see pp. 5 and 7)* (8 pages)—Information unclear regarding content and date (No admission is being made regarding applicability, relevancy, materiality or otherwise and as per IDS Statement Submitted Aug. 31, 2016).
Ad/Brochure/etc.—International Utilities Revenue Protection Association (Oct., 2002) Bullseye Ringless Meter-Locks, etc. (2nd page (indicated as p. 2)), Jiffy Lock (3rd p. (indicated as p. 10)* (3 pages)—*Information unclear regarding content and date (no. admission is being made regarding applicability, relevancy, materiality or otherwise and as per Ids Statement Submitted Aug. 31, 2016).
Ad/Brochure/etc.—International Utilities Revenue Protection Association (Apr., 2003) Sidewinder Locks, Bullseye Ringless Meter-Locks, etc. (2nd p.), Jiffy Lock (3rd p.)* (3 pages)—*Information unclear regarding content and date (No admission is being made regarding applicability, relevancy, materiality or otherwise and as per IDS Statement Submitted Aug. 31, 2016).
Ad/Brochure/etc.–Brooks, Utility Products Group (2004) (1st page), Hex Guard, Hex Guard II, Armor Guard and Super Armor Guard, etc. (7th and 8th pp.)* (12 pp.)—*Information unclear regarding content and date (no. admission is being made regarding applicability, relevancy, materiality or otherwise and as per IDS Statement Submitted Aug. 31, 2016).
/Ae/Ad/Brochure/etc.—Brooks, Utility Products Group Problem Solvers (2004) New Quik Lock, etc. (1st and 2nd pages)* (2 pages)—information unclear regarding content and date (No admission is being made regarding applicability, relevancy, materiality or otherwise and as per Ids Statement Submitted Aug. 31, 2016).
International Preliminary Report on Patentability dated Mar. 24, 2015 for International Application No. PCT/ US2012/066687 filed Nov. 27, 2012* (7 pages)—*(No admission is being made regarding applicability, relevancy, materiality or otherwise and as per IDS Statement Submitted Aug. 31, 2016).
Notice of Allowance issued by the USPTO dated Aug. 11, 2006, U.S. Appl. No. 10/823,285 (7 pages).
Amendment after Notice of Allowance issued by the USPTO dated Aug. 11, 2006, U.S. Appl. No. 10/823,285 (23 pages).
Office Action dated Mar. 24, 2010 including Notice of References Cited in connection with U.S. Appl. No. 112/317,086 (11 pages).
IURPA Brochure, vol. 13, Issue 1, dated Oct. 2002, Cover page, p. 10—"Jiffy Lock" (2 pages).
Image File Wrapper—Bibliographic Data Sheets from PAIR—for U.S. Appl. No. 10/823,285 filed Apr. 13, 2004 (2 pages).
Image File Wrapper—Bibliographic Data Sheet from PAIR—for U.S. Appl. No. 11/705,653 filed Feb. 12, 2007 (1 page).
Image File Wrapper—Bibliographic Data Sheets from PAIR—for U.S. Appl. No. 12/378,879 filed Feb. 20, 2009 (5 pages).
Image File Wrapper—Bibliographic Data Sheet from PAIR—for U.S. Appl. No. 11/434,665 filed May 16, 2006 (1 page).
Image File Wrapper—Bibliographic Data Sheets from PAIR—for U.S. Appl. No. 12/317,086 filed Dec. 20, 2008 (3 pages).
Mexican Institute of Industrial Property (MIIP) Office Action per Letter dated Oct. 11, 2007 from Foreign Counsel (Becerril, Coca & Becerril) (for related Mexican Application No. PA/A/2004/012315 filed Dec. 8, 2004) (3 Pages).
Applicant's MIIP Office Action Response dated Dec. 21, 2007 (for related Mexican Application No. PA/A/2004/012315 filed Dec. 8, 2004) (30 Pages).
Notice of Allowance from the MIIP per Letter dated Feb. 15, 2008 from Foreign Counsel (Becerril, Coca & Becerril) (for related Mexican Application No. PA/A/2004/012315 filed Dec. 8, 2004) (1 Page).
Mexican Institute of Industrial Property (MIIP) Office Action per Letter dated Jul. 12, 2012 from Foreign Counsel (Becerril, Coca & Becerril) (for related Mexican Application No. MX/A/2011/008120) (Three (3) Pages).
Applicant's e-mail and attached MIIP Office Action Response dated Oct. 15, 2012 (for related Mexican Application No. MX/A/2011/008120 (Eleven (11) Pages).
Letter from Foreign Counsel dated Mar. 27, 2013 confirming payment of issue fee and annuity tax to MIIP in connection with Mexican Patent Application No. MX/A/2011/008120 (8 pages).
Notice of Non-Final Rejection dated Sep. 18, 2007 in connection with related U.S. Appl. No. 11/434,665 (12 pages).
Applicant's Response to Office Action dated Mar. 18, 2008 including Amendment and Extension Notice of Cited in connection with related U.S. Appl. No. 11/434,665 (19 pages).
Final Rejection dated Jun. 23, 2008 in connection with related U.S. Appl. No. 11/434,665 (12 pages).
Abandonment dated Feb. 18, 2009 in connection with related U.S. Appl. No. 11/434,665 in lieu of U.S. Appl. No. 11/705,653 (2 pages).
Non-Final Rejection dated Nov. 1, 2007 in connection with U.S. Appl. No. 11/705,653 (5 pages).
Applicant's Response to Non-Final Office Action dated May 1, 2008 with Amendment and Extension in connection with U.S. Appl. No. 11/705,653 (12 pages).

(56) References Cited

OTHER PUBLICATIONS

Final Rejection dated Aug. 20, 2008 in connection with U.S. Appl. No. 11/705,653 (11 pages).
Abandonment dated Mar. 24, 2009 in connection with U.S. Appl. No. 11/705,653 in lieu of U.S. Appl. No. 12/378,879 (3 pages).
Mexican Institute of Industrial Property (MIIP) Office Action per Letter dated May 27, 2010 from Foreign Counsel (Becerril, Coca & Becerril) (for related Mexican Application No. MX/A/2008/000365) (11 pages).
Response to Mexican Institute of Industrial Property (MIIP) Office Action per Letter dated Sep. 10, 2010 to Foreign Counsel (Becerril, Coca & Becerril) (for related Mexican Application No. MX/A/2008/000365) (18 pages).
Filing Report confirming Response filed to Mexican Institute of Industrial Property (MIIP) Office Action per Letter dated Sep. 22, 2010 from Foreign Counsel (Becerril, Coca & Becerril) (for related Mexican Application No. MX/A/2008/000365) (11 pages).
Mexican Institute of Industrial Property (MIIP) Office Action per Letter dated Jan. 24, 2011 from Foreign Counsel (Becerril, Coca & Becerril) (for related Mexican Application No. MX/A/2008/000365) (7 pages).
Response to Mexican Institute of Industrial Property (MIIP) Office Action per letter dated Feb. 25, 2011 to Foreign Counsel (Becerril, Coca & Becerril) (for related Mexican Application No. MX/A/2008/000365) (5 pages).
Further communication to Response to Mexican Institute of Industrial Property (MIIP) Office Action per letter dated Feb. 25, 2011 to Foreign Counsel (Becerril, Coca & Becerril) (for related Mexican Application No. MX/A/2008/000365) (5 pages).
Filing Report and Response to Mexican Institute of Industrial Property (MIIP) Office Action per Letter dated Mar. 14, 2011 from Foreign Counsel (Becerril, Coca & Becerril) (for related Mexican Application No. MX/A/2008/000365) (11 pages).
Letter dated May 2, 2011 from Foreign Counsel (Becerril, Coca & Becerril) confirming Notice of Allowance (for related Mexican Application No. MX/A/2008/000365) (2 Page).
Letter dated Aug. 29, 2011 from Foreign Counsel confirming payment of Issue Fee (Becerril, Coca & Becerril) (for related Mexican Application No. MX/A/2008/000365) (1 Page).
Letter dated Dec. 13, 2011 from Foreign Counsel with attached Letters Patent (Becerril, Coca & Becerril) (for related Mexican Application No. MX/A/2008/000365) (1 Page).
Letter from Foreign Counsel (Becerril, Coca & Becerril) dated May 19, 2016 with publication in connection with Mexican Patent Application No. MX/A/2015/006728 (7 pages).
Mexican Institute of Industrial Property (MIIP) Office Action per Letter dated Feb. 28, 2018 from Foreign Counsel (Becerril, Coca & Becerril) (for related Mexican Application No. MX/A/2015/006728) (2 pages).
Response to Mexican Institute of Industrial Property (MIIP) Office Action per Letter dated Jun. 13, 2018 to Foreign Counsel (Becerril, Coca & Becerril) (for related Mexican Application No. MX/A/2015/006728) (18 pages).
Filing Report and Response to Mexican Institute of Industrial Property (MIIP) Office Action per Letter dated Jun. 22, 2018 from Foreign Counsel (Becerril, Coca & Becerril) (for related Mexican Application No. MX/A/2015/006728) (10 pages).
Mexican Institute of Industrial Property (MIIP) Office Action per Letter dated Nov. 8, 2018 from Foreign Counsel (Becerril, Coca & Becerril) (for related Mexican Application No. MX/A/2015/006728) (7 pages).
Email and Response to Mexican Institute of Industrial Property (MIIP) Office Action per Letter dated Mar. 4, 2019 to Foreign Counsel (Becerril, Coca & Becerril) (for related Mexican Application No. MX/A/2015/006728) (13 pages).
Filing Report and Response filed to Mexican Institute of Industrial Property (MIIP) Office Action per Letter dated Mar. 12, 2019 from Foreign Counsel (Becerril, Coca & Becerril) (for related Mexican Application No. MX/A/2015/006728) (7 pages).
Mexican Institute of Industrial Property (MIIP) Office Action per Letter dated Jun. 25, 2019 from Foreign Counsel (Becerril, Coca & Becerril) (for related Mexican Application No. MX/A/2015/006728) (10 pags).
Email and Response to Mexican Institute of Industrial Property (MIIP) Office Action per Letter dated Oct. 23, 2019, 2019 to Foreign Counsel (Becerril, Coca & Becerril) (for related Mexican Application No. MX/A/2015/006728) (22 pages).
Filing Report and Response filed to Mexican Institute of Industrial Property (MIIP) Office Action per Letter dated Oct. 29, 2019 from Foreign Counsel (Becerril, Coca & Becerril) (for related Mexican Application No. MX/A/2015/006728) (19 pages).

\* cited by examiner

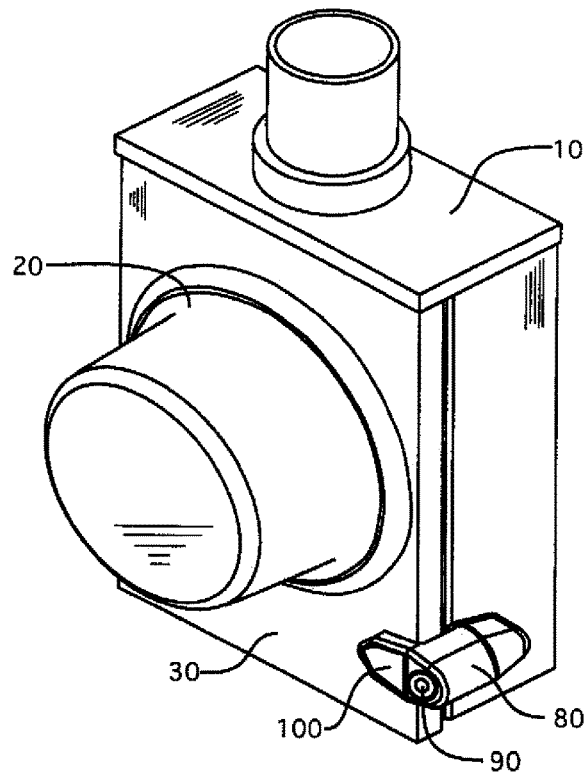
FIG. 3
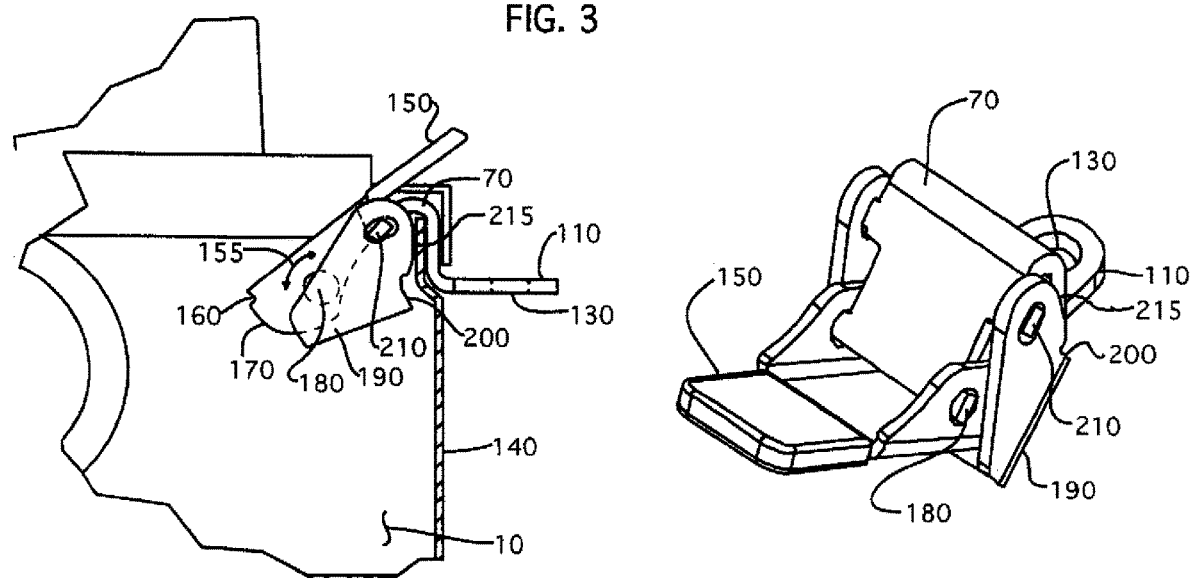
FIG. 4A
FIG. 4B

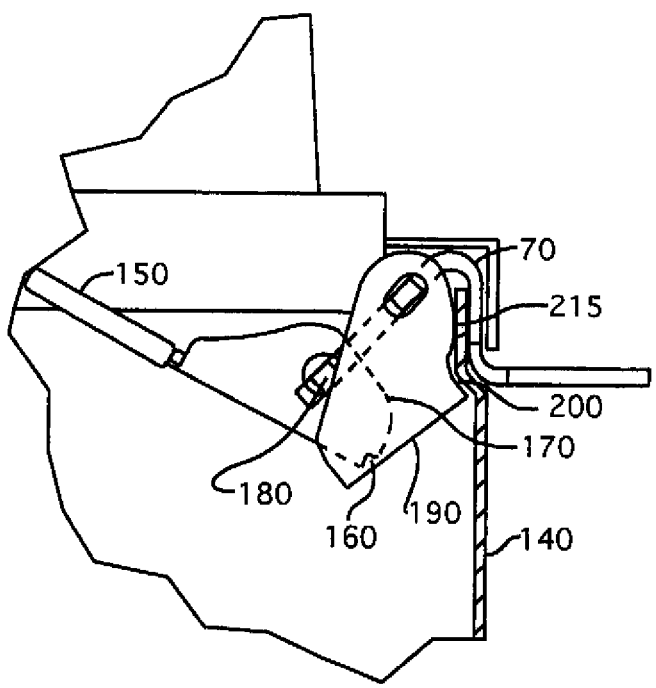
FIG. 5A
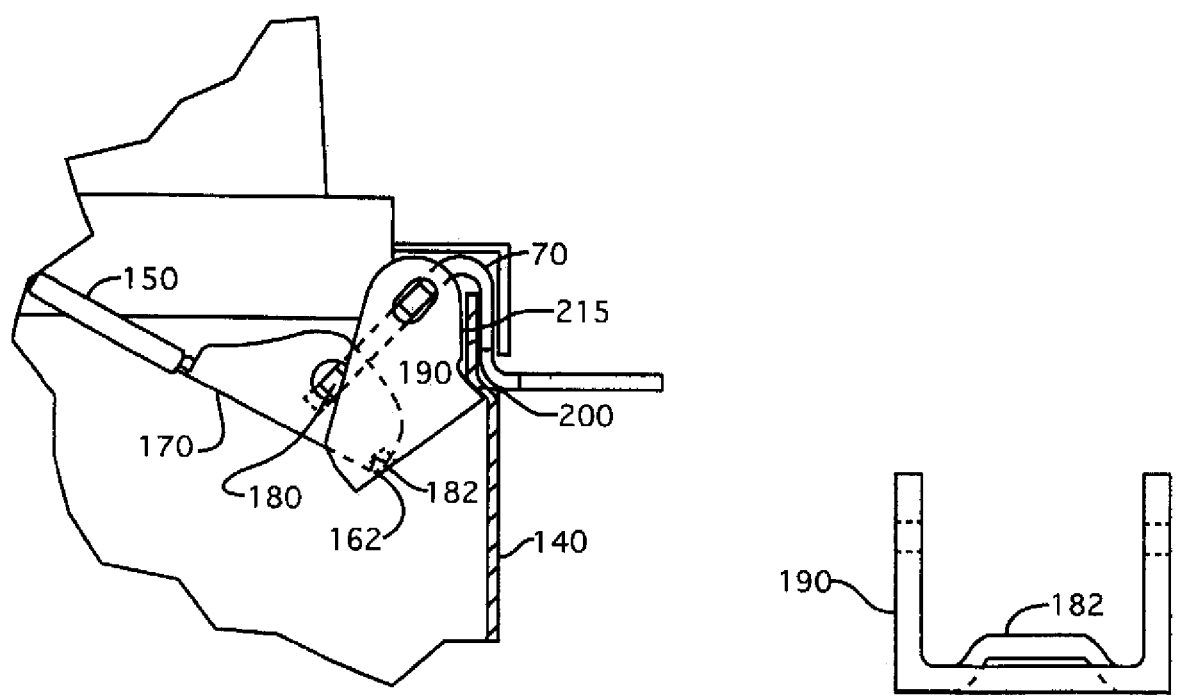
FIG. 5B
FIG. 5C

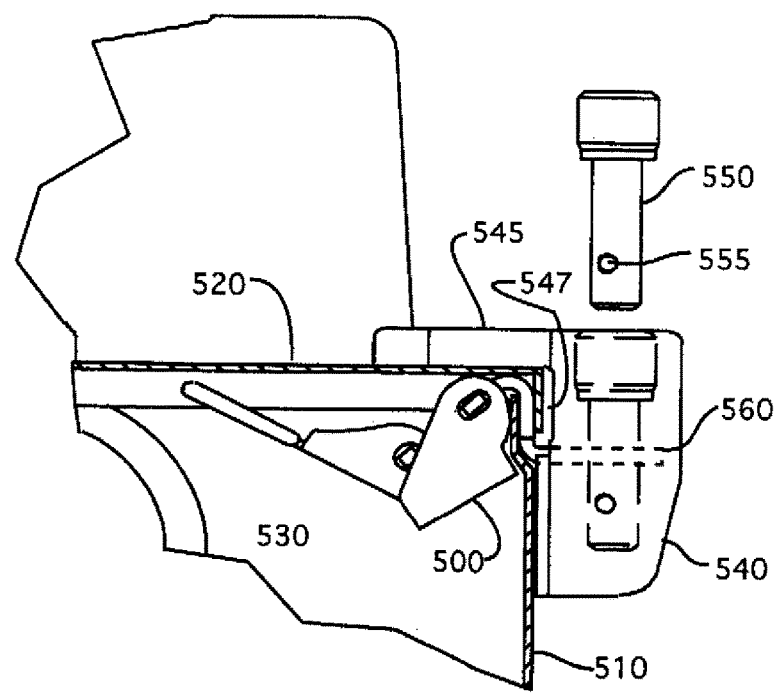
FIG. 7A
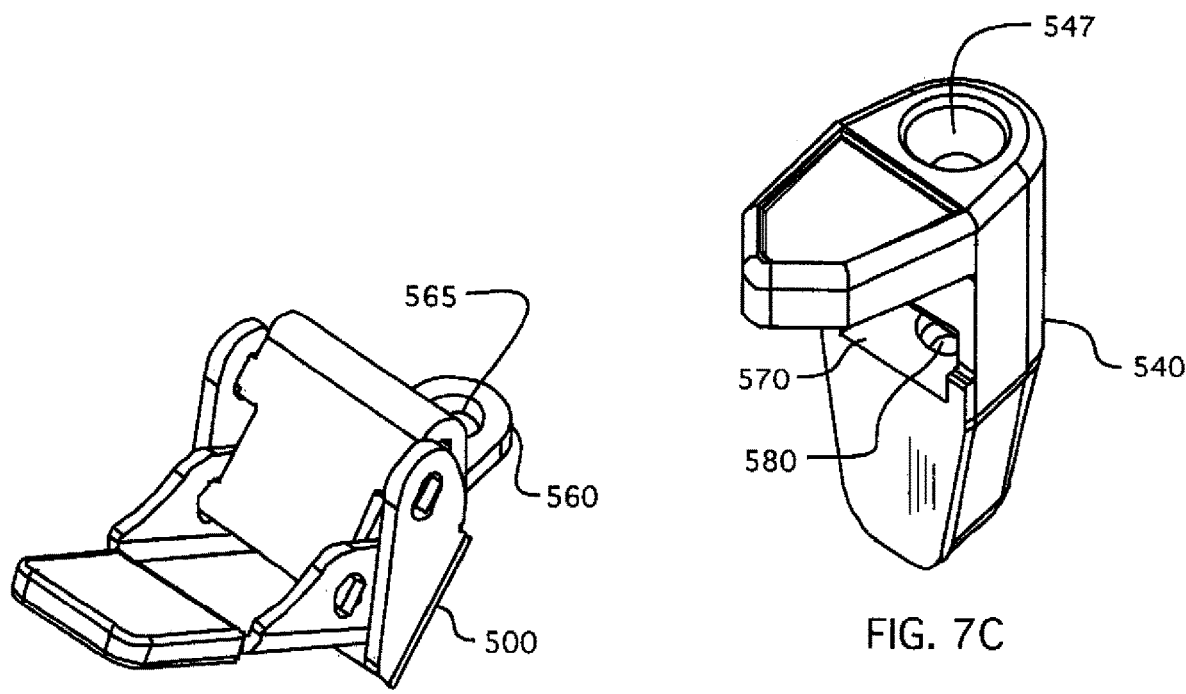
FIG. 7B
FIG. 7C

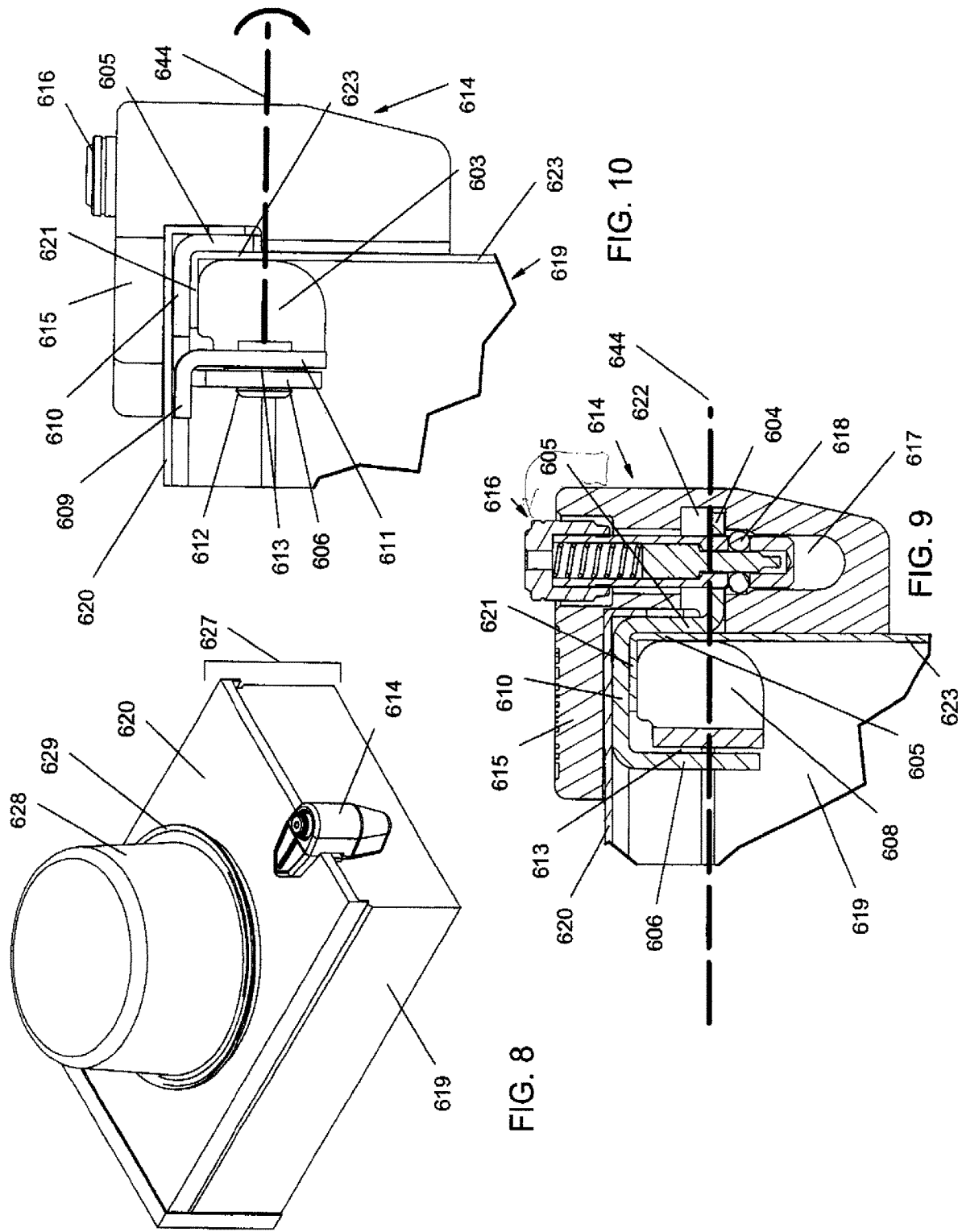

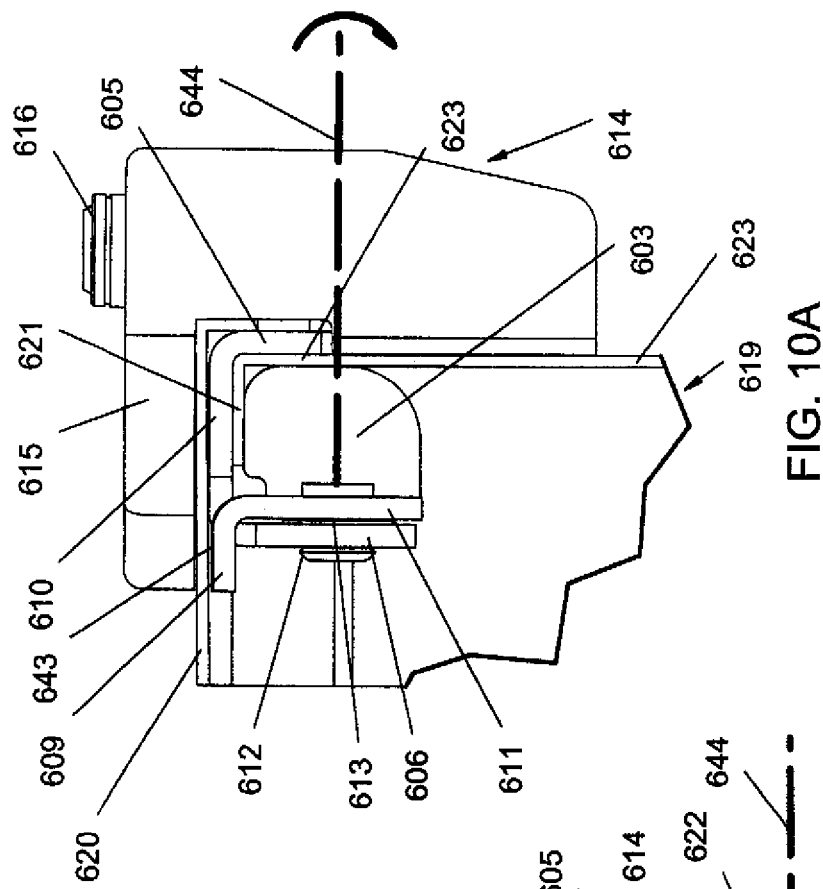
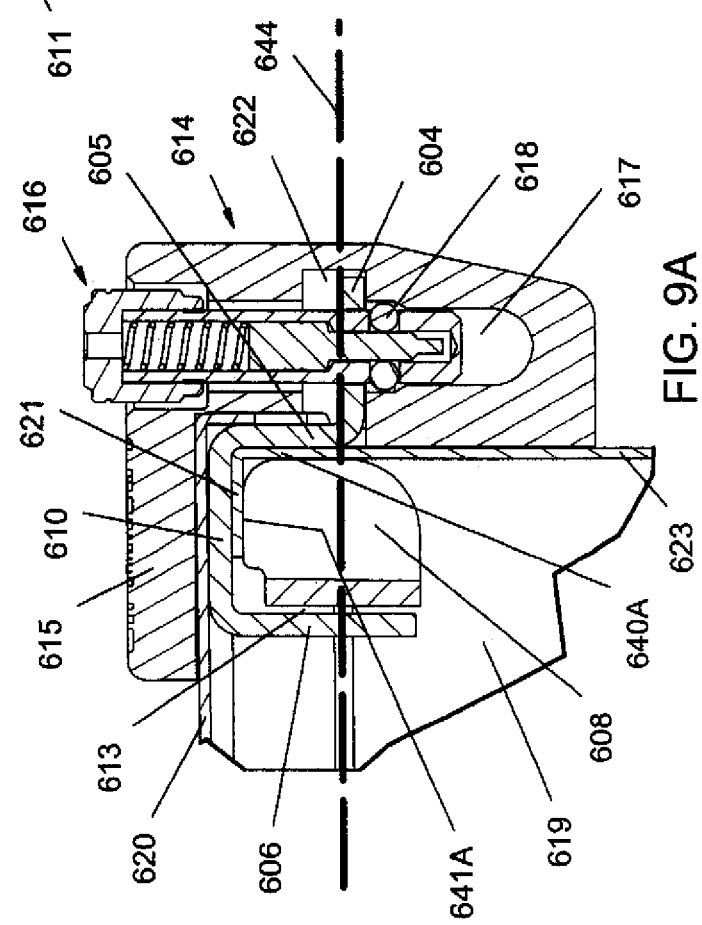
FIG. 10A
FIG. 9A

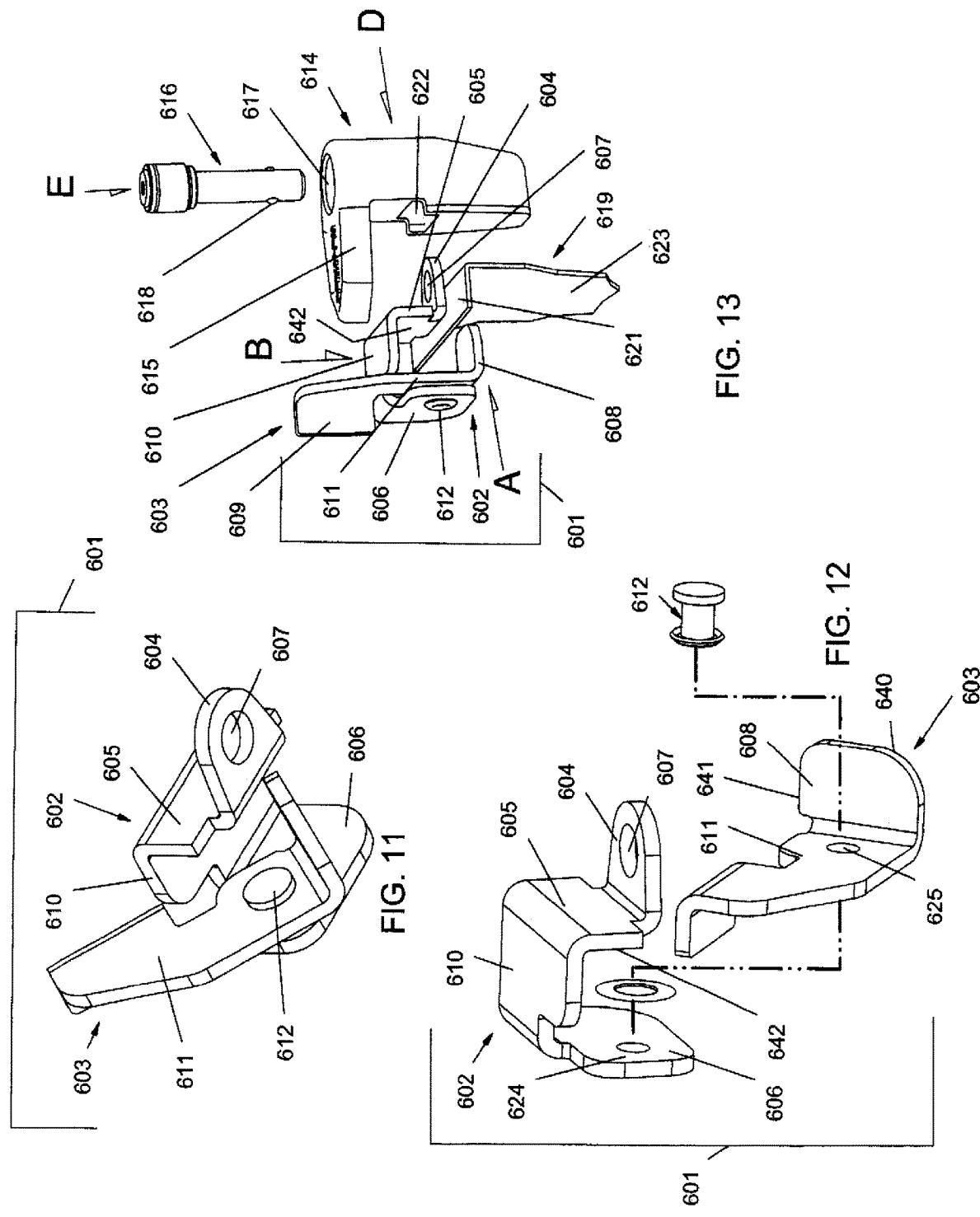

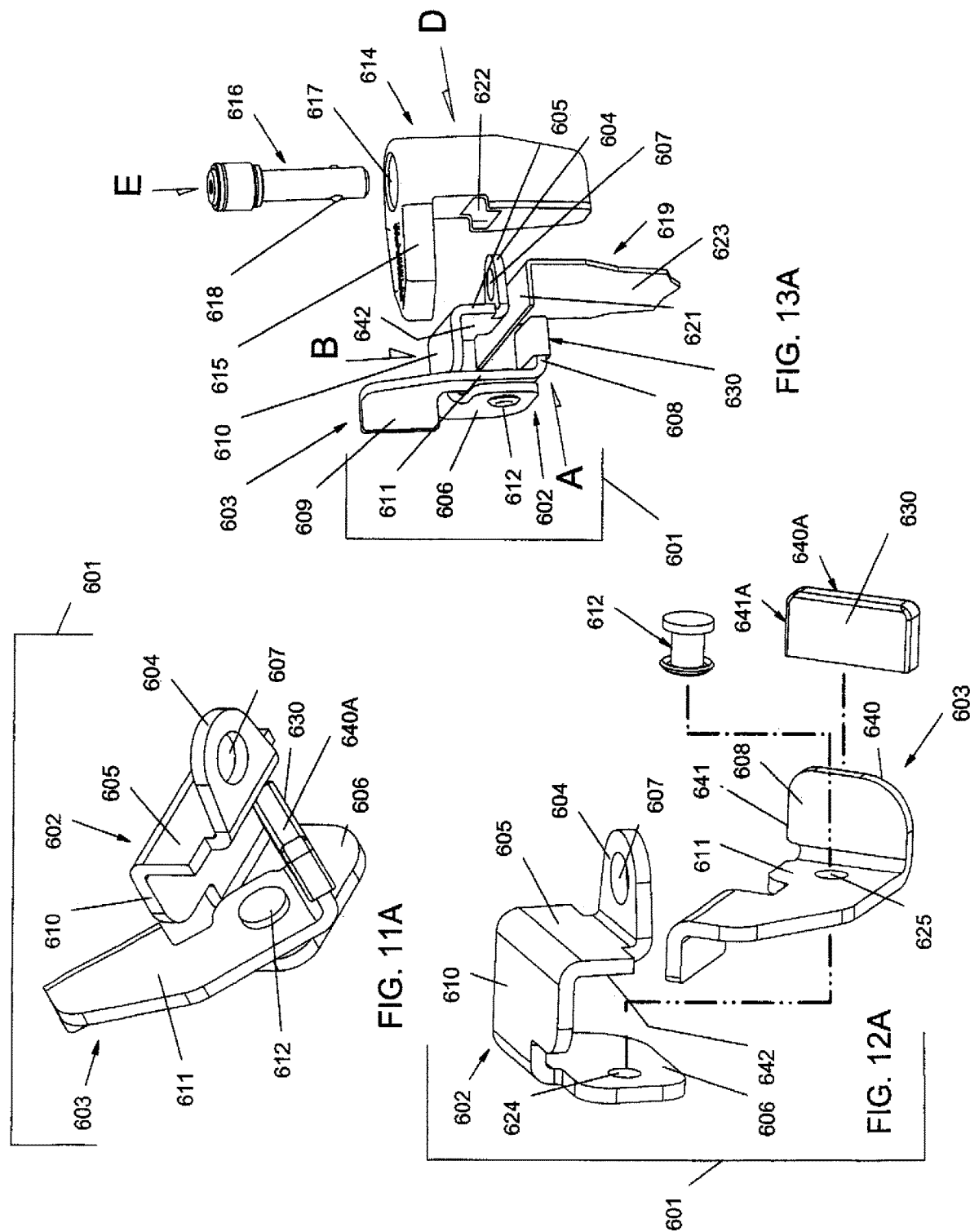

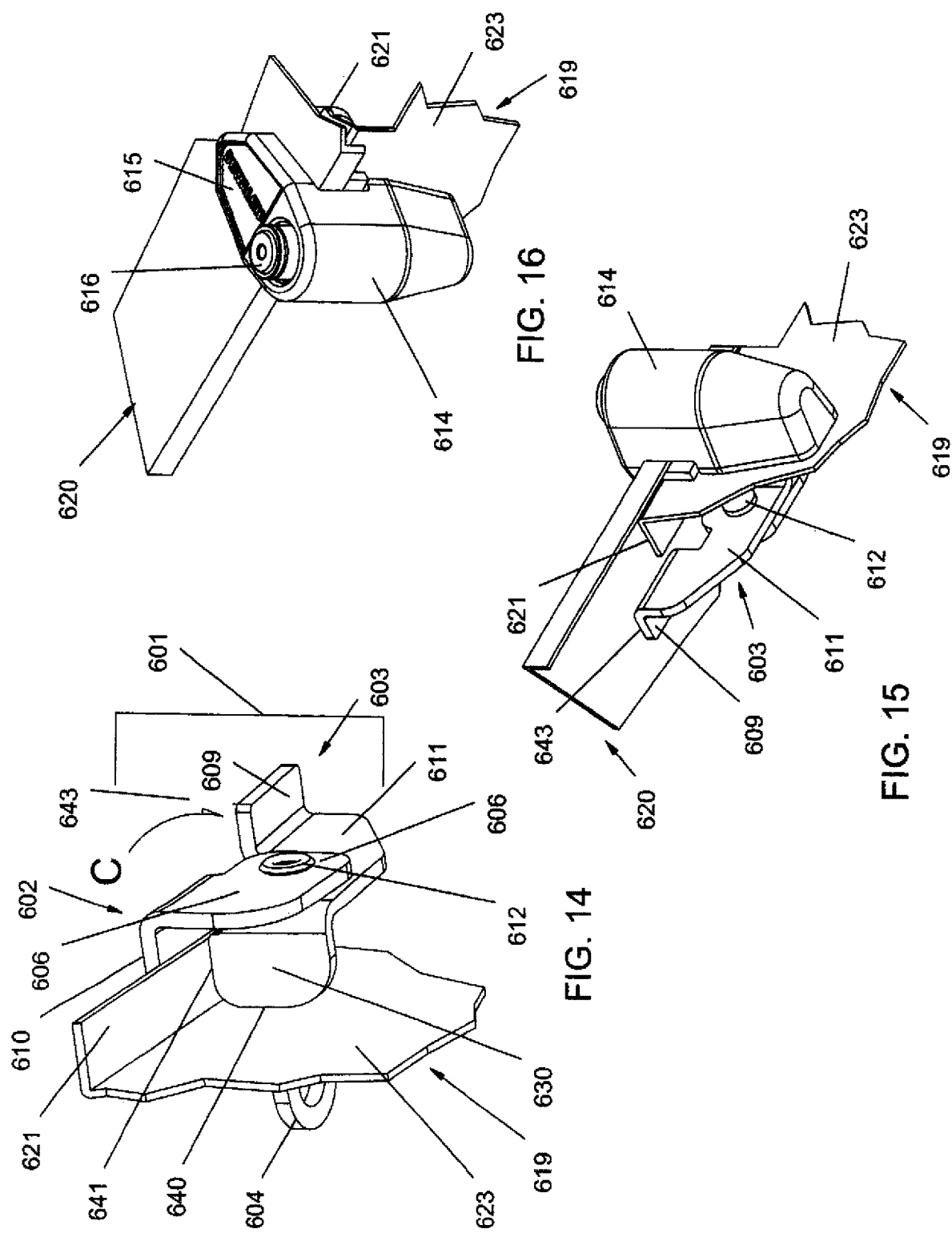

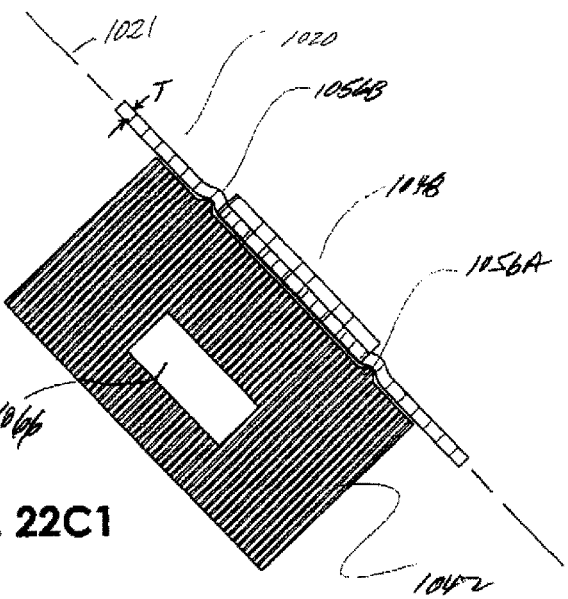
FIG. 22C1
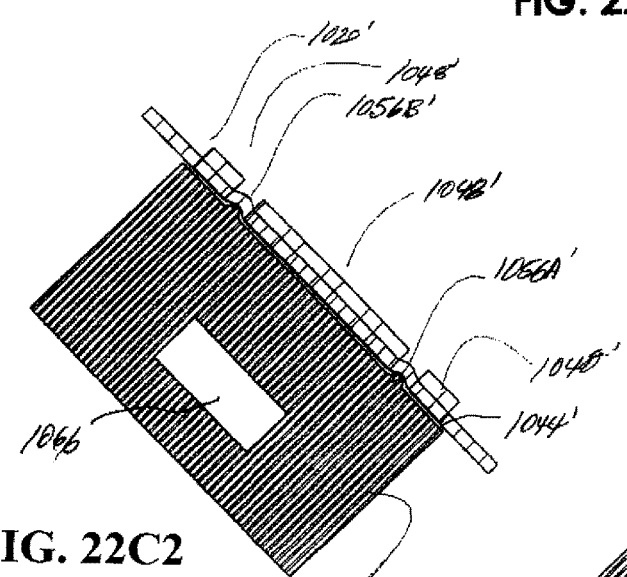
FIG. 22C2
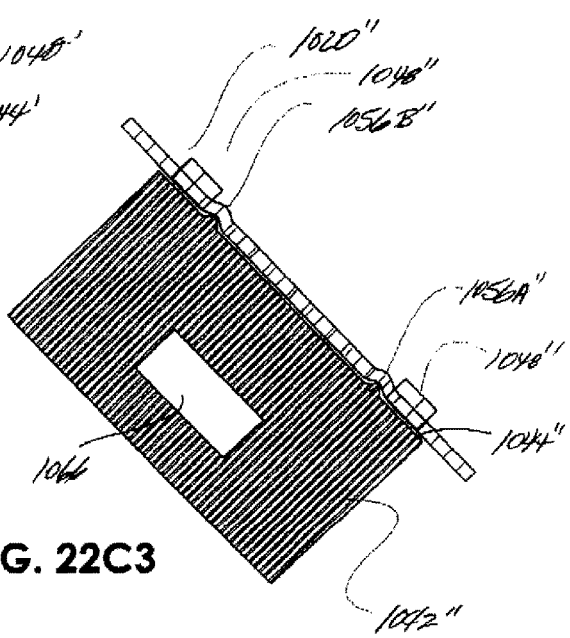
FIG. 22C3
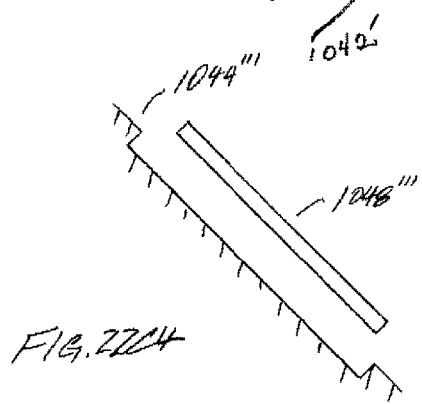
FIG. 22C4

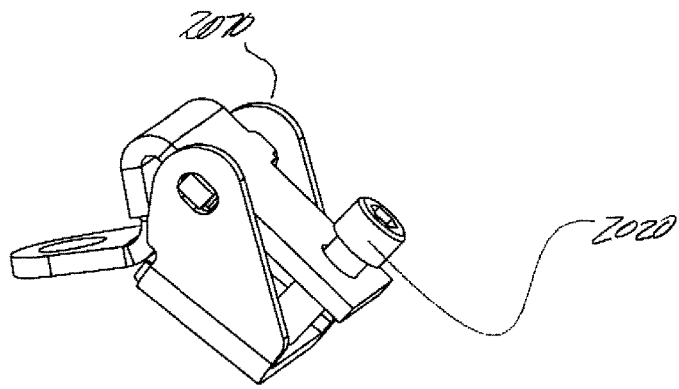
FIG. 29A
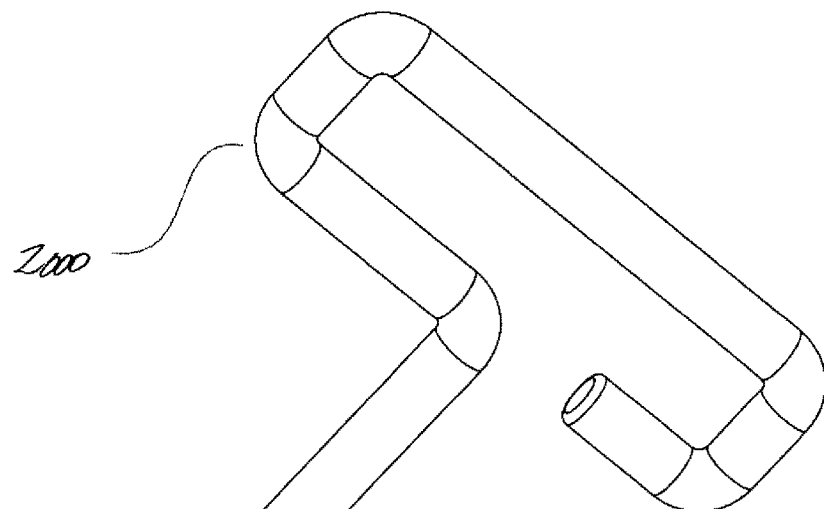
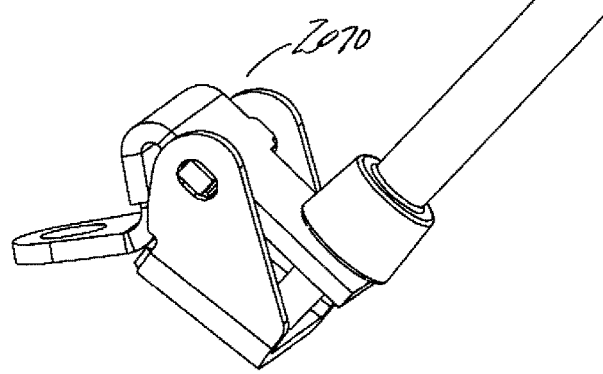
FIG. 29B

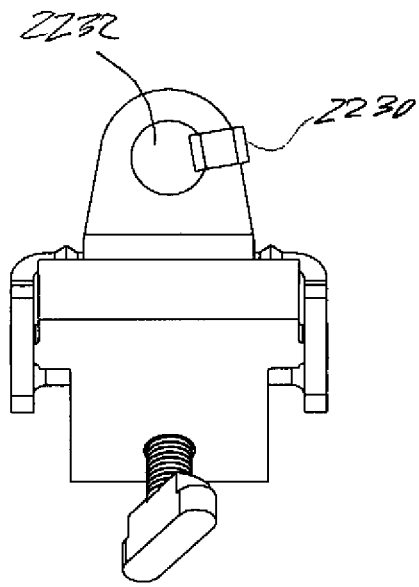
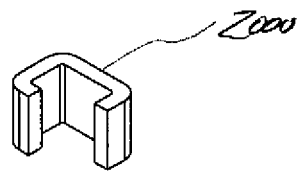
FIG. 31B
FIG. 31A
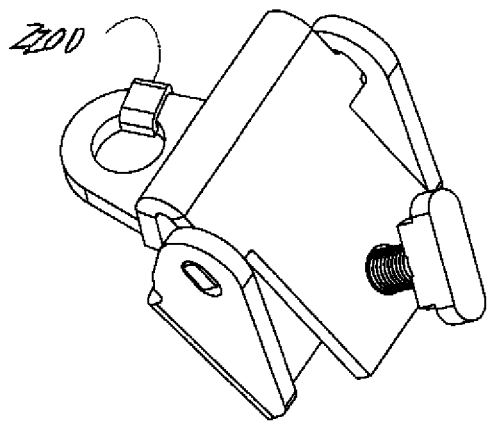
FIG. 31C

APPARATUS AND METHOD FOR SECURING AN ENCLOSURE

CROSS-REFERENCE TO RELATED APPLICATIONS

This application is a continuation-in-part of application Ser. No. 12/378,879, filed Feb. 20, 2009, which is a continuation of application Ser. No. 11/705,653, filed Feb. 12, 2007, which is a continuation-in-part of application Ser. No. 10/823,285, filed Apr. 13, 2004, now U.S. Pat. No. 7,176,376, issued Feb. 13, 2007, and also a continuation-in-part of Ser. No. 11/434,665, filed May 16, 2006, which claims the benefit of U.S. Provisional Application No. 60/681,200, filed May 16, 2005, and U.S. Provisional Application No. 60/793,104, filed Apr. 19, 2006, and also a continuation-in-part of International Application No. PCT/US2006/018783, filed May 16, 2006.

All written material, figures, content and other disclosure in each of the above-referenced applications is hereby incorporated by reference.

BACKGROUND OF THE INVENTION

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

A meter box is generally used by electric utility companies, however the invention herein may be used with other utility service enclosures in the gas, water, cable, TV utility industries or with enclosures generally in various other industries as well.

An example of one previously known meter box consists of two sets of electrical posts, with a provider's transmission lines being connected to one set of posts, and the customer's service lines to the other set. In order to measure the amount of electricity a customer uses, the meter box is configured to accept a watthour meter or another electricity usage measurement device which, when plugged into the socket box, permits transmission of electricity from the provider to the customer and allows the amount of transmitted electricity to be accurately measured, so that the provider can charge the customer for power usage at an appropriate rate.

Various designs and uses for watthour meters are also well known, and all such designs and uses are incorporated into the teachings of the present invention. The present invention is also applicable in situations where the customer's service lines are routed from the meter box to a breaker box so that electricity can be distributed to multiple service locations using additional sets of electrical lines or wires.

Presently, there are two common types of meter socket boxes, each distinguished by the manner in which the meter is secured in place once it has been plugged into an electrical socket disposed in the meter box. For example, a ringed type meter box fitted with a flanged front cover is known, within which a watthour meter is disposed so that a head portion of the meter passes out through a flanged opening in the front cover. In this configuration, the meter is generally held in place using an annular, lockable sealing ring.

Also known is a ringless type meter box, in which the box cover secures the meter in place. For example, a ringless type meter box may include a box cover and a box base. Referring now to prior art FIG. 1, a ringless type meter box 10 includes an installed meter 20 and a box cover 30, the meter box cover being shown prior to installation. Formed around an opening in a central portion of meter box cover 30 is a flange 40; a complementary flange 50 is disposed on meter 20 such that, when meter box cover 30 is installed over and around the head of meter 20, for example, then the meter 20 complementary flange 50 is encased by meter box cover flange 30, and complementary flange sections 40 and 50 join together, so that the meter cannot be easily removed from the electrical socket unless the cover is first removed from the meter box or meter box base.

The meter box cover 30 is typically secured in place by means of a small latch assembly, which functions in structural cooperation with a complementary latch-receiving member disposed on the meter box or base 10. The meter box cover 30 is used to secure the meter 20 to the electrical socket (not shown), so that completion of an electrical circuit is ensured, and the meter is reliably prevented from falling out of the meter box socket.

The meter box cover 30 also prevents unauthorized persons from tampering with the meter. For example, some customers have attempted to bypass the meter, so that unmeasured electricity could be used free of charge. Also, service providers are sometimes forced to disconnect service to customers, for example, due to non-payment of monthly bills. In this event, a locked meter box cover helps prevent a customer from entering the meter box and reconnecting electrical service. However, in instances where the small latch assembly on the meter box fails to provide sufficient security for preventing unauthorized access to the meter and meter box socket, a sturdier, more tamper resistant solution is required.

There are presently only a few commonly used security devices for securing meter box covers to socket boxes. One type requires an installer to drill or punch a hole in the meter box prior to installation of a fastening device. However, some installers are independent contractors rather than employees of the companies that own the meter boxes, and thus drilling or punching a starter hole in the box is sometimes undesirable. Also, drilling takes additional time and adds more steps to the installation, each of which could be avoided if drilling were not required.

To overcome these shortcomings, there are also locks that can be installed on ringless meter socket boxes that do not require drilling or punching a hole in the meter box. Several examples of patents which disclose attempts to solve some of the above problems are set forth as follows.

The Inner-Tite Jiffy Lock™ or "IT Lock," shown in U.S. Pat. No. D-463,248, and U.S. Pat. No. 6,763,691 to Rafferty, entitled "Meter Box Lock Assembly," is directed to lock assembly for use in combination with an electric meter box or other like enclosure having a bottom, a side wall, and a cover which may be opened to gain access to the interior of the box, and which when closed, overlaps an upper edge of the side wall. The lock assembly includes a bracket having first and second mutually spaced flanges integrally joined by an intermediate web. A jaw is mechanically interengaged with and carried by the bracket for movement between its flanges. The bracket is configured for removable mounting on the side wall, with its intermediate web interposed between the cover and the upper edge of the side wall, and with the first flange and the jaw respectively located adjacent exterior and interior surfaces of the side wall. The jaw is urged towards the first flange to clamp the side wall therebetween, and a cap is secured to the bracket. The cap has a lip configured and dimensioned to overlap and maintain the cover in a closed position. This reference is incorporated by reference herein.

The McGard Intimidator Sidewinder-Lock™ shown in U.S. Pat. No. 6,742,365 to Sullivan et al., entitled "Ringless Meter Lock," discloses a locking mechanism for securing the cover of a thin-walled box to the box frame. The locking mechanism includes a clip bracket adapted to engage a wall of the box frame, a lock body adapted to latch to the clip bracket and engage the box cover, a locking member carried by the clip bracket and adapted to clamp the clip bracket to the box wall when the locking member is in a clamping position, and a pivotable actuating lever adapted to actuate the locking member into the clamping position. The locking member and the actuating lever can be implemented as a two-piece system comprising first and second pivoting members. Alternatively, the locking member and the actuating lever can be integrally formed as a one-piece system. The locking mechanism is capable of multiple mounting positions on the box without drilling, and uses a spring-loaded plunger assembly that allows for quick, keyless, slam installation. This reference is incorporated by reference herein.

U.S. Pat. No. 7,946,143 to Rafferty, et al., entitled "Universal Box Lock," is directed to a universal box lock for securing a meter box including a first clamping means, a second clamping means operatively connected to the first clamping means. The second clamping means being movable relative to the first clamping means. The box lock also includes a biasing means for urging the second clamping means toward the first clamping means to secure the box lock to a wall of a meter box placed between the first and second clamping means. Moreover, the box lock includes a body portion, which selectively engages and secures the first and second clamping means to a meter box wall. The first clamping means includes an aperture configured to allow a portion of the second clamping means to extend through the aperture facilitating the attachment of the inventive box lock to a side wall or a bottom wall of a meter box.

U.S. Pat. No. 6,976,373 to Sullivan et al., entitled "Ringless Meter Lock," discloses a locking mechanism for securing the cover of a thin-walled box to the box frame. The locking mechanism includes a clip bracket adapted to engage a wall of the box frame, a lock body adapted to latch to the clip bracket and engage the box cover, a locking member carried by the clip bracket and adapted to clamp the clip bracket to the box wall when the locking member is in a clamping position, and a pivotable actuating lever adapted to actuate the locking member into the clamping position. The locking member and the actuating lever can be implemented as a two-piece system comprising first and second pivoting members. Alternatively, the locking member and the actuating lever can be integrally formed as a one-piece system. The locking mechanism is capable of multiple mounting positions on the box without drilling, and uses a spring-loaded plunger assembly that allows for a quick, keyless, slam installation.

(It should be noted that any patent, publication or other information referred to above or herein is not intended to constitute an admission that such patent, publication or other information is in fact "material" or "prior art" for the present invention unless specifically designated as such).

There is, therefore, a need for a locking apparatus, system, and method for securing at least one structure or a plurality of structures, to secure a utility service enclosure or enclosure generally, and there remains a need for a meter box security that is particularly adapted to resist tampering and which reliably prevents a box cover from being tampered with and removed from a secured meter box. There is also a need for a meter box security apparatus that offers even greater security for preventing unauthorized entry into a meter box than is known. There is also a need for a reinforced meter box security device being suitably rigid to withstand tampering forces and unwanted deformation. There is a further need for a clamping member adapted to resist prying and tampering forces and unwanted sliding or movement of the clamping member in addition to other needs as noted herein.

Those of skill in the art will appreciate the present invention which addresses the above needs and other significant needs the solution to which are discussed hereinafter.

SUMMARY OF THE INVENTION

In an example embodiment of the invention, an apparatus is provided for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the apparatus including at least a clamping member comprising a bracket adapted to be mounted on a side wall of a meter box, wherein the clamping member further comprises a clamp comprising a surrounding member adapted for pivotable movement outside and around at least a part of the bracket of the clamping member, and wherein the surrounding member further comprises a grip flange, and including a clamp actuating member adapted to transmit a force to the surrounding member, and including a fastening shelf comprising a first securing means, and wherein the fastening shelf further comprises a fastening shelf member comprising a shelf flange, and wherein at least a portion of the grip flange is adapted to be disposed in substantially offset opposing relation with respect to the shelf flange, and wherein the apparatus further includes at least a lock housing comprising a second securing means.

Another example embodiment of the invention provides a security apparatus adapted for use with a watthour meter box that can be readily and securely attached to the wall of a watthour meter box base.

A further example embodiment of the invention relates to providing additional security to a watthour meter box.

Another example embodiment of the invention is to secure the watthour meter box lid to the meter box base.

Another example embodiment of the invention is to provide a watthour meter box security apparatus that helps prevent unauthorized watthour meter box lid removal from the watthour meter box base.

A further example embodiment of the invention is to provide a watthour meter box security apparatus that can be installed without any tools.

One other example embodiment of the invention is to provide a watthour meter box security apparatus that can be attached to the wall of watthour meter box base.

Another example embodiment of the invention is to provide a watthour meter box security apparatus that will not interfere with dangerous components inside the meter box.

A further example embodiment of the invention is to provide a watthour meter security apparatus that will not interfere with the normal operation of the lid.

Accordingly, one embodiment of the present invention provides an apparatus for securing a box cover to a watthour meter socket box so as to address the needs as described above.

According to one embodiment of the invention, an apparatus for securing a box cover to a watthour meter socket box is provided, the apparatus comprising a clamping member having a clamp, a clamp actuating member, and a fastening shelf having a first securing means; and a lock housing having a second securing means.

According to a further embodiment of the invention, there is also provided a method for securing a box cover to a watthour meter socket box including disposing a clamping member having a clamp, a clamp actuating member, and a fastening shelf in proximity with a lock housing, and then locking the lock housing onto the clamping member using a fastening member.

Another example embodiment of the present invention includes at least a locking bracket and a lock housing. The locking bracket includes at least a clamping member, fastening lever, and compression member. In an alternative embodiment, the locking bracket further includes at least a flexural member.

The lock housing generally includes at least a lock body or member incorporating a flange. The flange preferably has a generally perpendicular orientation with respect the lock housing. In one example embodiment, the lock housing has a unitary configuration. The locking bracket is adapted to be attached to a portion of a wall of the watthour meter box and to receive the lock housing after the lid of the watthour meter box is in place.

An example embodiment includes at least a shaft-style locking device cooperatively configured for securing the lock housing to the locking bracket so as to prevent removal of the meter box lid from the meter box base. In an alternative embodiment, the lock housing may be configured for use with any locking device suitable for securing the lock housing to the locking bracket so as to prevent removal of the meter box lid.

In another embodiment, a locking device for securing the lid of a watthour meter box to a watthour meter box base includes at least: a latch assembly and a lock housing member, the latch assembly adapted to affix to a wall of a watthour meter box base, the latch assembly including a bracket member and a lever member, a first bracket portion disposed on the bracket member adapted to pivotably carry the lever member allowing rotational motion of the lever member about an axis located generally perpendicular to the planar face of the first bracket portion, a portion of the lever member adapted to bear against a wall of the meter box base thus trapping the wall between a second bracket portion disposed on the bracket member, a third bracket portion disposed on the bracket member adapted to be received by and affixed to the lock housing member, a flange disposed on the lock housing member adapted to secure a meter box lid to a meter box base.

In one example embodiment, a method for securing a lid to a watthour meter box having an interior is provided. The method includes at least: attaching a locking bracket to a wall of the watthour meter box; installing the lid over at least a portion of the bracket; and securing a locking housing to the bracket to prevent removal of the lid. In one example embodiment, the step of attaching the locking bracket to the wall of the watthour meter box is performed from a position substantially outside the interior of the watthour meter box. In this way, the bracket is substantially manipulable without needing to place any portion of one's hand or an object in the interior of the watthour meter box.

In another example embodiment, attaching means may be used for mounting the bracket to the wall of the watthour meter box without having to reach into the interior of the box. A latch member may be lever-type structure and a member engageable with a meter box wall. Various locking means may be used to secure the lid to the watthour meter box.

In another example embodiment the locking bracket includes at least a body and only one moveable member. In another embodiment, the moveable member is pivotable with respect to the body. In another embodiment, the moveable member preferably further includes at least a compression member.

In an example embodiment, the moveable member includes at least an actuating lever which is moveable (or for example, pivotable) in a plane that is substantially parallel to the plane of the wall to which the locking bracket is being attached. The actuating lever ideally is configured with a compression member at a distal end of the actuating lever such that the compression makes arcuate (or sweeping rotational) engagement with the wall when force is applied to the actuating lever. The actuating lever is ideally configured with at least one elongated member which serves as a moment arm to facilitate engagement.

In another example embodiment, the locking bracket includes at least a reversible design configuration. That is, the locking bracket may be manufactured in a first design configuration such that the actuating lever may be rotated in a functional clockwise direction to attach the bracket or in a second design configuration such that the actuating lever may be rotated in a functional counter-clockwise direction to attach the bracket. The first or second design configuration may be employed as desired for use in situations where there are limited locations for attaching the locking bracket or to foster ease of use by a right- or left-handed person.

Another example embodiment of the present invention includes at least a locking bracket for use with a lock housing. The locking bracket includes at least a clamping member, fastening lever, and compression member. The locking bracket is configured for mounting a lock housing to capture at least a portion of the lid of a watthour meter box. A locking shaft is adapted to be installed in the lock housing so as to secure the lid in place on the watthour meter box.

In another example embodiment of the apparatus the lever end is in functional cooperation with a portion of a lock housing mounted to a portion of the clamping member such that the lock prevents rotation of the lever to an open position.

In another example embodiment of the apparatus the lever end is in functional cooperation with a portion of a meter box lid such that the lid prevents rotation of the lever to an open position.

In another example embodiment of the apparatus the lever end is at least partially outside the interior of the meter box in a mounting position and at least partially inside the interior of the meter box in a locked position.

In another example embodiment of the apparatus further includes the meter box.

In another example embodiment of the apparatus further includes a locking structure adapted for functional cooperation with the clamping member for securing a meter box lid to a meter box base.

Another example embodiment of an apparatus is provided for securing a box cover to a meter box, the apparatus including at least: a clamping member, wherein the clamping member further includes a clamp, a clamp actuating member, and a fastening shelf having a first securing means; and a lock housing having a second securing means.

In another example embodiment of the apparatus, the clamp further includes opposed, substantially parallel walls on which a pivoting member is disposed.

In another example embodiment of the apparatus, the clamp further includes opposed, substantially parallel walls on which a pivoting member is disposed and the clamp actuating member is captured between the opposed, substantially parallel walls of the clamp when the clamp actuating member is disposed in a fully secured position.

In another example embodiment of the apparatus, the first securing means further includes a portion of the fastening shelf through which an aperture has been formed.

In another example embodiment of the apparatus, the second securing means includes a portion of the lock housing through which an aperture has been formed.

In another example embodiment of the apparatus, the first securing means further includes a portion of the fastening shelf through which an aperture has been formed and the aperture is an approximately cylindrical aperture.

In another example embodiment of the apparatus, the second securing means includes a portion of the lock housing through which an aperture has been formed and the aperture is an approximately cylindrical aperture.

In another example embodiment of the apparatus, the apparatus further includes a plunger type fastener.

In another example embodiment of the apparatus, the apparatus further includes a plunger type fastener, wherein the plunger type fastener further includes a retaining member.

In another example embodiment of the apparatus, the clamp actuating member rotates about a rotational axis established by disposition of an engagement member on a body portion of the clamping member.

In another example embodiment of the apparatus, the clamp actuating member rotates about a rotational axis established by disposition of an engagement member on a body portion of the clamping member and one end of the clamp actuating member receives an input force and rotates about an axis established by disposition of the engagement member disposed on the clamping member, and then translates a mechanical force to an opposite end of the clamp actuating member that is greater than the input force.

In another example embodiment of the apparatus, the clamp actuating member has a tactile feedback indicator for indicating when the clamp actuating member has been fully rotated into a secure position.

In another example embodiment of the apparatus, the clamp is disposed between the clamp actuating member and the fastening shelf.

In another example embodiment of the apparatus, the clamp further includes a stopping member for stopping a rotational sweep of the clamp actuating member after the clamp actuating member is disposed in a fully secured position.

In another example embodiment of the apparatus, the clamp imparts a spring force that holds the clamp actuating member in a fully secured position.

Another example embodiment of a method is provided for securing a box cover to a meter box, the method including at least: disposing a clamping member over a wall portion of the meter box, wherein the clamping member includes a clamp, a clamp actuating member, and a fastening shelf having a first securing means; disposing a lock housing in functional cooperation with the clamping member, wherein the lock housing includes a second securing means; and securing the clamping member using the lock housing.

In another example embodiment of the method, the method further includes disposing a fastening shelf so that the first securing means includes a body portion of the fastening shelf through which an aperture has been formed.

In another example embodiment of the method, the method further includes disposing a fastening shelf so that the first securing means includes a body portion of the fastening shelf through which an aperture has been formed and the method further includes disposing a lock housing so that the second securing means includes a lock housing through which an aperture has been formed.

In another example embodiment of the method, the method further includes disposing a fastening shelf so that the first securing means includes a body portion of the fastening shelf through which an aperture has been formed, and the method further includes disposing a lock housing so that the second securing means includes a lock housing through which an aperture has been formed, and the method further includes disposing a fastening shelf and a lock housing so that the first securing means and the second securing means comprise approximately cylindrical apertures.

In another example embodiment of the method, the method further includes disposing a plunger type fastener.

In another example embodiment of the method, the method further includes disposing a plunger type fastener, and further includes disposing a plunger type fastener, and then securing the plunger type fastener by means of a retaining member.

In another example embodiment of the method, the method further includes rotating the clamp actuating member about a rotational axis established by disposition of an engagement member disposed on a body portion of the clamping member.

In another example embodiment of the method, the method further includes rotating the clamp actuating member about a rotational axis established by disposition of an engagement member disposed on a body portion of the clamping member, and further includes: delivering an input force to one end of the clamp actuating member so that the clamp actuating member rotates about a rotational axis established by disposition of an engagement member on the clamping member; and translating the input force into a mechanical clamping force that is greater than the input force.

In another example embodiment of the method, the method further includes disposing a clamp actuating member having a tactile feedback indicator to indicate when the clamp actuating member has been fully rotated into a secure position.

In another example embodiment of the method, the method further includes disposing the clamp between the clamp actuating member and the fastening shelf.

In another example embodiment of the method, the method further includes disposing the clamp between the clamp actuating member and the fastening shelf, and furthering includes disposing a clamp having a stopping member, wherein the stopping member stops a rotational sweep of the clamp actuating member after the clamp actuating member is disposed in a fully secured position.

In another example embodiment of the method, the method further includes disposing the clamp between the clamp actuating member and the fastening shelf, and furthering includes disposing a clamp imparting a spring force that holds the clamp actuating member in a fully secured position.

Another example embodiment of a method is provided for securing a ringless socket box lid to a socket box, the method including at least: disposing a base support structure in proximity with a wall portion of the socket box, wherein the base support structure includes a bracket and a fastening lever; securing the base support structure to the wall portion of the socket box by hanging the base support structure over the wall portion and then rotating the fastening lever toward a fully secured position; installing a socket box lid, wherein the socket box lid is only fully installable if the fastening lever has been rotated completely into a fully secured position; and affixing a lock housing to the base support structure, wherein the lock housing holds the socket box lid securely in place.

Another example embodiment of an apparatus is provided for securing a box cover to a meter box, the meter box being defined by a plurality of side walls, the apparatus including at least: a clamping member attachable to one of the plurality of side walls; a fastening lever; and a pivotal connection between the clamping member and the fastening lever, the pivotal connection including an axis of rotation extending through the pivotal connection, the axis of rotation extending into at least one of the box cover or the one of the plurality of side walls when the box cover is secured to the meter box.

In another example embodiment of the apparatus, the apparatus further includes a portion of the fastening lever member adapted to bear against the one of the plurality of side walls of the meter box.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box includes a planar surface.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box includes a planar surface, and the planar surface is rotatable with respect to the one of the plurality of side walls.

In another example embodiment of the apparatus, the apparatus further includes a portion of the fastening lever member adapted to bear against the one of the plurality of side walls of the meter box, wherein the portion of the fastening lever member adapted to bear against the one of the plurality of side walls of the meter box is arcuate.

In another example embodiment of the apparatus, the apparatus further includes a portion of the fastening lever member adapted to bear against the one of the plurality of side walls of the meter box, and further including a resilient compression member secured to the portion of the fastening lever member adapted to bear against the one of the plurality of side walls.

In another example embodiment of the apparatus, the apparatus further includes a biasing member secured to at least one of the clamping member or the fastening lever.

In another example embodiment of the apparatus, the clamping member includes a first planar surface and the fastening lever includes a second planar surface, the pivotal connection pivotally interconnecting the first planar surface to the second planar surface.

In another example embodiment of the apparatus, the apparatus further includes a lever end, the lever end surface being pivotally moveable between a mounting and a locked position without entering into an interior of the meter box.

In another example embodiment of the apparatus, the apparatus further includes a lever end, the lever end surface being pivotally moveable between a mounting and a locked position without entering into an interior of the meter box, wherein the lever end is in functional cooperation with a portion of a lock housing mounted to a portion of the clamping member such that the lock prevents rotation of the lever to an open position.

In another example embodiment of the apparatus, the apparatus further includes a lever end, the lever end surface being pivotally moveable between a mounting and a locked position without entering into an interior of the meter box, wherein the lever end is in functional cooperation with a portion of a meter box lid such that the lid prevents rotation of the lever to an open position.

In another example embodiment of the apparatus, the apparatus further includes a lever end, the lever end surface being pivotally moveable between a mounting and a locked position without entering into an interior of the meter box, wherein the lever end is at least partially outside the interior of the meter box in a mounting position and at least partially inside the interior of the meter box in a locked position.

In another example embodiment of the apparatus, the apparatus further includes the meter box.

In another example embodiment of the apparatus, the apparatus further includes a locking structure adapted for functional cooperation with the clamping member for securing a meter box lid to a meter box base.

Another example embodiment of an apparatus is provided for securing a box cover to a meter box, the meter box being defined by a plurality of side walls, the apparatus including at least: a clamping member attachable to one of the plurality of side walls; a fastening lever with a planar engagement surface adapted to bear against the one of the plurality of side walls of the meter box; and a pivotal connection between the clamping member and the fastening lever whereby the planar engagement surface rotates with respect to the one of the plurality of side walls.

In another example embodiment of the apparatus, the apparatus further includes a compression member secured to the planar engagement surface.

In another example embodiment of the apparatus, the apparatus further includes a biasing member secured to at least one of the clamping member or the fastening lever.

In another example embodiment of the apparatus, the apparatus further includes an axis of rotation extending through the pivotal connection, the axis of rotation extending into the one of the plurality of side walls.

In another example embodiment of the apparatus, the apparatus further includes an axis of rotation extending through the pivotal connection, the axis of rotation extending into the one of the plurality of side walls, wherein the axis of rotation is at least approximately orthogonal to the one of the plurality of side walls.

Another example embodiment of an apparatus is provided for securing a box cover to a meter box, the meter box being defined by a plurality of side walls, the apparatus including at least: a clamping member attachable to one of the plurality of side walls, the clamping member including a first planar surface; a fastening lever including a lever end, a second planar surface secured to the lever end, and a wall engagement surface secured to the second planar surface; and a pivotal connection between the first planar surface and the second planar surface, the clamping member and the fastening lever being pivotally connected together for relative movement between a mounting position and a locked position in response to force applied to the lever end, and being configured such that in the locked position, the wall engagement surface engages the one of the plurality of side walls.

In another example embodiment of the apparatus, the pivotal connection includes an axis of rotation extending through the pivotal connection, the axis of rotation extending into at least one of the box cover or the one of the plurality of side walls when the box cover is secured to the meter box.

Another example embodiment of a locking device is provided for securing a box cover to a meter box, the meter box including a side wall, the locking device including at least: a lock housing member; a flange disposed on the lock housing member adapted to secure the box cover to the meter box; and a latch assembly adapted to affix to the side wall of the meter box, the latch assembly including a bracket member and a lever member, a first bracket portion disposed on the bracket member adapted to pivotably carry the lever member allowing rotational motion of the lever member about an axis located generally perpendicular to a planar face of the first bracket portion, a second bracket portion disposed on the bracket member, a third bracket portion disposed on the bracket member adapted to be received by and affixed to the lock housing member, a portion of the lever member adapted to bear against the side wall of the meter box thus trapping the side wall between the second bracket portion and the portion of the lever member adapted to bear against the side wall of the meter box.

Another example embodiment of a locking device is provided for securing a box cover to a meter box, the meter box including a side wall, including at least: a bracket mountable to the side wall; and a latching member for securing the bracket to the wall of the meter box without having to reach into the interior of the box.

In another example embodiment of the locking device, the latching member is substantially manipulable without needing to place any portion of one's hand or an object into the interior of the meter box.

Another example embodiment of a method is provided for securing a lid to a watthour meter box having an interior defined by at least one wall, the at least one wall including a flange extending inwardly to the at least one wall such that a lower side of the flange faces away from the lid when the lid is secured to the watthour meter box, the method including at least: attaching a locking bracket to the at least one wall such that at least a portion of the locking assembly engages the lower side of the flange; installing the lid over at least a portion of the locking bracket; and securing a locking housing to the locking bracket to prevent removal of the lid.

In another example embodiment of the method, the step of attaching further includes moving a lever such that the moving is performed from a position substantially outside the interior of the watthour meter box.

Another example embodiment of an apparatus is provided for securing a box cover to a meter box, the meter box being defined by at least one side wall, the apparatus including at least: a clamping member attachable to the at least one side wall; a fastening lever; and a resilient compression member carried by the fastening lever, the resilient compression member being adapted to bear against the at least one side wall.

Another example embodiment of a method is provided for manufacturing an apparatus for securing a box cover to a meter box, the meter box being defined by a plurality of side walls, the method including at least: providing a clamping member attachable to one of the plurality of side walls; and selectively securing a fastening lever to the clamping member in at least one of two different design configurations, the first design configuration requiring that the fastening lever is mounted for rotation in a first rotational direction to fasten the clamping member to the one of the plurality of side walls, and the second design configuration requiring that the fastening lever is mounted for rotation in a second rotational direction to fasten the clamping member to the one of the plurality of side walls.

In another example embodiment of the method, the first rotational direction is opposite to the second rotational direction.

Another example embodiment of an apparatus is provided for securing a cover to an enclosure, the apparatus including at least: a locking bracket, wherein the locking bracket further includes an engagement member and a mounting member, the engagement member including a biased engagement flange and being biased to engage a structural portion of the enclosure, the locking bracket further including a fastening shelf being connected to the mounting member, the fastening shelf including a first securing means; and a lock housing including a second securing means.

Another example embodiment of the invention relates to utilizing higher carbon steel that can be through hardened and tempered to provide significant structural strength and, thereby, improve the ability to impart a high clamping force on a side wall of an enclosure.

One other example embodiment of the invention relates to providing an extended handle to the improve the ability to impart a high clamping force when performed manually.

Another example embodiment of the invention includes at least a slot in the handle to enable an extension tool to be used to facilitate imparting a high clamping force.

Another example embodiment of the invention includes a screw to facilitate manually imparting a high clamping force using one hand and to enable the clamping to be readily adjusted clamping force as desired to accommodate a greater variety of box geometries.

In another example embodiment, an apparatus is provided for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the apparatus comprising: a clamping member comprising a bracket adapted to be mounted on a side wall of a meter box, wherein the clamping member further comprises a clamp comprising a surrounding member adapted for pivotable movement outside and around at least a part of the bracket of the clamping member, and wherein the surrounding member further comprises a grip flange; a clamp actuating member adapted to transmit a force to the surrounding member; a fastening shelf comprising a first securing means, and wherein the fastening shelf further comprises a fastening shelf member comprising a shelf flange, and wherein at least a portion of the grip flange is adapted to be disposed in substantially offset opposing relation with respect to the shelf flange; and a lock housing comprising a second securing means.

A further example embodiment provides the shelf flange having a given width, and wherein the at least a portion of the grip flange comprises first and second protuberances selectively spaced apart wider than the width of the shelf flange.

A further example embodiment provides that the fastening shelf member further comprises a bracket flange, and wherein the surrounding member further comprises first and second support panels disposed in substantially offset opposing relation with respect to the bracket flange.

Another example embodiment provides that the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

A further example embodiment provides that at least a portion of the side wall is flexed when clamped between the surrounding member and the fastening shelf member.

A further example embodiment provides that at least a portion of the clamping member is reinforced by through hardening.

Another example embodiment provides that the second securing member comprises a lock receptacle comprising a rotation restricting stop surface.

Another example embodiment provides that the rotation restricting stop surface of the lock receptacle is adapted to receive a barrel lock comprising a body having a rotation restricting stop surface cooperative with the rotation restricting stop surface of the lock receptacle to prevent rotation of a barrel lock.

Another example embodiment further comprises a rotationally-actuated barrel lock.

Another example embodiment provides that the rotation restricting stop surface of the lock receptacle is removeable from the second securing member.

Another example embodiment provides that the clamp actuating member comprises a rotationally actuated threaded member.

Another example embodiment provides that the bracket comprises a body portion, the body portion comprising at least two flanges defining a space therebetween.

Another example embodiment provides that the surrounding member comprises at least one engagement surface being disposed substantially outside the space defined by the at least two flanges.

Another example embodiment provides that the surrounding member further comprises first and second support panels first adapted to carry the grip flange and wherein first and second support panels and the grip flange are adapted for pivotable movement substantially outside the space defined by the at least two flanges.

Another example embodiment further comprises a plunger type fastener.

Another example embodiment further comprises a plunger type fastener, and then securing the plunger type fastener by means of a retaining member.

In another example embodiment, an apparatus is provided for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the apparatus comprising: a clamping member comprising a bracket adapted to be mounted on a side wall of a meter box, wherein the clamping member further comprises a clamp comprising a surrounding member which adapted to be mounted outside and around at least a part of the bracket of the clamping member, wherein the pivotable surrounding member and wherein the pivotable surrounding member further comprises a grip surface 1044; a clamp actuating member adapted to transmit a force to the pivotable surrounding member; a fastening shelf comprising a first securing means, and wherein the fastening shelf further comprises a fastening shelf member comprising a shelf flange, and wherein at least a portion of the grip surface is adapted to be disposed in substantially offset or directly opposing relation with respect to the shelf flange; and a lock housing comprising a second securing means.

In another example embodiment, an apparatus is provided for resisting tampering with a meter box, the meter box comprising a cover and a base, the base comprising a plurality of walls, the apparatus comprising: a clamping member comprising a bracket adapted to be mounted on a side wall of a meter box, wherein the clamping member further comprises a clamp comprising a surrounding member adapted for pivotable movement outside and around at least a part of the bracket of the clamping member, and wherein the surrounding member further comprises a grip flange; a clamp actuating member adapted to transmit a force to the surrounding member; a fastening shelf comprising a first securing means, and wherein the fastening shelf further comprises a fastening shelf member comprising a shelf flange, and wherein at least a portion of the grip flange is adapted to be disposed in substantially offset, or alternatively direct, opposing relation with respect to the shelf flange; and a lock housing comprising a second securing means.

In another example embodiment, an apparatus is provided for securing a box cover to a meter box, the apparatus comprising: a clamping member, wherein said clamping member comprises a body portion, a clamp comprising a surrounding member which surrounds at least a part of the body portion, and wherein the surrounding member comprises a pivoting member comprising an engagement surface, a threaded clamp actuating member disposed on the body portion and being adapted to transmit a force to the surrounding member, a fastening shelf comprising a first securing means, wherein the fastening shelf comprises an upper flange and a lower flange, the lower flange comprising a force-bearing member having a given width; and wherein the engagement surface comprises protuberances selectively spaced apart wider than the width of the force-bearing member; and a lock housing comprising a second securing means.

Another example embodiment provides an effective system for readily attaching the clamping member to box wall without having to instead drill into the side wall of the box to attach a clamping member and secure the cover to the box. In addition, another example embodiment, a method is provided for resisting tampering with a meter box, wherein the box includes at least a cover and a base, the base comprising a plurality of walls, wherein at least one of the plurality of walls comprises a side wall comprising an upper portion, a lower portion, and an angled portion disposed proximately between the upper portion and lower portion of the side wall, and the method includes at least: mounting a clamping member on a side wall of a meter box, wherein the clamping member includes at least a bracket adapted to be mounted on a side wall of a meter box, wherein the clamping member further comprises a clamp comprising a surrounding member adapted for pivotable movement outside and around at least a part of the bracket of the clamping member, and wherein the surrounding member further comprises a grip flange, wherein the clamping member further comprises a clamp actuating member adapted to transmit a force to the surrounding member. In the above example embodiment, the clamping member further comprises a fastening shelf comprising a first securing means, wherein the fastening shelf further comprises a fastening shelf member comprising a shelf flange, wherein at least a portion of the grip flange is adapted to be disposed in substantially offset opposing relation with respect to the shelf flange. The method further includes at least: actuating the clamping member in order to transmit a force to the side wall; opposing the actuating of the clamping member, wherein a clamping force is transmitted to the side wall; (and in some embodiments, concentrating at least some of the clamping force transmitted to the side wall); offsetting the opposing of the clamping force transmitted to the side wall; providing a lock housing comprising a second securing means; disposing the lock housing in functional cooperation with the clamping member, and securing the clamping member using the lock housing. It should be noted that in a further example embodiment, the clamping member and housing may be mounted and installed from a location entirely outside of the meter box. The method may also include interlocking the clamping member fastening shelf and lock housing with a suitable lock (such as a barrel lock, plunger lock, keyless insertion lock (such as that provided in application Ser. No. 13/070,456, incorporated by reference herein) to secure the cover to the meter box base. The method may further comprise rotating the clamp actuating member about a rotational axis established by disposition of an engagement member disposed on a body portion of said clamping member, which in some embodiments may be a lever (or toggle) or a threaded clamp actuating member. In another embodiment, the clamp actuating member further comprises a threaded drive member disposed proximal the first end of the body portion of the bracket and further comprising rotating the threaded drive member about a rotational axis, and further comprising driving the pivotable surrounding member about a pivotal axis established by disposition of the grip surface on the pivotable surrounding member, and then further comprising disposing the grip surface, wherein the location of gripping against the side wall is established by disposition of the grip surface on the pivotable surrounding member by a distance R1 to provide a configuration such that the moment arm of the grip surface with respect to the bracket members may be maximized. In another embodiment, the method further includes at least the step of delivering an input force to one end of the clamp actuating member so that the clamp actuating member rotates about a rotational axis established by disposition of an engagement member on the clamping member; and then translating the input force into a mechanical clamping force that is greater than the input force. Note that this is accomplished in some embodiments with a levered clamp actuating member and in others with a threaded clamp actuating member. In another further embodiment, the method further includes engaging an extension tool, from outside the box, with the distal end (or the engageable end, such a socket head screw or as noted), of the threaded drive member, disposed inside the box, in order to deliver an input force to the drive member (e.g., screw head) wherein the clamp actuating member may be actuated from a location outside the meter box. In another example embodiment, a portion of the clamping member is reinforced by through hardening. In a further embodiment, second securing member comprises a lock receptacle comprising a rotation restricting stop surface. In still a further embodiment, the rotation restricting stop surface of the lock receptacle is adapted to receive a barrel lock comprising a body having a rotation restricting stop surface cooperative with the rotation restricting stop surface of the lock receptacle to prevent rotation of a barrel lock. In a further example embodiment, the rotation restricting stop surface of the lock receptacle is removeable from the second securing member.

Another example embodiment provides an apparatus for resisting tampering with a meter box, the meter box including at least a cover and a base, the base including at least a plurality of walls, wherein at least one of the plurality of walls includes at least a side wall including at least an upper portion, a lower portion, and an angled portion disposed between the upper portion and lower portion of the side wall, the apparatus including at least: a clamping member including at least a bracket adapted to be mounted on a side wall of a meter box, wherein the clamping member further includes at least; a clamp including at least a surrounding member adapted for pivotable movement outside at least a part of the bracket of the clamping member, and wherein the surrounding member further includes at least a grip flange including at least a grip surface engageable with the side wall; a clamp actuating member adapted to transmit a force to the surrounding member; a fastening shelf including at least a first securing means, and wherein the fastening shelf further includes at least a fastening shelf member including at least a shelf flange, and wherein at least a portion of the grip flange is adapted to be disposed in substantially offset opposing relation with respect to the shelf flange, and wherein at least the grip surface is moveable outside at least a part of the bracket; and a lock housing including at least a second securing means.

In another example embodiment of the apparatus, the shelf flange has a given width, and wherein the grip surface includes at least first and second protuberances selectively spaced apart wider than the width of the shelf flange.

In another example embodiment of the apparatus, the fastening shelf member further includes at least a bracket flange, and wherein the surrounding member further includes at least first and second support panels disposed in substantially offset opposing relation with respect to the bracket flange.

In another example embodiment of the apparatus, the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

In another example embodiment of the apparatus, at least a portion of the side wall is flexed when clamped between the surrounding member and the fastening shelf member.

In another example embodiment of the apparatus, at least a portion of the clamping member is reinforced by through hardening.

In another example embodiment of the apparatus, the second securing means includes at least a lock receptacle including at least a rotation restricting stop surface.

In another example embodiment of the apparatus, the rotation restricting stop surface of the lock receptacle is adapted to receive a barrel lock including at least a body having a rotation restricting stop surface cooperative with the rotation restricting stop surface of the lock receptacle to prevent rotation of a barrel lock.

In another example embodiment of the apparatus, the apparatus further includes at least a rotationally-actuated barrel lock.

In another example embodiment of the apparatus, the rotation restricting stop surface of the lock receptacle is removeable from the second securing means.

In another example embodiment of the apparatus, the clamp actuating member includes at least a rotationally actuated threaded member.

In another example embodiment of the apparatus, the bracket includes at least a body portion, the body portion including at least at least two flanges defining a space therebetween.

In another example embodiment of the apparatus, the surrounding member includes at least at least one engagement surface being disposed substantially outside the space defined by the at least two flanges.

In another example embodiment of the apparatus, the surrounding member further includes at least first and second support panels first adapted to carry the grip flange and wherein first and second support panels and the grip flange are adapted for pivotable movement substantially outside the space defined by the at least two flanges.

In another example embodiment of the apparatus, the apparatus further includes at least a plunger type fastener.

In another example embodiment of the apparatus, the apparatus further includes at least a plunger type fastener, and then securing the plunger type fastener by means of a retaining member.

Another example embodiment provides an apparatus for resisting tampering with a meter box, the meter box including at least a cover and a base, the base including at least a plurality of walls, the apparatus including at least: a clamping member including at least a bracket configured to be mounted on a side wall of a meter box, wherein the clamping member further includes at least; a clamp including at least a surrounding member configured for pivotable movement outside at least a part of the bracket of the clamping member, and wherein the surrounding member further includes at least a grip flange including at least a grip surface engageable with the side wall; a clamp actuating member configured to transmit a force to the surrounding member; a fastening shelf including at least a fastening shelf member and a first securing means, and wherein at least a portion of the grip flange is disposed in substantially offset opposing relation with respect to at least a portion of the fastening shelf member, and wherein at least the grip surface is moveable outside at least a part of the bracket; and a lock housing including at least a second securing means.

In another example embodiment of the apparatus, the fastening shelf further includes at least a fastening shelf member including at least a shelf flange.

In another example embodiment of the apparatus, the shelf flange has a given width, and wherein the grip surface includes at least first and second protuberances selectively spaced apart wider than the width of the shelf flange.

In another example embodiment of the apparatus, the fastening shelf member further includes at least a bracket flange, and wherein the surrounding member further includes at least first and second support panels disposed in substantially offset opposing relation with respect to the bracket flange.

In another example embodiment of the apparatus, at least one of the plurality of walls includes at least a side wall including at least an upper portion, a lower portion, and an angled portion disposed between the upper portion and lower portion of the side wall, wherein the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

In another example embodiment of the apparatus, at least a portion of the side wall is flexed when clamped between the surrounding member and the fastening shelf member.

In another example embodiment of the apparatus, at least a portion of the clamping member is reinforced by through hardening.

In another example embodiment of the apparatus, the second securing means includes at least a lock receptacle including at least a rotation restricting stop surface.

In another example embodiment of the apparatus, the rotation restricting stop surface of the lock receptacle is adapted to receive a barrel lock including at least a body having a rotation restricting stop surface cooperative with the rotation restricting stop surface of the lock receptacle to prevent rotation of a barrel lock.

In another example embodiment of the apparatus, the apparatus further includes at least a rotationally-actuated barrel lock.

In another example embodiment of the apparatus, the rotation restricting stop surface of the lock receptacle is removeable from the second securing means.

In another example embodiment of the apparatus, the clamp actuating member includes at least a rotationally actuated threaded member.

In another example embodiment of the apparatus, the bracket includes at least a body portion, the body portion including at least at least two flanges defining a space therebetween, and wherein the surrounding member includes at least at least one engagement surface being disposed substantially outside the space defined by the at least two flanges.

In another example embodiment of the apparatus, the surrounding member further includes at least first and second support panels first adapted to carry the grip flange and wherein first and second support panels and the grip flange are adapted for pivotable movement substantially outside the space defined by the at least two flanges.

In another example embodiment of the apparatus, the apparatus further includes at least a plunger type fastener, and then securing the plunger type fastener by means of a retaining member.

Another example embodiment provides a method for resisting tampering with a meter box, the meter box including at least a cover and a base, the base including at least a plurality of walls, wherein at least one of the plurality of walls includes at least a side wall including at least an upper portion, a lower portion, and an angled portion disposed between the upper portion and lower portion of the side wall, the method including at least: providing a clamping member including at least a bracket configured to be mounted on a side wall of a meter box, wherein the providing the clamping member further includes at least; disposing a clamp on the clamping member, the clamp including at least a surrounding member, wherein the surrounding member is configured to pivotally move outside at least a part of the bracket of the clamping member, and disposing a grip flange on the surrounding member, the grip flange including at least a grip surface engageable with the side wall; providing a clamp actuating member configured to transmit a force to the surrounding member; providing a fastening shelf including at least a first securing means, and wherein the fastening shelf further includes at least a fastening shelf member including at least a shelf flange, and disposing at least a portion of the grip flange in substantially offset opposing relation with respect to the shelf flange, and wherein at least the grip surface is moveable outside at least a part of the bracket; and disposing a second securing means on a lock housing.

In another example embodiment of the method, the method further includes at least dimensioning the shelf flange with a given width, and positioning first and second protuberances on the grip surface wherein the first and second protuberances are selectively spaced apart wider than the width of the shelf flange.

In another example embodiment of the method, the fastening shelf member further includes at least a bracket flange, and wherein the surrounding member further includes at least first and second support panels disposed in substantially offset opposing relation with respect to the bracket flange.

In another example embodiment of the method, the method further includes at least disposing at least first and second engagement surfaces on the first and second panels respectively, wherein the at least first and second engagement surfaces are disposed to engage the upper portion of the wall, and wherein the at least a portion of the grip flange is adapted to engage the angled portion of the wall, wherein the surrounding member is adapted to simultaneously distribute a plurality of clamping engagement forces to the wall.

In another example embodiment of the method, the method further includes at least flexing at least a portion of the side wall when clamping the at least a portion of the side wall between the surrounding member and the fastening shelf member.

In another example embodiment of the method, at least a portion of the clamping member is reinforced by through hardening.

In another example embodiment of the method, the second securing means includes at least a lock receptacle including at least a rotation restricting stop surface.

In another example embodiment of the method, the rotation restricting stop surface of the lock receptacle is adapted to receive a barrel lock including at least a body having a rotation restricting stop surface cooperative with the rotation restricting stop surface of the lock receptacle to prevent rotation of a barrel lock.

In another example embodiment of the method, the method further includes at least a rotationally-actuated barrel lock.

In another example embodiment of the method, the rotation restricting stop surface of the lock receptacle is removeable from the second securing means.

In another example embodiment of the method, the clamp actuating member includes at least a rotationally actuated threaded member.

In another example embodiment of the method, the bracket includes at least a body portion, the body portion including at least at least two flanges defining a space therebetween, wherein the surrounding member includes at least at least one engagement surface being disposed substantially outside the space defined by the at least two flanges.

In another example embodiment of the method, the surrounding member further includes at least first and second support panels first adapted to carry the grip flange and wherein first and second support panels and the grip flange are adapted for pivotable movement substantially outside the space defined by the at least two flanges.

In another example embodiment of the method, the method further includes at least a plunger type fastener, and then securing the plunger type fastener by means of a retaining member.

Another example embodiment provides an apparatus for resisting tampering with a meter box, the meter box including at least a cover and a base, the base including at least a plurality of walls, wherein at least one of the plurality of walls includes at least a side wall including at least an upper portion, a lower portion, and an angled portion disposed between the upper portion and lower portion of the side wall, the apparatus including at least: a clamping member including at least a bracket adapted to be mounted on a side wall of a meter box, wherein the clamping member further includes at least; a clamp including at least a surrounding member adapted for pivotable movement outside at least a part of the bracket of the clamping member, and wherein the surrounding member further includes at least a grip flange including at least a grip surface engageable with the side wall; a clamp actuating member adapted to transmit a force to the surrounding member; a fastening shelf including at least a first securing means, and wherein the fastening shelf further includes at least a fastening shelf member including at least a shelf flange, the shelf flange including at least a given width, and wherein the grip surface includes at least first and second protuberances selectively spaced apart wider than the given width of the shelf flange, and wherein at least a portion of the grip flange is adapted to be disposed in substantially offset opposing relation with respect to the shelf flange, at least the grip surface being moveable outside at least a part of the bracket, and wherein the fastening shelf member further includes at least a bracket flange, the surrounding member further including at least first and second support panels disposed in substantially offset direct Opposing relation with respect to the bracket flange; and a lock housing including at least a second securing means.

In another example embodiment of the apparatus, the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

In another example embodiment of the apparatus, at least a portion of the side wall is flexed when clamped between the surrounding member and the fastening shelf member.

In another example embodiment of the apparatus, at least a portion of the clamping member is reinforced by through hardening.

In another example embodiment of the apparatus, the second securing means includes at least a lock receptacle including at least a rotation restricting stop surface, wherein the rotation restricting stop surface of the lock receptacle is adapted to receive a barrel lock including at least a body having a rotation restricting stop surface cooperative with the rotation restricting stop surface of the lock receptacle to prevent rotation of a barrel lock.

In another example embodiment of the apparatus, the apparatus further includes at least a rotationally-actuated barrel lock.

In another example embodiment of the apparatus, the rotation restricting stop surface of the lock receptacle is removeable from the second securing means.

In another example embodiment of the apparatus, the clamp actuating member includes at least a rotationally actuated threaded member.

In another example embodiment of the apparatus, the bracket includes at least a body portion, the body portion including at least at least two flanges defining a space therebetween, wherein the surrounding member includes at least at least one engagement surface being disposed substantially outside the space defined by the at least two flanges.

In another example embodiment of the apparatus, the surrounding member further includes at least first and second support panels first adapted to carry the grip flange and wherein first and second support panels and the grip flange are adapted for pivotable movement substantially outside the space defined by the at least two flanges.

In another example embodiment of the apparatus, the apparatus further includes at least a plunger type fastener, and then securing the plunger type fastener by means of a retaining member.

These and other aspects, features, and advantages of example embodiments of the present invention will become apparent from the drawings, the descriptions given herein, and the appended claims. Further aspects are also indicated herein in various example embodiments of the invention. However, it will be understood that the above-listed aspects, embodiments and/or advantages of example embodiments are intended only as an aid in quickly understanding aspects of the example embodiments, are not intended to limit the embodiments of the invention in any way, and therefore do not form a comprehensive or restrictive list of aspects, embodiments and/or features, and/or advantages.

The content and disclosure of each of the following applications/publications are specifically hereby incorporated by reference: U.S. patent application Ser. No. 12/378,879, filed Feb. 20, 2009; U.S. Pat. No. 7,176,376, issued Feb. 13, 2007; U.S. patent application Ser. No. 11/705,653, filed Feb. 12, 2007; U.S. patent application Ser. No. 10/823,285, filed Apr. 13, 2004; U.S. patent application Ser. No. 11/434,665, filed May 16, 2006; International Patent Application No. PCT/US2006/018783, filed May 16, 2006 (which claims the benefit of U.S. Provisional Application No. 60/681,200, filed May 16, 2005, U.S. Provisional Application No. 60/793,104, filed Apr. 19, 2006); U.S. Provisional Application No. 60/681,200, filed May 16, 2005; and U.S. Provisional Application No. 60/793,104, filed Apr. 19, 2006.

These and other aspects, features, and advantages of example embodiments of the present invention will become apparent from the drawings, the descriptions given herein, and the appended claims. Further aspects are also indicated herein in various example embodiments of the invention. However, it will be understood that the above-listed aspects, embodiments and/or advantages of example embodiments are intended only as an aid in quickly understanding aspects of the example embodiments, are not intended to limit the embodiments of the invention in any way, and therefore do not form a comprehensive or restrictive list of aspects, embodiments, and/or features, and/or advantages.

There has thus been outlined, rather broadly, features of example embodiments of the invention in order that the detailed description thereof may be better understood, and in order that the present contribution to the art may be better appreciated. There are additional features of example embodiments of invention that will be described hereinafter.

In this respect, before explaining at least one example embodiment of the invention in detail, it is to be understood that the example embodiments are not limited in its application to the details of construction and to the arrangements of the components set forth in the following description or illustrated in the drawings. Various example embodiments are capable of other further embodiments and of being practiced and carried out in various ways. Also, it is to be understood that the phraseology and terminology employed herein are for the purpose of the description and should not be regarded as limiting.

To the accomplishment of the above and related aspects, example embodiments of the invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

The drawings as noted below form part of the present specification and are included to further demonstrate certain aspects of example embodiments of the invention. Various other aspects, features and attendant advantages of the embodiments of the invention will become fully appreciated as the same becomes better understood when considered in conjunction with the accompanying drawings, in which like reference characters designate the same or similar parts throughout the several views, and wherein:

FIG. 3 shows a closed meter box with a box cover secured using a meter box security apparatus according to the present invention.

FIG. 4A shows a clamping member disposed over a sectional view of a wall portion of a meter box.

FIG. 4B is an isometric view of a clamping member according to the present invention.

FIG. 5A shows a clamping member disposed in a fully clamped and secured position.

FIG. 5B shows a clamping member, further comprising a stopping member.

FIG. 5C is a front view of a stopping member disposed on a clamping member.

FIG. 7A is a plan view of a clamping member and a lock housing, assembled so as to secure a meter box cover to a meter box.

FIG. 7B is an isometric view of a clamping member.

FIG. 7C is an isometric view of a lock housing.

FIG. 8 is a perspective view of the present invention installed onto the watthour meter box in accord with one possible embodiment of the present invention.

FIG. 9 is a side-section view of the present invention installed on a meter box viewed from inside the box in accord with one possible embodiment of the present invention.

FIG. 9A is a side-section view of the present invention as shown in FIG. 9 which may or may not utilize biasing means and wherein if used, the biasing means may or may not replace, or be used in conjunction with, a flexural member in accord with another possible embodiment of the present invention.

FIG. 10 is a side view of the present invention installed on a meter box viewed from inside the box showing the various components of the locking apparatus.

FIG. 10A is a side-section view of the present invention as shown in FIG. 10 which may or may not utilize biasing means and wherein, if used, the biasing means may or may not replace, or be used in conjunction with, a flexural member in accord with another possible embodiment of the present invention.

FIG. 11 is a perspective view of the present invention viewed generally from below, showing the various components of the locking bracket.

FIG. 11A is a side-section view of the present invention as shown in FIG. 11 which may or may not utilize biasing means and wherein, if used, the biasing means may or may not replace, or be used in conjunction with, a flexural member in accord with another possible embodiment of the present invention.

FIG. 12 is a perspective-exploded view of the present invention showing the various components of the locking bracket.

FIG. 12A is a side-section view of the present invention as shown in FIG. 12 which may or may not utilize biasing means such as a compression member and wherein, if used, the biasing means may or may not replace, or be used in conjunction with, a flexural member in accord with another possible embodiment of the present invention.

FIG. 13 is a perspective view of the present invention, illustrating the installation of the entire apparatus onto the meter box base.

FIG. 13A is a side-section view of the present invention as shown in FIG. 13 which may or may not utilize biasing means such as a compression member and wherein, if used, the biasing means may or may not replace, or be used in conjunction with, a flexural member in accord with another possible embodiment of the present invention.

FIG. 14 is a perspective view of the present invention, viewed from below the meter box base front flange, illustrating the installation of the locking bracket onto the meter box base. Portions of the meter box base have been cut away.

FIG. 15 is a perspective view of the present invention, illustrating the locking apparatus position after installation, viewed from below. Portions of the meter box base and lid have been cut away.

FIG. 16 is a perspective view of the present invention illustrating the lock housing position after apparatus installation. Portions of the meter box base and lid have been cut away.

FIGS. 22C1-22C4 show a view of a clamping member disposed in a fully clamped and secured position over a sectional view of a wall portion of a meter box.

FIG. 29A is a perspective views of another example embodiment of a clamp actuating member and clamping member, fastening shelf and clamp actuating member. FIG. 29B and FIG. 29C are perspective views of another example embodiments of a clamp actuating member and clamping member, fastening shelf and clamp actuating member with insulated driving tool.

FIG. 31A and FIG. 31C are example embodiments of a clamp actuating member and clamping member, fastening shelf and clamp actuating member with removable rotation inhibiting clip.

FIG. 31B is an example embodiment of a removable rotation inhibiting clip.

While the present invention will be described in connection with presently preferred embodiments, it will be understood that it is not intended to limit the invention to those embodiments. On the contrary, it is intended to cover all alternatives, modifications, and equivalents included within the spirit of the invention and as defined in the appended claims.

DETAILED DESCRIPTION OF THE INVENTION

Figure 2:
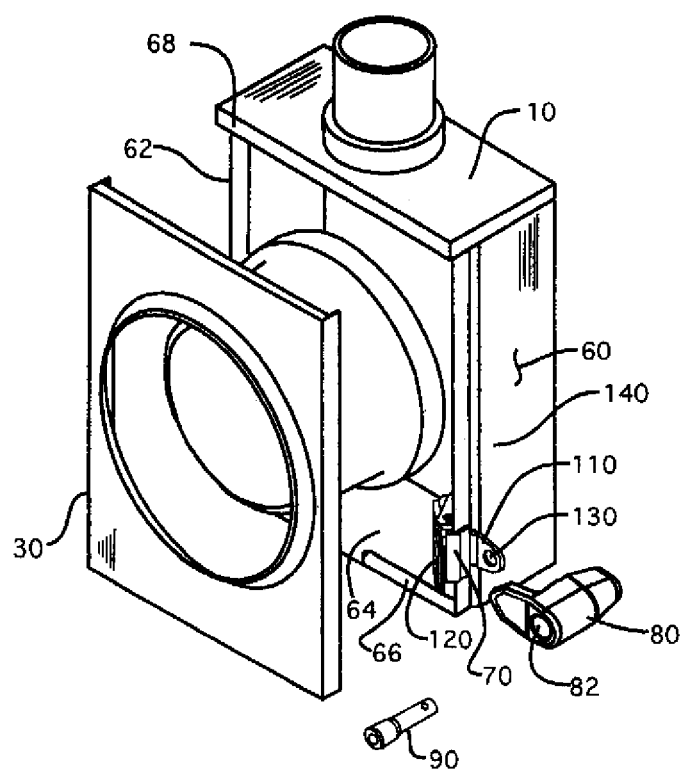
FIG. 2 is an exploded view of a meter box security apparatus comprising a clamping member and a plunger type lock housing.

Referring now to FIG. 2, an exploded view of an example embodiment of the invention is shown, comprising a clamping member 70 disposed over a wall portion 60 of a meter box 10. In FIG. 2, clamping member 70 is shown placed over the sidewall 140 in a non-secured position prior to installation. In other embodiments of the invention, clamping member 70 is disposed over an opposite wall portion 62 of meter box 10. In further example embodiments, clamping member 70 is disposed over a top wall portion 68 of meter box 10. In further example embodiments, clamping member 70 is disposed over a bottom wall portion 64 of meter box 10. In still further example embodiments, clamping member 70 is disposed over a retaining lip 66 disposed on a bottom wall portion 64 of meter box 10.

During installation, clamping member 70 is fastened into place using a clamp actuating member, for example, a fastening lever 120, example embodiments of which are described below. Once clamping member 70 is secured, meter box cover 30 is installed such that clamp actuating member 120 and one end of clamping member 70 are disposed entirely inside an enclosed portion of closed meter box 10, while a fastening shelf 110 remains disposed outside the meter box. In an alternative embodiment, fastening shelf 110 fits inside a slot or other opening in lock housing 80, and the meter box 10 and box cover 30 are fastened together by a plunger type fastener 90 inserted through both an aperture 82 formed in a body portion of lock housing 80 and an aperture 130 formed in a body portion of fastening shelf 110.

As seen in FIG. 3, according to a further example embodiment, a fully installed meter box security apparatus comprises a meter box 10 having a box cover 30 installed over the head of watthour meter 20, and a lock housing 80 fastened to a fastening shelf. Plunger type fastener 90 is inserted into an aperture formed in a body portion of lock housing 80 and then through an aperture formed in a body portion of the fastening shelf, thereby securing the lock housing 80 to the clamping member. Lock housing arm 100 in turn holds a meter box cover 30 securely in place so that the meter cannot be tampered with.

Referring now to FIG. 4A, an example embodiment of the invention is shown, comprising a clamping member 70 hung over a meter box wall portion 140. In a specific, non-limiting embodiment, clamping member 70 is a bracket, further comprising a fastening shelf 110 having an aperture 130 disposed at one end and a clamp actuating member 150 at the other end. A plurality of engagement members 180, 210 is disposed on a body portion of the clamping member 70. The particular location of and uses for the plurality of engagement members 180, 210 will vary according to the requirements of the operational environment.

For example, in certain embodiments, engagement member 210 further comprises a clamp 190 having a plurality of engagement surfaces 200, 215. In this particular embodiment, when clamp actuating member 150 is actuated toward a locked position, upper wall portion 140 is securely clamped between engagement surface 215 and clamping member 70 to achieve a reliable and secure installation. In other embodiments, engagement surface 200 also clamps beneath wall portion 140 to ensure a secure fitting. In a further embodiment, engagement surface 215 does not clamp to upper wall portion 140; in this configuration, only engagement surface 200 is secured beneath a portion of wall 140. An isometric view of some of the aforementioned features is shown in greater detail in FIG. 4B.

Referring again to FIG. 4A, when clamp actuating member 150 is rotated about actuable member 180, arced surface 170 contacts clamp 190, and through a cam-type action, sandwiches one (or both) of the clamp engagement surfaces 200, 215 between clamp actuating member 150 and wall portion 140, thereby creating a constant engagement surface along the interface between wall portion 140 and engagement surface 200. In another embodiment, the force applied to actuate clamp actuating member 150 into a fully engaged or secured position is translated and mechanically multiplied by the clamping force imparted by one (or both) of engagement surfaces 200, 215 onto wall portion 140. In certain alternative embodiments, engagement surface 200 includes one or more protruding tabs that grip wall portion 140 with greater force per unit area than would be realized by a constant engagement surface having a greater area.

Referring now to the example embodiment of FIG. 5A, the position of clamp actuating member 150 is shown after it has been fully rotated into a secured position. In certain embodiments, clamp actuating member 150 is rotated until it securely fastens into a notched receiving member 160 cut out of arced surface member 170, the notched receiving member 160 providing a tactile indicator of when the clamp actuating member 150 has reached its fully secured position, and when clamping member 70 is securely fastened to a wall portion 140.

According to one embodiment of the invention, the specific location of notched receiving member 160 permits a terminus end of clamp actuating member 150, when fully rotated and secured, to be contained within an enclosed portion of the meter box even after the box cover has been fully installed. On the other hand, if clamp actuating member 150 is not fully rotated and secured into place, a terminus end of clamp actuating member 150 will protrude from the confines of the meter box, and will therefore not permit final installation of the box cover. In alternative embodiments, notched receiving member 160 is disposed so that the clamp actuating member 150, when fully rotated and secured in place, touches the inside surface of a fully installed box door, but does not interfere with its installation.

In other example embodiments, for example, as seen in FIG. 5B, a stopping member 182 is disposed along the bottom of clamp 190, upon which a bottom surface 162 of clamp actuating member 150 rests when the clamp actuating member 150 is in a fully secured position. In another example embodiment, stopping member 182 is disposed along the bottom of clamp 190 so as to prevent the fastening lever 150 from camming over a center of rotation. FIG. 5C shows a side view of another example embodiment of clamp 190, wherein stopping member 182 is stamped into or otherwise formed structurally integral with clamp 190. In other example embodiments, a stopping member 182 is affixed to the clamp 190 prior to installation.

In certain embodiments, clamp actuating member 150 is held in a fully secured position by both a frictional force imposed on notched receiving member 160 when the clamp actuating member 150 is fully turned, and by a spring force inherent in the interaction between the leverage on wall portion 140 imparted by clamp actuating member 150 and clamp 190. In other embodiments, clamp actuating member 150 is held in a fully secured position by means of a separate securing means, for example, by means of a latch or a spring (not shown) disposed between the clamp and the clamp actuating member.

Figure 6A:
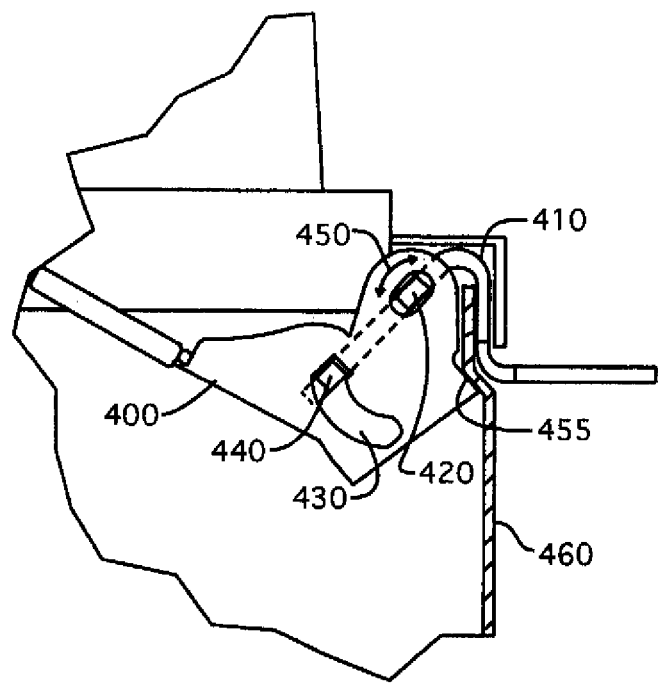
FIG. 6A shows a clamp actuating member according to the present invention.

Turning now to FIG. 6A, a further embodiment of the invention is shown, wherein a clamp actuating member 400 is attached to a clamping member 410, so that the clamp actuating member 400 rotates about a rotational axis established by the position of engagement means 420. A channel 430 is formed on at least one side of clamp actuating member 400, through which guide member 440 travels during actuation of clamp actuation member 400. During installation, clamp actuation member 400 is rotated about engagement member 420 so that bracket 410 will fit over a box wall 460. To secure the base to the wall, clamp actuating member 400 is then rotated in the other direction, back around engagement member 420, toward a secured position, so that surface engagement member 455 sandwiches wall portion 460 between bracket 410 and surface 455.

Figure 6B:
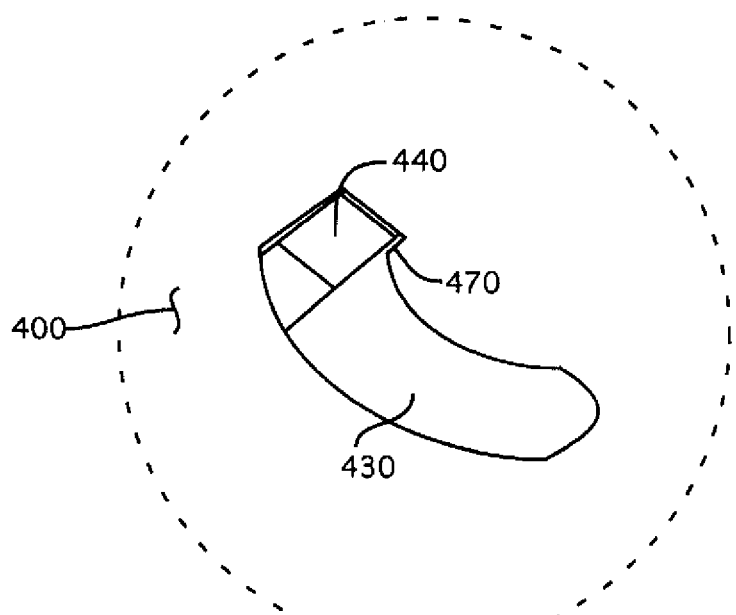
FIG. 6B is a close view of a latching mechanism suitable for use in connection with a clamp actuating member.

Referring now to FIG. 6B, a cut away view of clamp actuating member 400 is provided, wherein a channel 430 and a guide member 440 are shown as non-limiting aspects of the present invention. Clamp actuating member 400 is securely fastened in position after member rotation by means of a stopping shelf 470, upon which rests guide member 440, and also by the inherent spring forces present in the system after clamp actuating member 400 has been fully actuated into a secured position. According to one embodiment of the invention, the desired length and design of channel 430 and stopping shelf 470 is such that the clamp actuating member 400, when secured, is fully contained within an interior space present within the meter box, and does not interfere with installation of a box cover. In another example embodiment, the length and design of channel 430 and stopping shelf 470 are such that the clamp actuating member 400, when fully secured, touches an interior surface of a fully installed box cover, but, again, does not interfere with the cover's installation.

Referring now to FIG. 7A, another exemplary embodiment of the invention is shown, wherein the clamping member 500 is securely fastened to a wall portion 510, and box cover 520 is in a fully installed position. Lock housing 540 is affixed to meter box 530 by means of housing arm 545, and by the interaction between plunger type fastener 550 and fastening shelf 560, which has an aperture through which plunger type fastener 550 passes. In other embodiments, plunger type fastener 550 is held in place after installation by means of a retaining member 555. In various other embodiments, lock housing 540 and plunger type fastener 550 are replaced by a single unitary structure, which locks onto fastening shelf 560, thereby securing box cover 520 to meter box 530. In still other embodiments, housing arm 545 fits into a slot (not shown) formed in the box cover 520.

FIGS. 7B and 7C are isometric views of further embodiments of the invention, wherein clamping member 500 and lock housing 540 are shown prior to installation. Fastening shelf 560 fits into a receiving shelf 570 such that aperture 547 lines up with aperture 565. To lock the two pieces together, a plunger type fastener is aligned with aperture 547, and then a body portion of the fastener is pushed through each of apertures 547, 565 and 580. Referring back to FIG. 7A, in some example embodiments of the invention, plunger type fastener 550 is secured in place inside the lock housing 540 by means of one or more retaining members 555. In still other embodiments, the plunger type fastener 550 is formed structurally integral with the lock housing 540.

In another example embodiment illustrated in FIG. 8, there is shown a ringless type meter box 627 that includes a box cover 620, and a box base 619. Formed around an opening in a central portion of meter box cover 620 is a flange 629. A complementary flange is disposed on meter 628 such that, when meter box cover 620 is installed over and around the head of meter 628, the meter complementary flange is encased by meter box cover flange 629, so that the meter cannot be easily removed from the electrical socket unless the cover 620 is first removed from the meter box base 619.

The meter box cover 620 is typically secured in place by means of a small latch assembly, which functions in structural cooperation with a complementary latch-receiving member disposed on the meter box base 619. The meter box cover 620 is used to secure the meter 628 to the electrical socket (not shown), so that completion of an electrical circuit is ensured, and the meter is reliably prevented from falling out of the meter box socket. The meter box cover 620 also prevents unauthorized persons from tampering with the meter 628. As shown in FIGS. 9 and 14, meter box base 619 comprises wall 623. Wall 623 comprises front flange 621 which extends inwardly from wall 623.

Referring now to FIGS. 8, 9, 9A, 10, and 10A, there is shown watthour meter box 627 wherein lock housing 614 may be utilized for securing meter box cover 620 to meter box base 619. The lock housing 614 is generally comprised of a unitary member incorporating a generally perpendicular flange 615 and multiple apertures or openings which may be interconnected such as 617, 622. Opening 617 may extend into lock housing perpendicular to perpendicular flange 615 and extend through opening or aperture 622, which may, if desired, be generally transverse to opening 617. Aperture 622 preferably opens onto an interior side of lock housing 614 and receives fastening shelf 604 of clamping member 602. As shown in FIGS. 9 and 9A, lock housing 614 may be used in conjunction with clamping member 602 such that cover 620 is held in place between flange 610 of clamping member 602 and perpendicular flange 615 of lock housing 614.

The clamping member 602 is generally comprised of multiple flanges 606, 610, 605 with one of the flanges 606 containing a preferably circular aperture 624 and a fastening shelf 604 that also contains a preferably circular aperture 607. Additional flanges may be added or fewer flanges may be used to accomplish the function as described henceforth.

A locking bracket 601 as shown enlarged in FIGS. 11, 11A, 12, 12A, 13, and 13A may generally comprise clamping member 602 and a fastening lever 603. The fastening lever 603 is generally comprised of multiple flanges 608,

609, 611 with one of the flanges 611 containing a generally circular aperture 625. Additional flanges may be added or fewer flanges may be used to accomplish the function as described henceforth.

As shown in the exploded view of the embodiment of FIG. 12, the fastening lever 603, flexural member 613, and clamping member 602 may be joined through the corresponding apertures 625, 624 with a permanent type fastener 612, which may be a rivet or other type of fastener which allows rotational motion between fastening lever 603, and clamping member 602. Fastener 612 is preferably permanent (but may also be non-permanent and easily removable). Flexural member 613 is partially compressed between the flanges 606 and 611 of clamping member 602 and fastening lever 603. The flexural member is a compressible member which applies a biasing force that biases clamping member 602 and fastening lever 603 preferably away from each other or to separate.

In the embodiment of FIG. 12A, a compression member 630 is adapted to be received by a flange 608 disposed on fastening lever 603. Compression member 630 may be attached to flange 608 by various means, one of which is shown and may comprise a cap. Flange 608 comprises edge 640 and stop surface 641 and is adapted to receive compression member 630 which comprises terminate edge 640A and stop surface 641A. It will be appreciated that edge 640 or terminate edge 640A is a surface although preferably narrow in width and rotates and engages the wall 623 at the same time. Compression member 630 may be wholly or partially comprised of elastomeric material, plastic, or other compressible material. The compressible material may preferably also be resilient so as to permit repeated reuse. The compressible material is also preferably an electrical insulator which reduces any likelihood of contacting electricity which might possibly be present within meter box base 619. Compression member 630 may be used in place of flexural member 613, or in conjunction with it, or with other compression members.

The directly subsequent discussion of assembly and operation of locking bracket 601 onto base 619 of watthour meter box 627 is made using the example of compression member 630, but resilient compression members such as flexural member 613, or other resilient compression members discussed hereinafter, or compression members such as lobe 734 (e.g., See FIG. 17) which may or may not be resilient, may be utilized to provide a secure fit of locking bracket (e.g., 601) onto base (e.g., 619). Compression members may be used with or without each other.

Referring to FIG. 13A, the locking bracket 601 is installed onto the base 619 of the watthour meter box 627 in the following manner: The fastening lever 603 is first rotated to an "open" position as shown with the flange 609 of the fastening lever 603 in a generally perpendicular position to the flange 610 of the clamping member 602. The locking bracket is moved toward the wall 623 of the meter box base 619, shown by movement arrow "A", allowing the front flange 621 of the meter box base 619 to pass between the compression member 630 disposed on flange 608 of the fastening lever 603 and the fastening shelf 604 of the clamping member 602. The locking bracket 601 is then lowered onto the front flange 621 of the watthour meter box base 619 shown by movement arrow "B" until the front flange 621 of the meter box base 619 is in contact with the flange 610 of the clamping member 602.

Figure 14A:
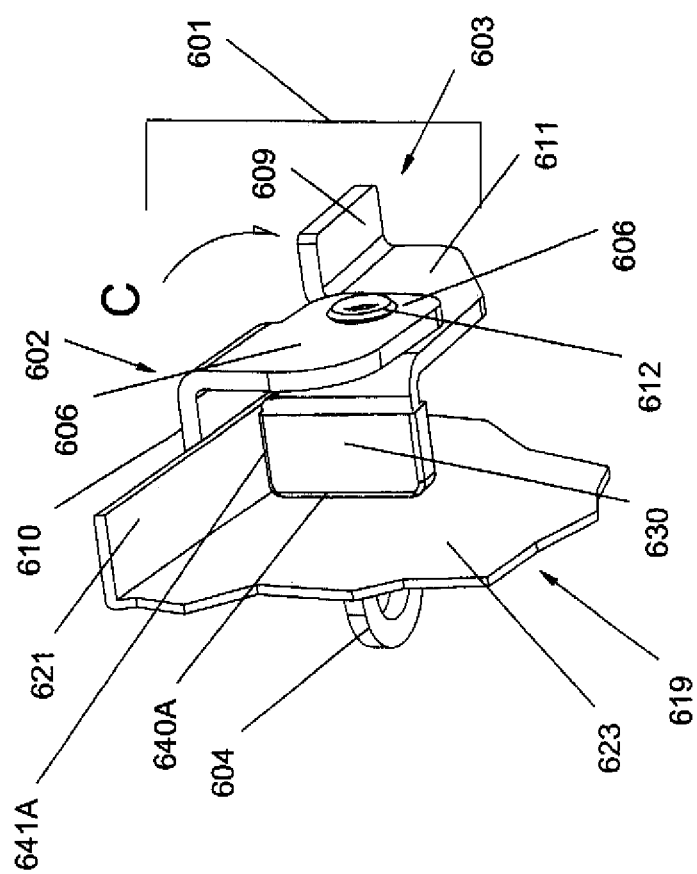
FIG. 14A is a side-section view of the present invention as shown in FIG. 15 which may or may not utilize biasing means such as a compression member and wherein, if used, the biasing means may or may not replace, or be used in conjunction with, a flexural member in accord with another possible embodiment of the present invention.

Now referring to FIG. 14A, which shows a view on the other side of that shown in FIG. 13A, the installer bears on flange 609 of the fastening lever 603 causing the fastening lever 603 to rotate to a "closed position", shown by movement arrow "C". As shown in FIG. 10A, it will be seen that rotation of fastening lever 603 is around axis of rotation 644, which may be generally transverse, perpendicular, or orthogonal to wall 623. In this embodiment, axis of rotation 644 is orthogonal to wall 623, parallel to box cover 620, perpendicular to flange 605, and parallel to a plane of fastening shelf 604. In this embodiment, rotation of fastening lever 603 is in a plane parallel to a plane defined by what might be called the y-axis and the z-axis. In this case, the x-axis would be coincident with axis of rotation 644. Fastening lever 603 would extend into and out of the page in the z-axis. It will be understood that perpendicular or orthogonal is meant to include roughly or approximately perpendicular or orthogonal such that some variation within between about one to ten degrees may occur.

However, axis of rotation 644 could be angled away from wall 623 e.g., by providing that axis of rotation 644 is at an angle with respect to the z-axis and the x-axis while still perpendicular to the y-axis such as by bending flange 606 inwardly toward the interior of meter box base 619. In this case, axis of rotation 644 may still be perpendicular with respect to an axial direction x. In this case, when fastening lever 603 is rotated, then terminate end engagement surface 640A does not come into contact with wall 623 until near the end of rotation, which occurs when stop surface 641A engages the underside of front flange 621. Thus, in this embodiment, at least one axial direction of axis of rotation 644 is perpendicular to the y-axis and/or wall 623.

As the lever 603 is rotated, the compressible member 630, due to the limited space defined by a lower surface of front flange 621 and wall 623 of the watthour meter box base 619 and the terminate end 640A of the flange 608, will compress. The compression of compressible member 630 ensures a "secure feel" and a tighter fit of the locking bracket to the watthour meter box base. The installer continues to rotate the fastening lever 603 until stop surface 641A engages the inside surface of front flange 621. In a preferred embodiment, the flange 609 of the fastening lever 603 is in a generally parallel position to the flange 610 of the clamping member 602 when stop surface 641A engages the inside surface of front flange 621. The front flange 621 of the meter box base 619 is now trapped between the compression member 630 disposed on flange 608 of the fastening lever 603, and the flange 610 of the clamping member 602. As shown in FIG. 15, when meter box lid 620 is installed onto the meter box base 619, then the upper surface 643 of flange 609 may be prevented from movement and/or may be biasingly engaged with the inner surface of box lid 620. The compression member 630, in one example embodiment, provides a bias force between locking bracket 601 and wall 623 and front flange 621 and also frictional engagement which serves to hold the locking bracket 601 securely in place for subsequent attachment of lock housing 614.

Referring to FIG. 16, the meter box lid 620 is then installed onto the meter box base 619. The meter box lid 620 covers the flange 609 of the fastening lever 603 and the flange 610 of the clamping member 602.

Once the lid 620 is in place, the aperture 622 in the lock housing 614 is aligned with the fastening shelf 604 of the clamping member 602. The lock housing 614 is then slid onto the fastening shelf 604 of the clamping member 602, shown by movement arrow "D" in FIG. 13A. The locking shaft 616 is then inserted through the aperture 617 in the lock housing 614, shown by movement arrow "E" which is perpendicular to the fastening shelf 604. Shown in FIGS. 9, 9A, 11, and 11A, the locking balls 618 of the locking shaft 616 become trapped as they pass though the aperture 607 of the fastening shelf 604; this prevents the removal of the locking shaft 616 from the lock housing 614. Fastening shelf 604 may have tapering sides to permit easier insertion or guiding of fastening shelf 604 into aperture 622 of locking shaft 616. Aperture 622 is preferably sized to mate with the sides of fastening shelf 604 at least near flange 605 so as to prevent sideways movement of clamping member 602.

The perpendicular flange 615 of the lock housing 614 prevents meter box lid 620 removal; consequently the meter box lid 620 prevents the fastening lever 603 from rotating to the "open position". The fastening lever 603, the clamping member 602, the connector 612, lock housing 614, the lid 620, and the meter box base 619, interact together to prevent the removal of both the meter box lid 620 and the entire locking apparatus.

Referring back to FIGS. 9, 10, 11, 12, 13, 14, and 15 when flexural member 613 is utilized, the compressive biasing force so produced between clamping member 602 and fastening lever 603 results in a biasing being applied against both sides of wall 623 of the meter box base 619. On the inner side of wall 623, the periphery 640 of flange 608 of fastening lever 603 is urged into engagement with wall 623. On the outer surface of wall 623, inner surface of flange 605 of clamping bracket 602 is biased toward engagement with the outer side of wall 623. Fastening lever 603 is rotated until stop surface 641 engages the inner surface of front flange 621. In a preferred embodiment, the flange 609 of the fastening lever 603 is in a generally parallel position to the flange 610 of the clamping member 602 when stop surface 641 engages the inside surface of front flange 621. The front flange 621 of the meter box base 619 is now trapped between the compression member 630 disposed on flange 608 of the fastening lever 603, and the flange 610 of the clamping member 602. As shown in FIG. 15, when meter box lid 620 is installed onto the meter box base 619, then the upper surface 643 of flange 609 may be prevented from movement and/or may be engaged with the inner surface of box lid 620. If it is desired to provide biased engagement of flange 609 with inner surface of box lid 620, then compression member 630 may be utilized and/or flange 609 may be provided with resilient compression material that may be in the form of a cap such as the cap shape of compressible member 630, or resilient compression material can otherwise be applied to flange 609.

In an alternate embodiment, compressible member 630 may or may not be used. In this alternate embodiment, a different compressible member, comprising a different shape, material, or attachment means as shown in the illustrations, may be disposed on the inside of flange 605 of the clamping member 602. In this embodiment, as the fastening lever 603 is rotated to a "closed position" as previously described, the flange 623 of the watthour meter box base 619 becomes trapped between the terminate end of flange 608 disposed on the fastening lever 603, and the compressible member, performing a similar function as previously described.

In another alternate embodiment, one or more compressible members may or may not be used. Assuming a compressible material is not used, in this embodiment, as the fastening lever 603 is rotated to a "closed position" as previously described, the wall 623 of the meter box base 619 becomes trapped between the terminate end 640 of flange 608 disposed on the fastening lever 603, and the flange 605 of the clamping member 602.

Figure 17:
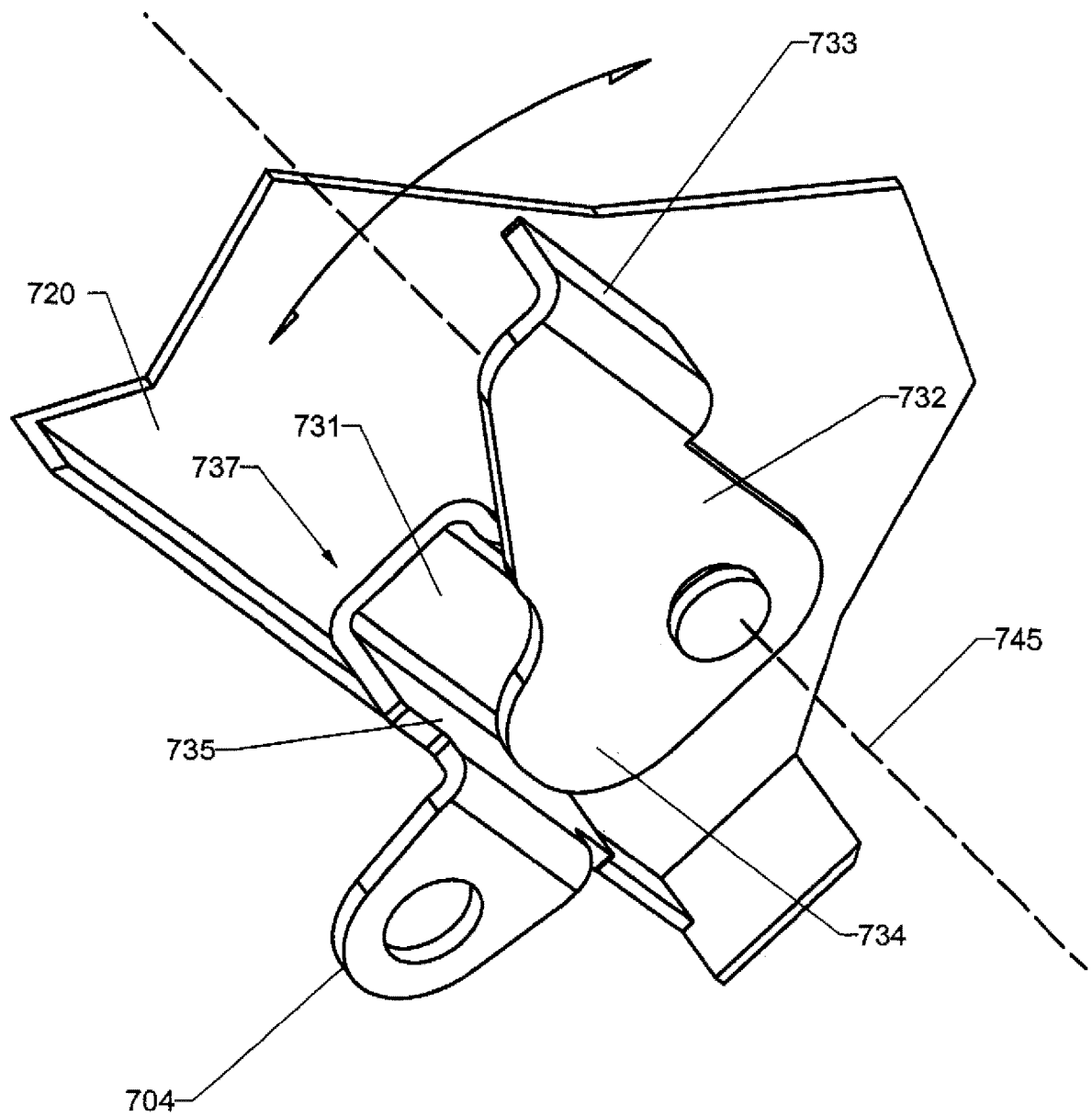
FIG. 17 is a perspective view of an alternate embodiment of the present invention showing the various components of the locking bracket in the "closed" position.
Figure 18:
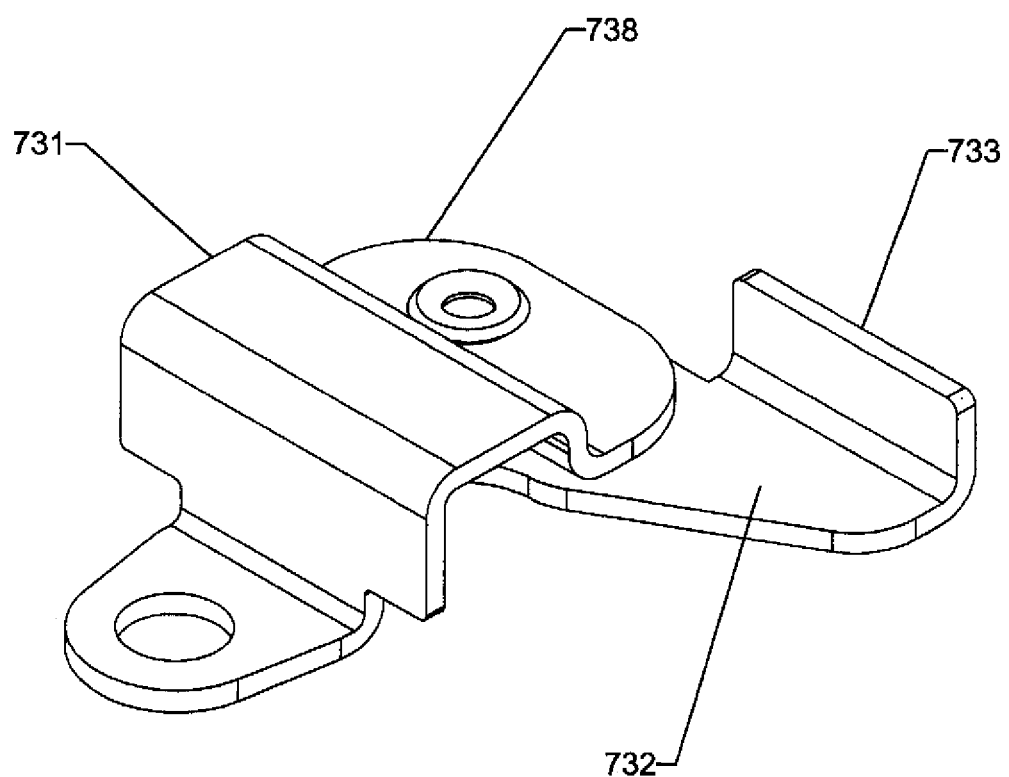
FIG. 18 is a perspective view of an alternate embodiment of the present invention showing the various components of the locking bracket in the "closed" position.
Figure 19:
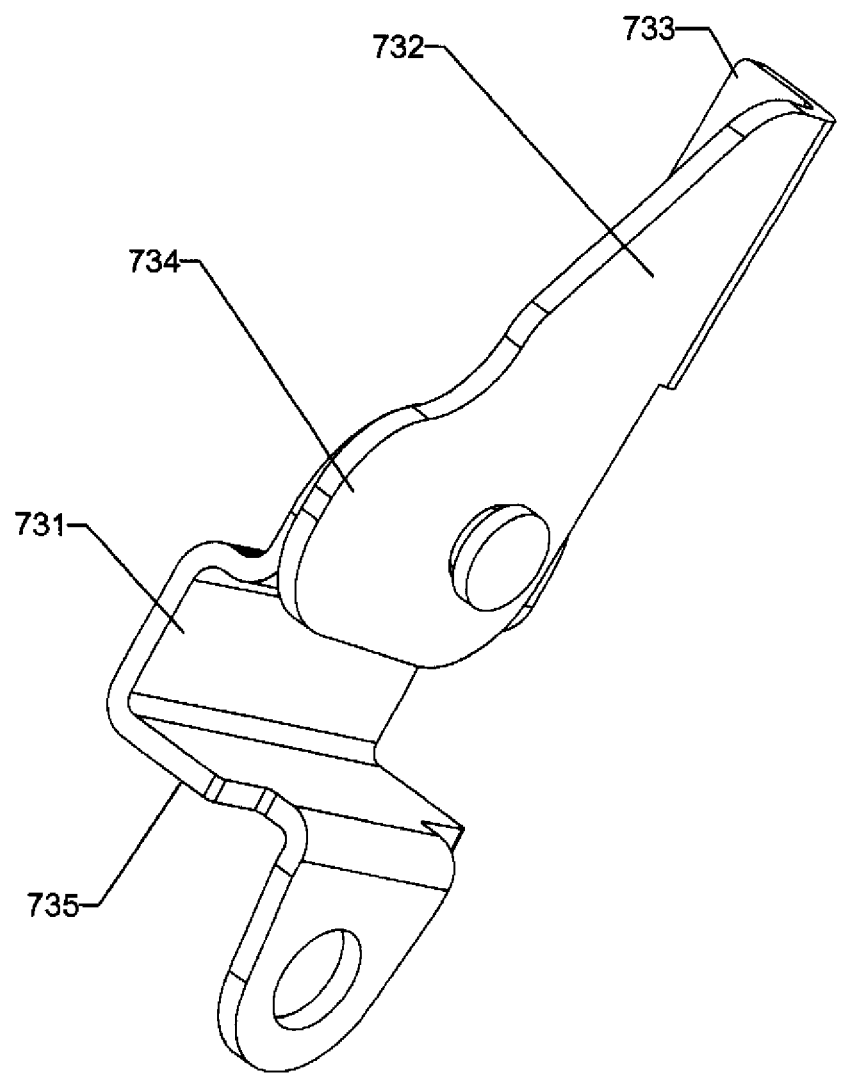
FIG. 19 is a perspective view of an alternate embodiment of the present invention showing the various components of the locking bracket in the "open" position.

In another alternate embodiment, shown in FIGS. 17-19, a compressible member may not be used. In this embodiment, the lever 732 comprises an engaging lobe 734. The lever 732 rotates in a generally parallel relationship to flange 738 of clamping member 737. Thus, axis of rotation 745 may be generally orthogonal to metal box cover 720, parallel to wall 723, parallel to flange 735 which engages an outer surface of wall 723, and perpendicular to the plane of fastening shelf 704. Flange 731 is in a generally perpendicular relationship to flange 735 of the clamping bracket 737. As the fastening lever 732 is rotated to a "closed position" as shown in FIGS. 17, 18, the wall 723 of the meter box base 719 becomes trapped between the engaging lobe 734 disposed on the fastening lever 732, and the flange 735 of the clamping member 737.

In another example embodiment of the lever end 609 shown in FIG. 10 is in functional cooperation with a portion 615 of a lock housing mounted to a portion of the clamping member such that the lock prevents rotation of the lever to an open position if the lid is pried upwardly.

In another example embodiment of the apparatus the lever end 609 is in functional cooperation with a portion of a meter box lid 620 such that the lid prevents rotation of the lever to an open position.

In another example embodiment of the apparatus shown in FIGS. 10 and 13 the lever end 609 is at least partially outside the interior of the meter box in a mounting position and at least partially inside the interior of the meter box in a locked position.

Figure 1:
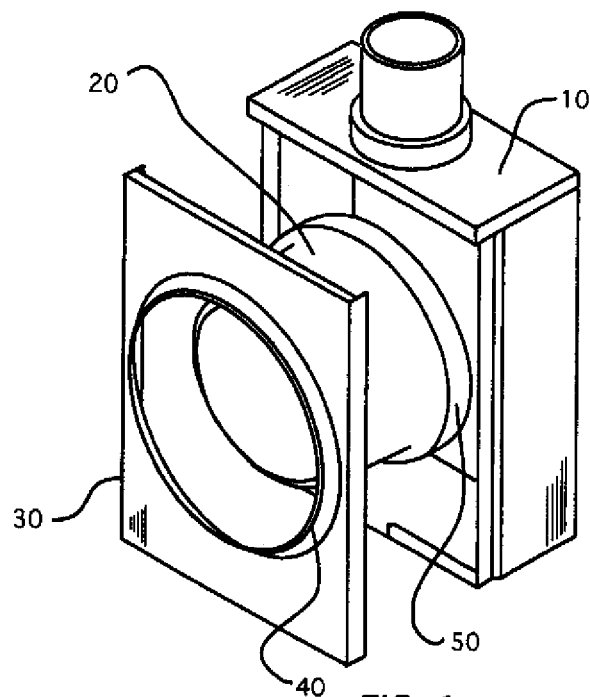
FIG. 1 is an exploded view of a known ringless meter socket box, including a watthour meter and a meter box lid.

Another example embodiment of the apparatus further comprises the meter box. For example, the meter box may have the configuration as shown in FIGS. 1, 8, or that of various other meter boxes suitable for use with the invention.

Another example embodiment of the apparatus further comprises a locking structure (e.g., 614 or other types of locking structures adaptable for use with the invention) for functional cooperation with the clamping member (see, for example, FIG. 11, item 602) for securing a meter box lid to a meter box base.

Various other example embodiments provide an apparatus that may be adapted for use on a utility service enclosure generally. Such a utility service enclosure may have various configurations, shapes and sizes and be used in the electric utility industry (e.g., a meter box) as well as in the gas, water, cable, TV utility industries or in other utility industries.

Figure 20:
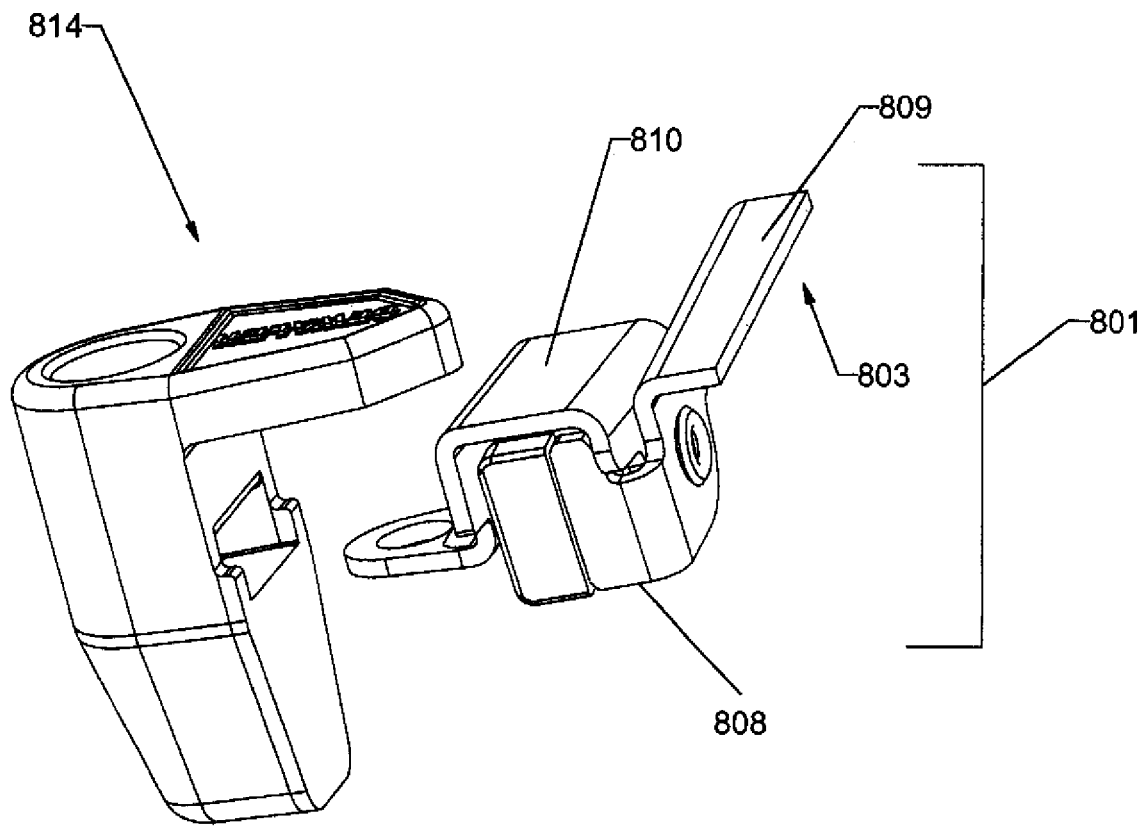
FIG. 20 is a perspective view of another alternate embodiment of the present invention showing the various components of the locking bracket in the "closed" position.

The example embodiment shown in FIG. 20 comprises locking bracket 801 and receiver housing 814. The locking bracket 801 is shown in a "closed" mode and is adapted to be attached or mounted to a structural portion of an enclosure generally (which could be any type of container, compartment, box-like structure or enclosure having a cover, access panel or other securable structure which can be secured with respect to a structural portion of the enclosure) or, for example, a utility enclosure (not shown). The locking bracket 801 may comprise a fastening structure 803 and mounting structure 810. The receiver housing 814 can be mounted generally on an outer structural portion of an enclosure (as well as internal portions) in such a way that the receiver housing 814 cooperatively receives and secures (with, for example, a barrel lock or other locking device) the locking bracket 801 so as to secure one structural portion of the enclosure to another portion of the enclosure (such as a cover or an access panel). In one example embodiment, the locking bracket 801 is mounted and attached to a flanged wall of the enclosure so as to be mounted substantially in the interior of an enclosure, wherein an enclosure lid (not shown) may be positioned over an opening of the enclosure.

The receiver housing 814 is configured to cooperatively receive a portion of the locking bracket 801 to secure the lid in place with a suitable locking device.

Another example embodiment for securing a cover of an enclosure comprises a locking bracket, wherein the locking bracket further comprises an engagement member and a mounting member. The engagement member preferably comprises a biased engagement flange which is biased to engage a structural portion of the enclosure. In one embodiment, the locking bracket also generally comprises a fastening shelf connected to the mounting member, with the fastening shelf comprising a first securing means. A lock housing is also preferably used and configured to receive at least a portion of the fastening shelf. In this way the lock housing is used with the locking bracket such that the cover is held in place between the mounting member and at least a portion of the lock housing.

In an example embodiment, the locking bracket may also comprise an engagement member connected to an opposing flange, with the engagement member biased to engage, for example, a portion of an enclosure wall (e.g., such as a meter box side wall). In an example embodiment, the engagement member may comprise a biased engagement flange in cooperation with an opposing flange, wherein the opposing flange is preferably adapted to be disposed outside the enclosure (e.g., see FIG. 11, item 605; FIG. 4A, item 130), with the biased engagement flange being biased so as to engage an interior surface of an enclosure (e.g., such as a enclosure or meter box side wall). In this way, the locking bracket may be effectively affixed to a portion of an enclosure, with or without camming or lever structures. The locking bracket preferably further comprises a fastening shelf connected to the opposing member. The fastening shelf is disposed outside the enclosure and comprises a first securing means. A cover or access panel may be disposed over the locking bracket in such a way that the biased engagement flange is positioned in the interior of the enclosure and the opposing member is disposed on the outside of the enclosure. A lock housing comprising a second securing means is adapted to receive at least a portion of the fastening shelf. The second securing means is adapted to receive a locking device (e.g., such as a barrel lock) in such a way as to secure the lock housing to the locking bracket. In another embodiment, other structures or features of the other embodiments disclosed herein may also be included with the locking brackets and lock housings above.

In one example embodiment, the biased engagement flange may be configured to engage the inner ledge of the side wall of an enclosure such as a watthour meter box (e.g., see FIG. 2, items 66 or 68; FIG. 4A, item 140), or to engage a flange or bottom wall (e.g., see FIG. 14, items 621, 623).

In another embodiment, a locking bracket may further comprise a reinforcing clip member adapted to be mounted over at least a portion of the opposing flange and preferably at least a portion of an inner flange (such as, in one example embodiment, a biased engagement flange) with the inner flange being configured in functional cooperation with the opposing flange to inhibit undesired flexing of the inner flange and/or the opposing flange as well as to reinforce the side wall engagement to prevent tampering or unwanted removal of the locking bracket. The reinforcing clip may also be configured for slidable engagement with at least some portion of the opposing flange and/or inner flange to inhibit undesired flexing of the inner flange and/or the opposing flange.

Figures 21A, 21B, 21C:
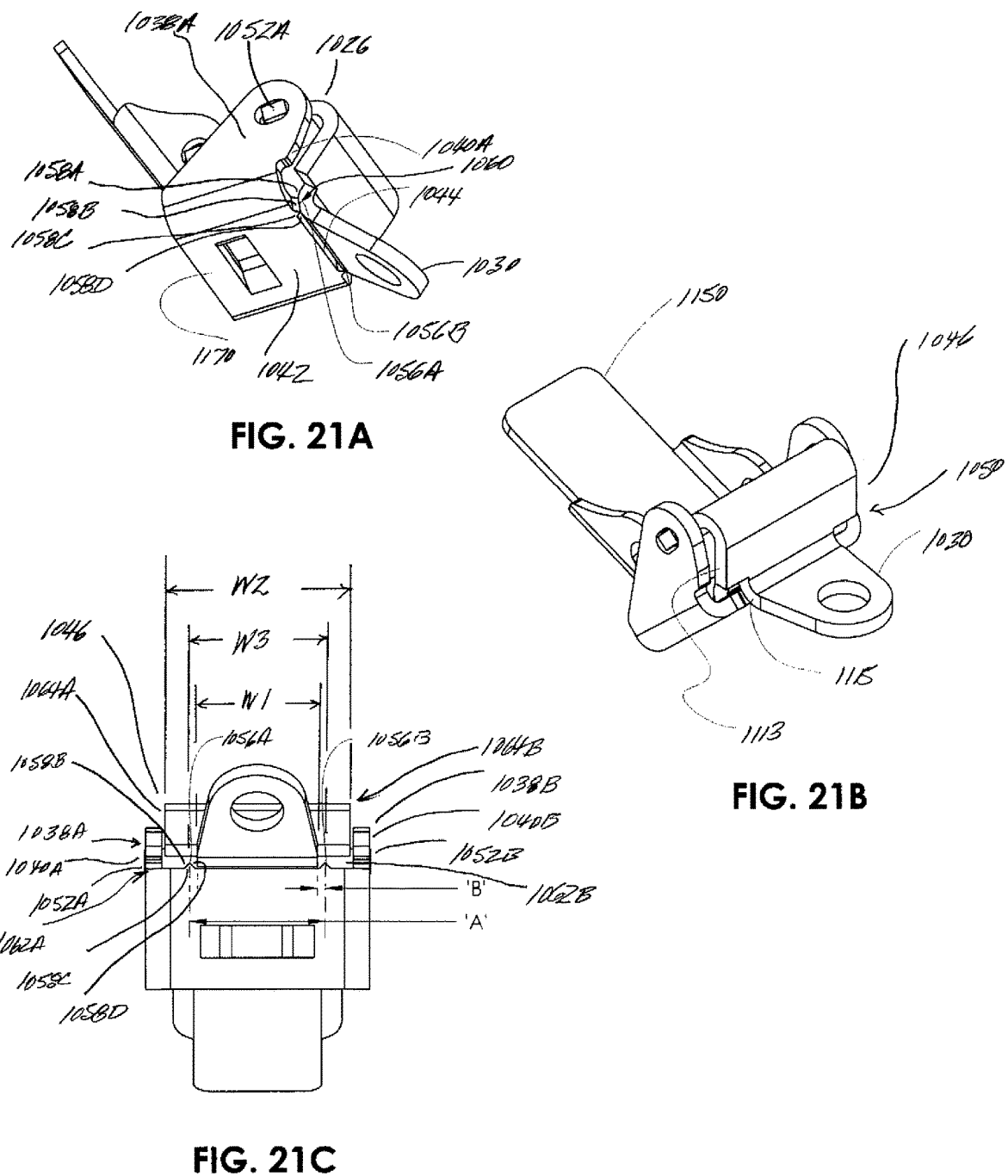
FIG. 21A is a perspective view of an example embodiment of a clamping member with a clamp, in a clamped position.
FIG. 21B is a perspective view of another example embodiment clamping member with a clamp, in a clamped position.
FIG. 21C is a bottom view of another example embodiment clamping member with a clamp, in a clamped position.
Figure 22A:
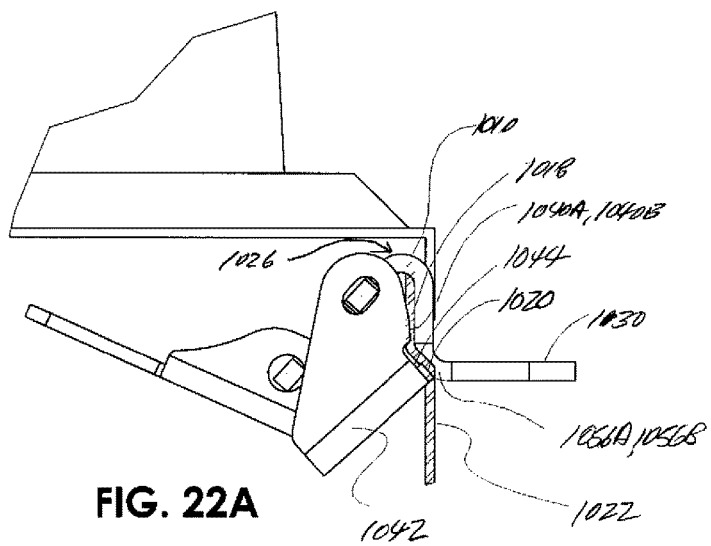
FIG. 22A shows a view of a clamping member disposed in a fully clamped and secured position over a sectional view of a wall portion of a meter box.
Figure 22B:
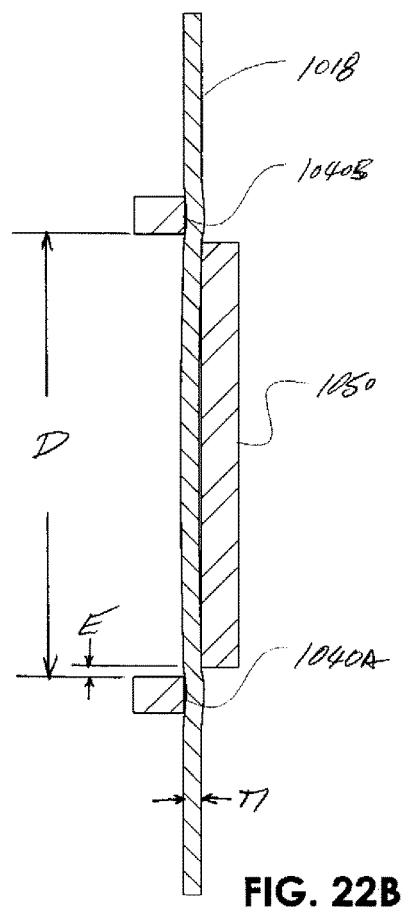
FIG. 22B shows a view of a clamping member disposed in a fully clamped and secured position over a sectional view of a wall portion of a meter box.
Figure 23A:
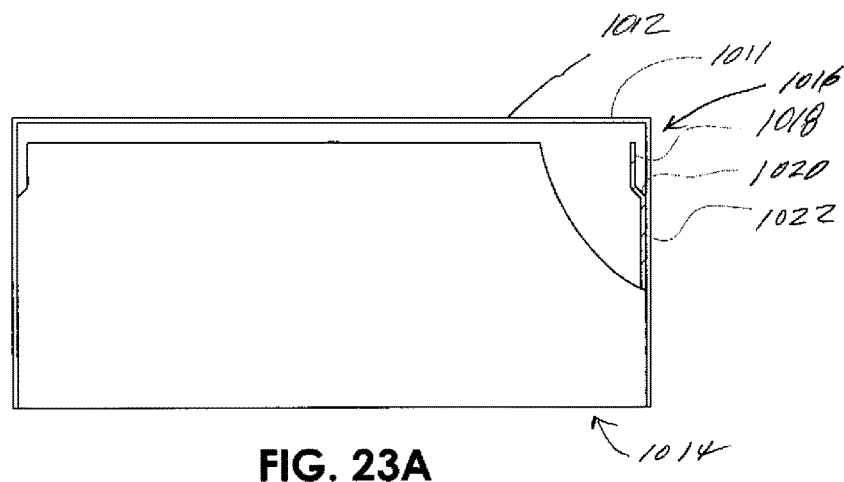
FIG. 23A is a perspective view of a meter box with a sectional cutout view of an enclosure wall.
Figure 23B:
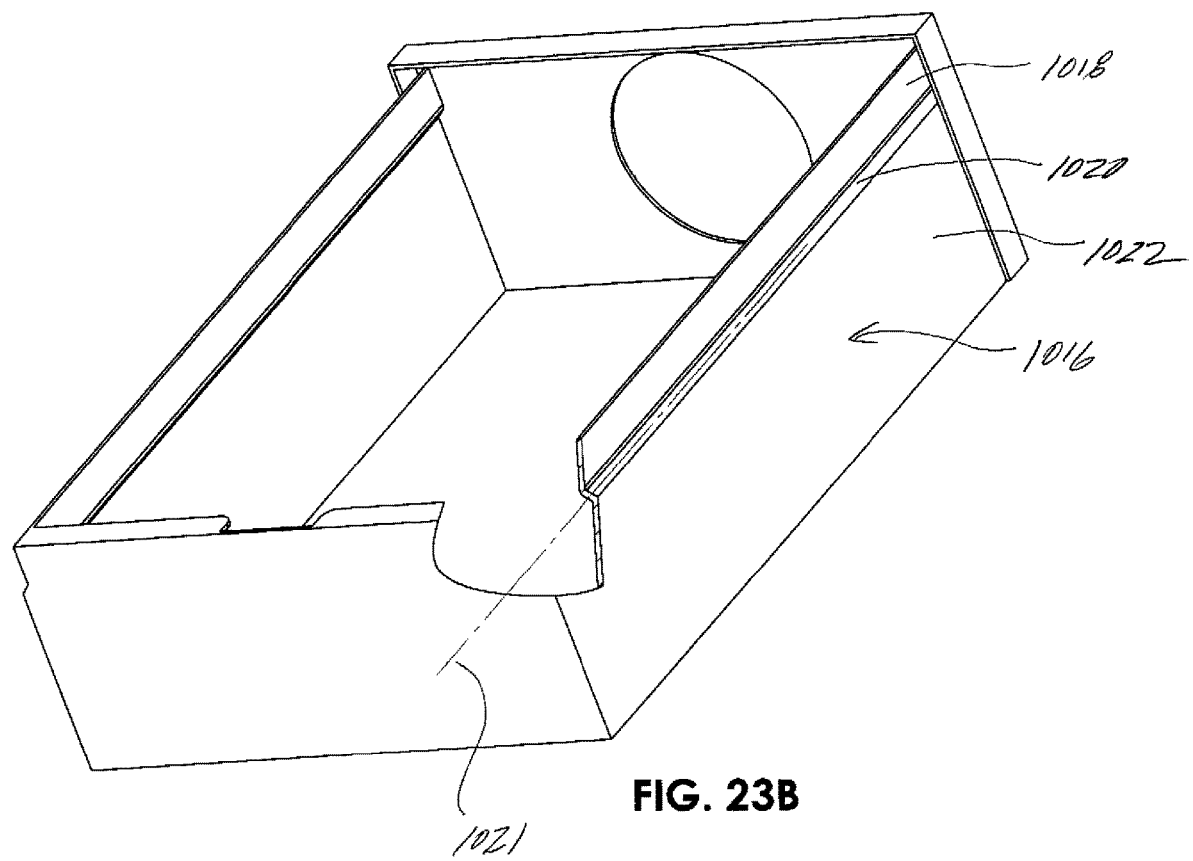
FIG. 23B is another perspective view of meter box with cutout sectional view of wall onto which clamping member attaches.
Figure 23C:
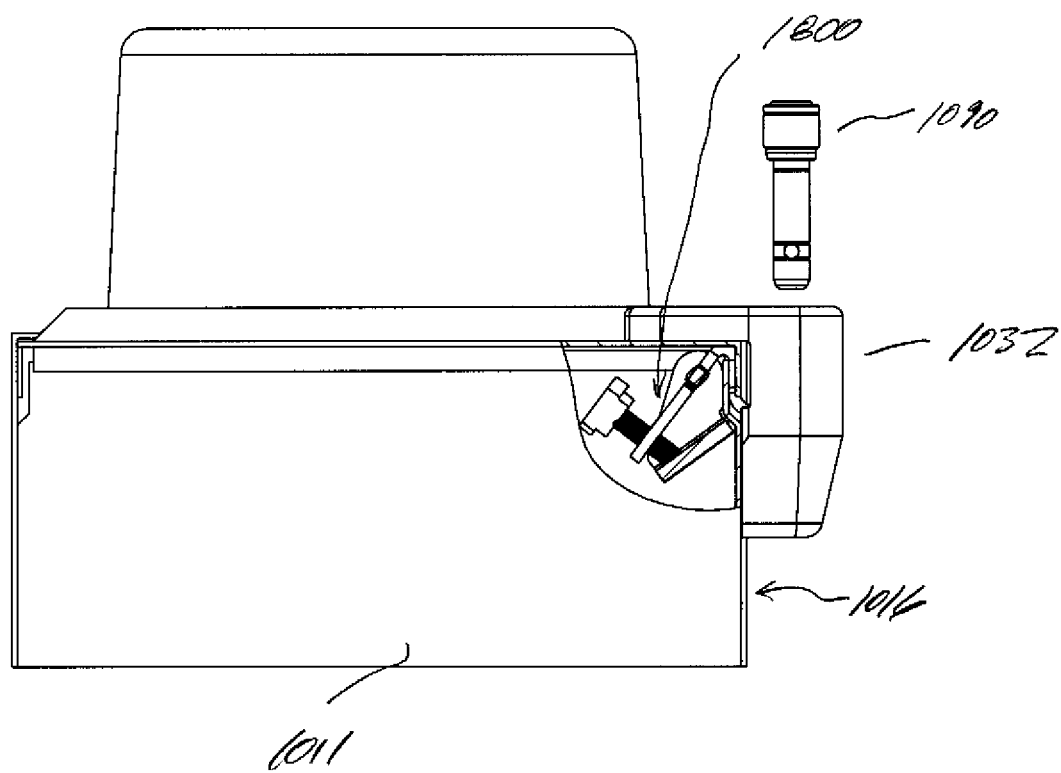
FIG. 23C is a perspective view of meter box and with a sectional cutout view clamping member example embodiment attached in clamped position, housing in securing position and lock position to enter and lock.

Turning now to FIGS. 21A-22A, another non-limiting example embodiment of the invention includes a clamping member 1010, which comprises a bracket portion 1026 adapted to be mounted or hung on a side wall of a meter box, a clamp actuating member 1028, and a fastening shelf 1030 and which further includes a lock housing 1032 as shown in FIG. 23C described further herein. In some embodiments, the meter box comprises an electric utility meter box having a certain configuration. One example of a meter box 1011 is shown in FIG. 23. The meter box 1011 comprises a cover 1012 and a base 1014. The base 1014 includes a plurality of walls, wherein at least one of the plurality of walls comprises a side wall 1016 comprising an upper portion 1018, a lower portion 1022, and an angled portion 1020 disposed between the upper portion 1018 and lower portion of the side wall.

As shown in FIGS. 21A-21C and FIG. 22A, the clamping member 1010 further comprises a clamp 1034 comprising a surrounding member 1036 which surrounds at least a part of the bracket portion of the clamping member. The surrounding member 1036 is adapted for pivotable movement outside and around at least a part of the bracket portion 1026. For example, four clamping engagements, as will be explained further hereinafter, maybe created, outside and around the fastening shelf member 1046, as shown in FIGS. 21B-21C. The bracket portion also comprises bracket members 1052A, 1052B, ideally strengthened as noted further hereinafter, disposed on the bracket body portion 1054, which are adapted to pivotably mount the surrounding member. The bracket members, in some embodiments, are formed from material which is suitably rigid and strengthened, so as to withstand forces, and in certain embodiments, certain enhanced forces, being transmitted to the surrounding member by the clamp actuating member. It will also be appreciated that other parts of the bracket portion, or other structures of the clamping member 1010, are selectively reinforced or stiffened using various through-hardened or other materials to withstand enhanced clamping forces being imparted to the meter box side wall (as will be explained further hereinafter). Additionally, the clamping member may also be further reinforced by ribbing or other strengthening methods, known to persons of skill in the art, in order to prevent undesired deformation of various components or structures of the clamping member when the clamping member is being subject to prying forces or other unwanted tampering and the like.

In an example embodiment, the surrounding member 1036 comprises a first panel 1038A comprising a first clamping engagement surface 1040A and a second panel 1038B comprising a second clamping engagement surface 1040B. The first and second panels 1038A, 1038B are spaced apart, and, in some embodiments are substantially parallel with respect to each other and adapted to pivot in a plane oriented generally perpendicular to the side of wall 1016 of the meter box. The surrounding member 1036 further comprises a grip flange 1042. The grip flange further comprises a grip surface 1044 adapted for engagement with the side wall. The grip flange is carried for pivotal movement by the first and second panels 1038A, 1038B, and in some embodiments, the grip surface 1044 may have a rectangular face extending the width of the grip flange such that the grip surface 1044 is oriented substantially parallel with respect to the longitudinal centerline 1021 of angled portion 1020 of the side wall as shown in FIG. 22B. In other embodiments, the grip surface may be adapted such that a portion of the grip surface engages the angled portion longitudinally or transversely with respect to the centerline 1021 of the angled portion 1020. In other embodiments, the surrounding member comprises a grip surface, referred to as pivoting member comprising a pivoting engagement surface adapted for engagement with various portions of the angled portion or lower portion 1022. It should be noted that the pivoting engagement surface is disposed a certain distance from the bracket members 1052A, 1052B, designated by "R1", shown in an example embodiment in FIG. 28A, to create a desired moment arm about which the pivoting engagement surface rotates or pivots. In addition, it should also be noted that the location at which the distal end 1852 of threaded member 1850, as shown in FIG. 28A and discussed further below, contacts the grip flange 1842 is disposed a certain distance from the pivotal engagement of the bracket members 1052A, 1052B, within the aperture 1854 of the panel 1848, is designated by "R2", shown in an example embodiment in FIG. 28A, in order to create a desired moment arm about which the end of the grip flange 1842 rotates or pivots. Again, this distance could be varied depending on the dimensions and configuration of the grip flange, threaded clamp actuating member and also of the upper, angled and lower portions of the wall as well as to increase the torque imparted by the different possible clamp actuating members shown in FIGS. 21A-28B (i.e., threaded, levered, and as noted herein). This distance in some embodiments will also depend on the location of the angled portion. In an example embodiment, R2 is 0.9 inch, and may range from about 0.6 to 2.0 inches in some embodiments but other distances may be used in other embodiments.

As noted, the clamping member 1010 also comprises a clamp actuating member 1028 adapted to transmit a force to the surrounding member 1036. The clamping member 1010 also further comprises a fastening shelf 1030 as noted. In one example embodiment, the fastening shelf 1030 comprises a fastening shelf member 1046, wherein the fastening shelf member is disposed in generally opposing relation with respect to the surrounding member 1036. In this way, fastening shelf member 1046 serves generally as a force-bearing member, when the clamping member is actuated to contact and pivot the surrounding member 1036 so as to bear against and transmit a clamping force against the side wall 1016.

In a further example embodiment, the fastening shelf member 1046 comprises a shelf flange 1048, wherein at least a portion of the grip surface 1044 is adapted to be disposed in substantially offset opposing relation with respect to the shelf flange 1048 so as to enable offset gripping forces to be applied against the side wall. Such a configuration enhances the clamping forces that may be exerted against the side wall when captured between the grip surface 1044 and the shelf flange. In another embodiment, the fastening shelf member 1046 further comprises a bracket flange 1050. The bracket flange 1050 is ideally positioned substantially adjacent the upper portion 1018 of the side wall 1016 in generally opposing relation with respect to the first and second panels 1038A, 1038B of the surrounding member 1036. With this configuration, the bracket flange 1050 serves generally as a force-bearing member, when the clamping member is actuated and bears against the surrounding member 1036 causing the first and second panels 1038A, 1038B of the surrounding member 1036 in turn to bear against and transmit a clamping force against the upper portion 1018 of the side wall. As shown in FIG. 22A, the clamp actuating member is adapted to bear against the grip flange of the surrounding member 1036 in order to drive the pivotable surrounding member 1036 into the side wall. In some example embodiments, the surrounding member bears against the upper, the lower, and/or the angled portions. Moreover, in another example embodiment, the surrounding member 1036 is adapted to simultaneously distribute a plurality of clamping engagement forces to the side wall. In other embodiments, the clamping member comprises primary and secondary surfaces adapted to engage in tandem when the clamping member is tampered with. For example, the clamping member may be adapted with primary surfaces, such as the first and second engagement surfaces 1040A, 1040B in some embodiments, configured for initial engagement with the upper portion 1018 of the wall when being initially installed on the wall. Then, when the clamping member 1010 is subject to certain prying forces (for example exerted upwardly towards the cover), secondary engagement surfaces, such as at least a portion of the grip flange adapted to be disposed in substantially offset opposing relation with respect to the shelf flange) in some embodiments (or the grip surface in some embodiments), are configured for tandem engagement against the angled portion (and/or lower portion in some embodiments) of the wall to prevent the clamping member from being pried off or removed during unwanted tampering. However, it will be appreciated that the engagement or clamping surfaces of the clamping member may be selectively adapted to engage the upper, lower, and/or angled portion of the wall, described further hereinafter, in any of various engagement combinations to prevent unauthorized removal. In addition, the surrounding member 1036, in some embodiments, may only partially surround at least a part of the bracket portion 1026 of the clamping member; in other embodiments, the surrounding member 1036 may substantially surround the bracket portion. In still other embodiments, as will be explained in further detail herein, the surrounding member 1036 may comprise offset support or outer members (or panels 1038A, 1038B) or protuberances around the engagement perimeter of the surrounding member, including in some example embodiments the engagement surfaces 1040A, 1040B and grip surface, in order to vary the type of clamping force as well as the tension or compression exerted against various areas of the side wall, which may be clamped in deflection or flexure, wherein the cross-sectional profile of the wall is varied.

As noted above, in some example embodiments, both the grip surface 1044 and the engagement surfaces 1040A, 1040B of the first and second panels 1038A, 1038B substantially simultaneously engage the side wall to impart a clamping force. In another embodiment, only the engagement surfaces 1040A, 1040B of the first and second panels 1038A, 1038B initially and simultaneously engage the side wall, as noted above, to impart a clamping force, and if certain upward prying forces are applied to the clamping member to attempt to pry the clamping member past the angled portion of the wall, then the grip surface 1044 will bear against the angled portion of the wall in a tandem engagement manner to resist movement so as to keep the clamping member secured to the side wall. In still another embodiment, only the grip surface 1044 as noted, engages the side wall proximate the angled portion to effect a clamping force. In a further embodiment, only the only the engagement surfaces 1040A, 1040B of the first and second panels 1038A, 1038B engage the side wall to exert a clamping force.

Turning now to FIG. 22C1, and example embodiment is shown, wherein the grip surface 1044 further comprises at least two gripping, or force-concentrating, protuberances 1056A, 1056B, such that at least some of the clamping force is concentrated over a certain region or area to impart desired flexure, shear or compression forces to the side wall during clamping. In an example embodiment, the gripping protuberances 1056A, 1056B are selectively disposed so as to substantially concentrate the clamping force over a certain region or area of the interior surface of the wall in order to create offset or direct clamping forces with respect to the opposing shelf flange as desired. It should be noted that the gripping protuberances may be disposed at various locations along the grip surface as needed to suitably tailor the clamping forces in order to place a desired region of the side wall in flexure (or bending), shear or compression. In this way, at least a portion of the clamping force is transmitted to the side wall and is concentrated on a localized area of the side wall in order to improve gripping performance, with the two force-concentrating protuberances being selectively located on a grip surface 1044. It should be noted however that one or a plurality of protuberances may be disposed along the grip surface 1044 so as to create various gripping configurations. For example, in some embodiments, two protuberances are selectively disposed along the gripping surface and spaced apart in such a way that they are located outside the width of the opposing shelf flange as will be explained in more detail herein. In other example embodiments, the two protuberances may be spaced apart in such a way that they are located within the width of the opposing shelf flange as will be explained in more detail herein. In addition, in further example embodiments, the gripping surface may also comprise only one gripping protuberance, and in still other example embodiments the gripping surface may comprise three, four or more gripping protuberances (in some examples, similar 1056A, 1056B) to selectively concentrate force against the meter box wall. In some example embodiments, at least a portion of the side wall is flexed to conform the portion of the wall, in part, to the configuration or shape of the protuberances, wherein certain translational movement of the clamping member (for example, with respect to the centerline 1021) is inhibited when subject to prying forces.

It will also be appreciated that the protuberances may comprise teeth having a variety of configurations. In one example embodiment, a tooth may have a 4-sided configuration such as that shown in FIG. 21A with sides 1058A, 1058B, 1058C, 1058D. This type of tooth has a shape that forms a vertically-oriented gripping or biting edge 1060. It is simple to manufacture, and it will be appreciated that this type of biting edge is oriented transverse with respect to the centerline 1021 of the angled portion 1020 as shown in FIGS. 21A-21C in order to enhance flexural clamping. In other embodiments, the gripping edge may be oriented at an angle or at least substantially parallel with respect to the centerline 1021. In other embodiments, the tooth may have a pyramid-shaped configuration, chisel-like, pointed or various other configurations.

Referring particularly now to FIG. 21C, in an example embodiment, the shelf flange 1048 is configured with a given width, designated by W1, and the first and second gripping protuberances 1056A, 1056B are selectively spaced apart on the grip surface 1044 wider than the given width W1 of the shelf flange as briefly noted above. With such a configuration, at least some of the clamping force applied generally against the angled portion 1020 of the wall is offset with respect to the opposing, force-bearing shelf flange. That is, the gripping protuberances 1056A, 1056B, in one example embodiment, are not located directly opposite the shelf flange, but are outside the width of the shelf flange, thus creating an offsetting relation of the gripping protuberances 1056A, 1056B with respect to the shelf flange. In this way, at least a part of the area generally proximate or in and around the area of the angled portion may be at least somewhat flexurally captured between the gripping protuberances 1056A, 1056B and the offsetting opposing shelf flange. With this structural configuration, the shelf flange is disposed in a generally opposing offset relation with respect to the engagement (or clamping) force transmitted through the at least two force-concentrating protuberances. In addition, FIG. 21C shows the gripping edge of each protuberance or tooth, located a certain distance away from the sides, designated by "B", of the shelf flange.

In one example embodiment, wall 1016 is securely clamped between grip surface 1044 and fastening shelf 1030, with the optimum distance between the side of the shelf flange and the gripping edge designated as "B" in FIG. 21C. The deformation of wall 1016 caused by gripping protuberances 1056A, 1056B is acute, which enhances the security of the clamping member. In an example embodiment, distance "B" is slightly greater than the thickness of the wall 1016, designated by "T"; however, this can be more or less depending on the size and shape of the protuberances. Distance "A" is the distance between gripping protuberances 1056A, 1056B, which results from distance "B" and the size of the shelf flange. In one example embodiment, the meter box wall thickness "T" is 0.065 inches, distance "B" is 0.075 inches, and distance "A" is 1.070 inches in some embodiments, but other distances may be used in other embodiments. However, these distances could be reduced or increased, as needed, as noted earlier to produce a compressive or crushing engagement or a hybrid-type engagement or clamping force, including both compressive and flexural engagement. in some embodiments but other distances may be used in other embodiments.

It should be recognized that distance "B" may range from about 0.03 to 0.125 inch. Also, the protuberances may also be disposed at the peripheral ends 1062A, 1062E of the grip surface 1044, or the grip surface and protuberances may be extended beyond the width of the panels 1038A, 1038B. However, again, as noted earlier, it should also be recognized that in other embodiments, one or both of the gripping protuberances 1056A, 1056B may be disposed in direct opposing relating with respect to the shelf flange such that the angled portion is gripped generally directly between the gripping protuberances 1056A, 1056B and the shelf flange. In addition, in other embodiments, the protuberances may be disposed and the shelf flange may be configured as shown in FIG. 22C2, including 1056A' 1056B' and 1048', respectively and in FIG. 22C3, including 1056A", 1056B" and 1048", respectively, which represent somewhat similar components to similar reference numbers as shown in FIG. 22C1, to impart various engagement configurations offset inside and outside with respect to the width of the shelf flange. (Note that aperture 1066 is not included in some embodiments, depending, for example, on the type of clamp actuating member used (for example, in FIGS. 21A-28B and as noted herein.)

Referring again to FIGS. 21A-21C, 22A, and 22C1, it will be appreciated that the grip surface offers enhanced security to resist forceful attacks. This configuration (as well as other configurations as noted herein) is adapted to resist prying and tampering forces and unwanted sliding or movement of the clamping member. When the clamping member 1010, in a fully locked and secured mode, is struck or tampered with, the gripping protuberances are adapted to scar the wall over a short distance (in some embodiments) and the sheared wall metal accumulates and, in effect, builds up a thickened mound of metal that becomes very difficult to overcome—such that further sliding or movement is prevented. Consequently, the clamping force achieved with just manual human effort when securing the clamping member, can resist a high impact attack. It should be noted that when there is simultaneous engagement on four areas of the wall (and in some embodiments, four areas of deformation), by the panel engagement surfaces 1040A, 1040B and gripping protuberances 1056A, 1056B of the grip surface, such an engagement configuration serves as a reinforcing and strengthening feature in the meter wall, which preserves the wall integrity so that surface 1044 (including gripping protuberances in some embodiments) can push against wall 1016 and resist forces that would otherwise overcome the wall curvature and angled portion defined by the wall portions 1018, 1020, 1022. In some embodiments, the angled portion 1020, or the jog in the wall, may include the more rigid region of the wall. In addition, in a further embodiment, rather than providing protuberances, the grip surface could form a rectangular recessed area along the grip surface or edge or other recess having ends or corners, wherein it would be adapted such that the rectangular recess is wider than the width of the shelf flange so as to create, in effect, a reverse offset clamping arrangement, where the wall may flex inwardly toward the recessed area of the grip surface.

In the example embodiment illustrated in FIGS. 21A-21C, the first and second panels 1038A, 1038B of the surrounding member 1036 are substantially parallel and are ideally spaced apart, in one example embodiment, by a width designated as W2 as shown in FIG. 21C. The bracket flange 1050 includes first and second sides 1064A, 1064B, wherein the bracket flange 1050 has a width designated by W3, as shown in FIG. 21C, and is disposed in offset opposing relation so as to be force-bearing with respect to the first and second panels 1038A, 1038B when they are pivoted against the upper wall portion 1018. The surrounding member 1036 is adapted to pivot such that the first and second panels 1038A, 1038B contact the wall and force it against the opposing bracket flange 1050 so as to clamp the wall portion therebetween. In this way, the wall may be at least flexurally captured, in some embodiments, between the first and second engagement surfaces 1040A, 1040B of the first and second panels 1038A, 1038B, respectively, and the offsettedly opposing bracket flange 1050. The wall also may be at least compressively captured, in other embodiments, between the first and second engagement surfaces 1040A, 1040B of the first and second panels 1038A, 1038B, respectively, and the opposing bracket flange 1050 as will be explained further herein. As noted above, each of the engagement surfaces 1040A, 1040B of the first and second panels may also include at least one force-concentrating protuberance selectively located on the first and second clamping engagement surfaces. The shape may be similar to that described with respect to the grip surface 1044 and gripping or force-concentrating protuberances. It will be appreciated that with an offset arrangement, the panels are disposed so as to be spaced apart wider than the width of the bracket flange 1050, such that the wall may, in effect, be at least somewhat flexed. As noted, such a configuration provides a means for flexing at least a portion of the side wall of the meter box. In addition, the amount of wall flexure may also be adjusted to a certain extent by the clamping force imparted by the clamp actuating member, explained further hereinafter. This flexural means for offsetting and the means for opposing, for example, depends on the disposition of the protuberances and the opposing bracket flange 1050 or force-bearing member. In some example embodiments, at least a portion of the side wall is flexed to conform the portion of the wall, in part, to the configuration or shape of the engagement surfaces (or protuberances), wherein certain translational or longitudinal movement of the clamping member (for example, with respect to the centerline 1021) is inhibited when subject to prying forces. It should also be noted, that the clamping member in an example embodiment, is formed from a material (such as a metal which is through-hardened (in some embodiments explained further hereinafter) which is suitably rigid or other material such as plastic, composite or other material having suitably rigid properties, wherein the clamping member has a certain configuration, and in some embodiments maintains a such a configuration, when imparting a desired clamping force or load against the side wall of a meter box. Such a configuration provides for enhanced clamping or gripping. Further enhanced clamping is also available to a user as will be explained hereinafter. In addition, in an example embodiment, all components (bracket portion and members, surrounding members, engaging surfaces, fastening shelf and other components) are through-hardened as desired for suitable strength and rigidity. In addition, in other embodiments, certain components (e.g. bracket portion and members, surrounding members, engaging surfaces, fastening shelf and other components) are through-hardened to desired degree for suitable strength and rigidity.

Turning now to FIG. 22B, regarding the surrounding member 1036, in an example embodiment as noted, first and second panels 1038A, 1038B each comprise the first and second clamping engagement surfaces 1040A, 1040B (shown in part) wherein at least some of the clamping force is transmitted to the wall portion 1018 of the meter box shown in FIGS. 22A-22B and 23, so as to concentrate the clamping force on a localized area of the wall portion. In this way, a desired stress is imparted to the box wall in order to further improve gripping performance of the panels when they engage the interior wall of the box wall. With this structural configuration, the bracket flange is disposed in a generally opposing offset relation with respect to the engagement (or clamping) force transmitted through the engagement surfaces. In addition, FIG. 22B shows the engagement surfaces, located a certain distance away from the sides of the bracket flange, designated by "E", of the bracket flange. In one example embodiment, wall 1016 is securely clamped between engagement surfaces 1040A, 1040B and bracket flange 1050, with the optimum distance between the side of the bracket flange and the engagement surfaces designated as "E" in FIG. 22B. The deformation of at least wall 1018 caused by engagement surfaces 1040A, 1040B also enhances the security of the clamping member, particularly in conjunction with the gripping protuberances as noted above. In an example embodiment, distance "E" is slightly less than the thickness of the wall 1018, designated by "T1"; however, this can vary and be more or less depending on the size and shape of the engagement surfaces. Distance "D" is the distance between engagement surfaces, which results from distance "E" and the size of the bracket flange. In one example embodiment, the meter box wall thickness "T" is 0.065 inches, distance "E" is 0.04 inch, and distance "D" is 1.5 inches. However, these distances could be reduced or increased as noted earlier to produce a compressive or crushing engagement or a hybrid-type engagement or clamping force, including both compressive and flexural engagement.

It should be recognized that distance "E" may range from about 0.02 to 0.125 inch. Also, the engagement surfaces may be disposed further outwardly away from the sides of the bracket flange or within the width of the sides of the bracket flange. And again, as noted earlier, it should also be recognized that in other embodiments, the engagement surfaces may be disposed in direct opposing relation with respect to the bracket flange such that at least the upper portion (and in some embodiments the angled portion) is gripped generally directly between the engagement surfaces and the bracket flange (and also, for example, a portion of the shelf flange). In addition, in other embodiments, the engagement surfaces may be disposed and the bracket flange may be configured such that the engagement with the upper portion is similar to that shown with the gripping flange in FIGS. 22C2-22C3, to impart various engagement configurations offset inside and outside with respect to the width of the bracket (and/or shelf flange). Referring again to FIGS. 21A-23, it will be appreciated that the grip surface and engagement surface configurations offer further enhanced security to resist forceful attacks.

Additionally, as noted above, in some example embodiments, both the grip surface and the engagement surfaces 1040A, 1040B of the surrounding member 1036 substantially simultaneously engage the side wall to impart a clamping force. As noted, in some embodiments, either of the grip surfaces or engagement surfaces, or both, may comprise selectively spaced gripping protuberances (similar to 1056A, 1056B) or a grip edge, points, dimples or other surfaces or surface irregularities fostering gripping or clamping. It should also be noted that the grip edge or surfaces may also be oriented with regard to any portion of the side wall in a longitudinal or transverse configuration with respect to, for example, the centerline 1021 of the angled portion. As such, the grip and engagement surfaces 1040A, 1040B may or may not include gripping protuberances (such as 1056A, 1056B), grip edges or otherwise as noted above. As noted briefly, in some embodiments, the engagement surface protuberances are configured similarly to the gripping protuberances or edge. The gripping edges of the engagement surfaces may also be more elongated and substantially vertically-oriented, and in some embodiments transverse, with respect to the centerline 1021 of the wall 1020 and upper wall 1018. However, in certain embodiments, only the engagement surfaces, including any protuberances or edges, of the first and second panels 1038A, 1038B initially and simultaneously engage the side wall, as noted above, to impart a clamping force, and if certain upward prying forces are applied to the clamping member to attempt to pry the clamping member past the angled portion of the wall, then the grip surface, including any protuberances, edges, grip surface or otherwise as noted above, will bear against the angled portion of the wall in a tandem engagement manner to resist movement of the clamping member to keep it secured to the side wall. It should be recognized, that any such engagement may impart offset or direct clamping forces depending on the spacing and configuration of the engagement features as noted above and hereinafter. In still another embodiment, only the grip surface, with any gripping modifications as noted above, engages the side wall proximate the angled portion to effect a clamping force. In a further embodiment, only the engagement surfaces 1040A, 1040B of the first and second panels 1038A, 1038B, with any gripping modifications as noted above, engage the side wall to exert a clamping force. It should also be noted that in an example embodiment, the first and second panels 1038A, 1038B or support walls serve to stiffen the surrounding member and grip flange to allow additional force to be concentrated against the side wall. The clamping member as noted herein may be formed from a through hardened or reinforced material which helps suitably stiffen the clamp and reduces deformation of clamp so as to better concentrate clamping forces against the side wall. This would, in some embodiments, enable deformation of the side wall which more securely enables the clamping member to be secured to the side wall. In addition, when upper or angled portions, for example are held in flexure, the clamping member is inhibited from sliding. In addition, in an example embodiment using a variable-force, threaded clamp actuating member, any sliding or movement may be further inhibited.

Figure 24A:
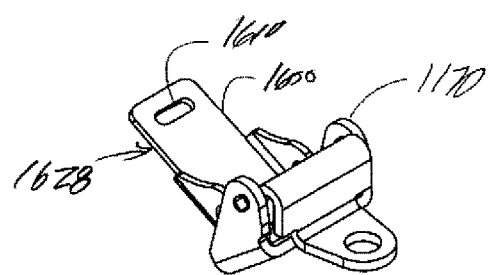
FIG. 24A is a perspective view of another example embodiment of a clamp actuating member.
Figure 24B:
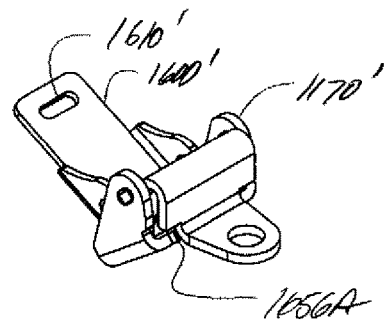
FIG. 24B is a perspective view of another example embodiment of a clamp actuating member and clamping member.

Referring again to FIGS. 21A-22C3, in one example embodiment, the actuating member may comprise a lever. It should be noted that certain mechanical and leverage advantages and features with respect to this embodiment are similar to those discussed earlier regarding FIGS. 1-7C. In addition, such advantages and features also relate to the embodiments shown in FIGS. 24A-26B, however further features and advantages are also provided as noted herein. For example, referring to FIG. 24A, another example embodiment is shown, wherein the clamping member 1170 is in a fully clamped mode and comprises clamp actuating member 1600. With regard to FIGS. 24A-26B, the clamp actuating member functions in cooperation with the fastening shelf and other structures in a similar manner as noted above with regard to clamping member 1010. Regarding clamp actuating member 1600, aperture 1610 provides access for use of an extending member (not shown). In this embodiment, aperture 1610 accommodates insertion of an extending member, for example, such as a common flat head screw driver. An extending member provides a longer moment arm for the clamp actuating member 1600 in order to deliver greater clamping pressure on a meter box. Such a configuration fosters improved positive engagement and attachment to the meter box and thereby improves security and performance of the clamping member 1170 and locking means (not shown) (including various locking systems disclosed and provided for herein) and also enables easier manual operation. In some embodiments, the aperture 1610 can be formed in many ways and have various geometries such as a round, oval, square, rectangular or other suitable configuration, in order to accommodate complementarily configured extending members. Attachment access of an extending member could also be provided with a protruding lance that would also define an aperture. Attachment access of an extending member could also be provided with a protrusion to mate with a tube or socket tool. As shown in FIG. 24B, the example clamp actuating member 1600' can also be used with clamp member 1170' also comprising, in one example embodiment, gripping protuberances (e.g., 1656A (and 1656B (not shown)).

Figure 25A:
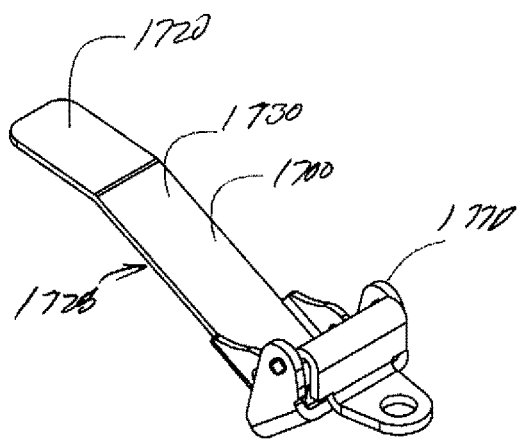
FIG. 25A is a perspective view of another example embodiment of a clamp actuating member and clamping member.
Figure 25B:
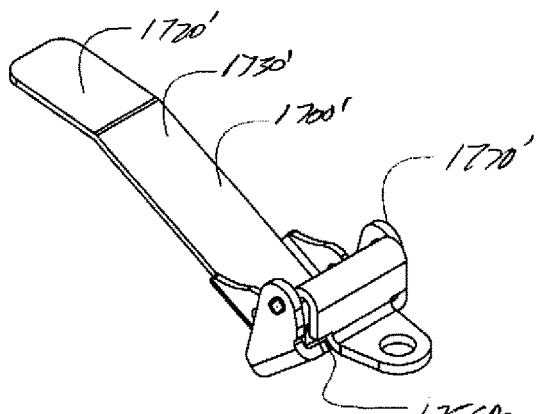
FIG. 25B is a perspective view of another example embodiment of a clamp actuating member and clamping member.

In another example embodiment, an extended moment arm for clamp actuation is provided. For example, as shown in FIGS. 25A and 25B, a clamp actuating member 1700 comprises an extension of the lever arm. Clamp actuating member 1700 comprises an extension 1720 with a bend 1730. Extension 1720 is adapted to be oriented such that it is substantially parallel and flush with the inside surface of a meter box cover (for example, item 1012, shown in FIG. 23) when the cover is installed. It should be noted, that without bend 1730, extension 1720 would interfere with meter box cover preventing the meter box from being properly closed and secured. It should also be noted, that sometimes individuals tampering with or attacking the meter box, will attempt to actuate the clamp actuation member and thereby release the clamping member. With extension 1720 oriented such that it is flush with and parallel to meter box cover, the security apparatus would be difficult to defeat even when meter box security apparatus is tampered with and accessed internally. It will also be appreciated that example clamp actuating member 1700 can also be used with clamping member 1770' shown in FIG. 25B also comprising, in one example embodiment, gripping protuberances (e.g., 1756A (and 1756B (not shown))).

Figure 26A:
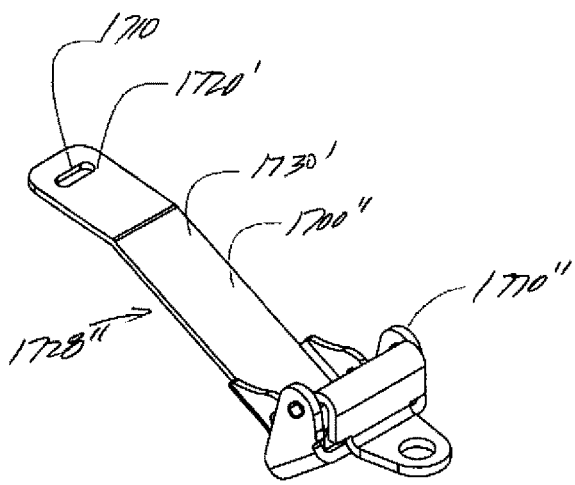
FIG. 26A is a perspective view of another example embodiment of a clamp actuating member and clamping member.
Figure 26B:
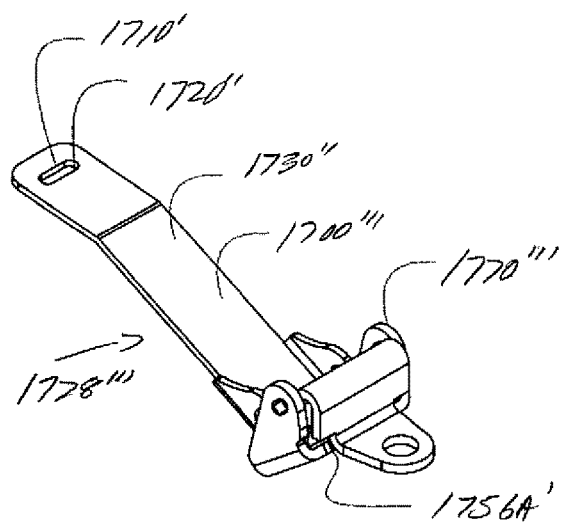
FIG. 26B is a perspective view of another example embodiment of a clamp actuating member and clamping member.

Another example embodiment, shown in FIGS. 26A and 26B, provides clamp actuating member 1700' which combines features of clamp actuating members 1600 and 1700, with extension 1700 and aperture 1610. As shown in FIG. 26B, the example clamp actuating member 1700''' can also be used with clamping member 1770''' also comprising, in one example embodiment, gripping protuberances (e.g., 1756A' (and 1756B' (not shown))). It should also be recognized that an advantage of using a levered embodiment as provided herein, is that it enables a user to quickly install and secure the clamping member.

Figure 27A:
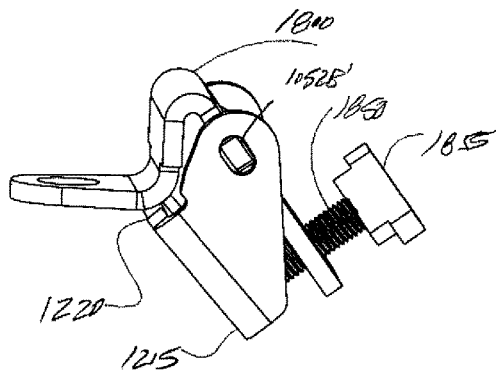
FIG. 27A and FIG. 27B and FIG. 27C are perspective views of another example embodiment of a clamp actuating member and clamping member, fastening shelf and clamp actuating members.
Figure 27B:
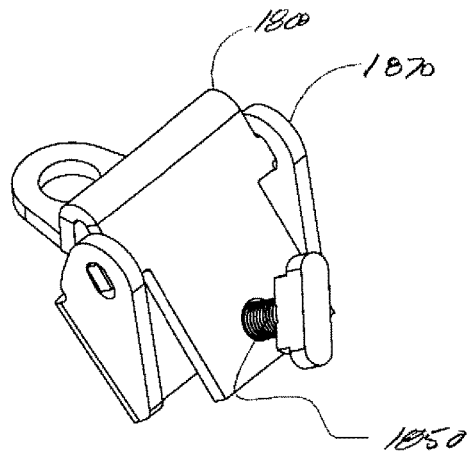
Figure 27C:
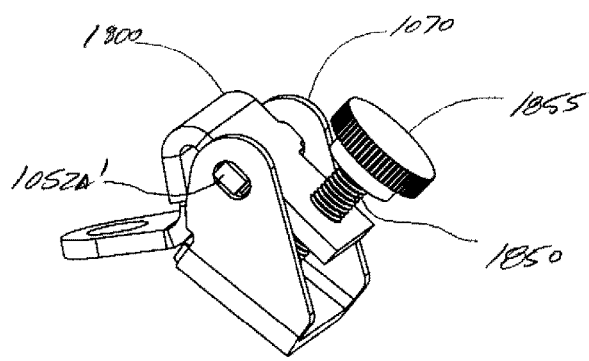
Figure 27D:
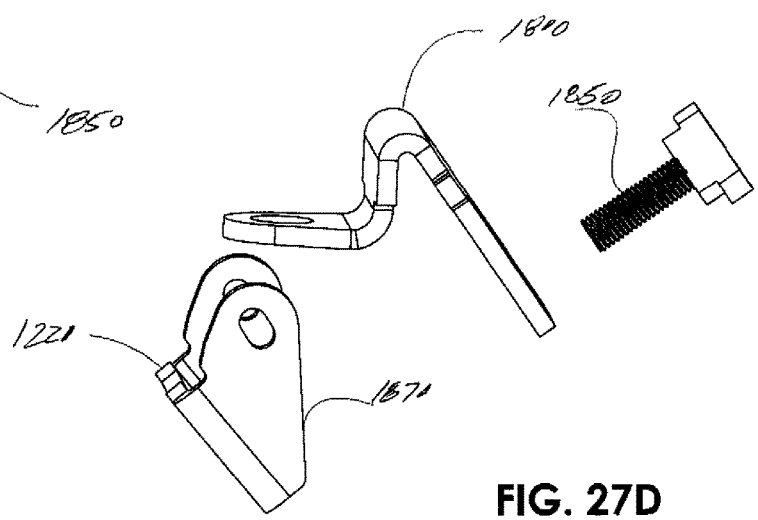
FIG. 27D and FIG. 27E are exploded perspective views of another example embodiment of a clamp actuating member, fastening shelf and clamp actuating member.
Figure 27E:
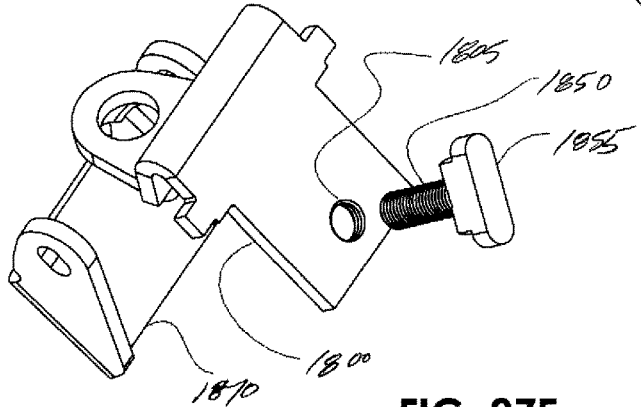
Figure 28A:
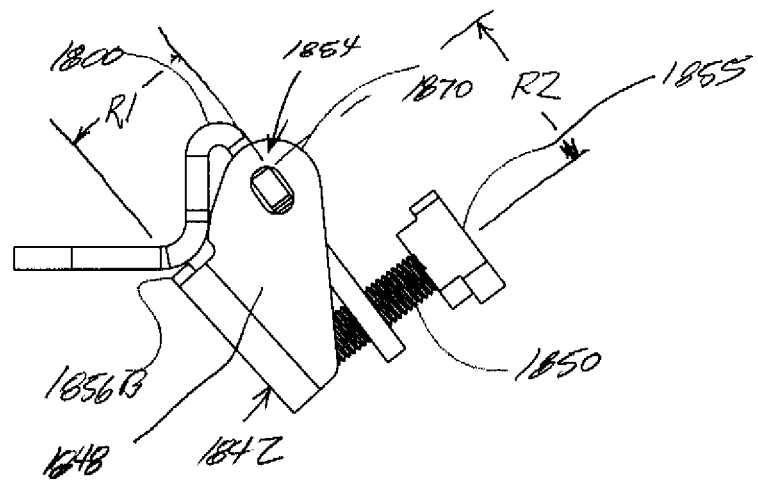
FIG. 28A is a side view of another example embodiment of a clamp actuating member, fastening shelf and clamp actuating member.
Figure 28B:
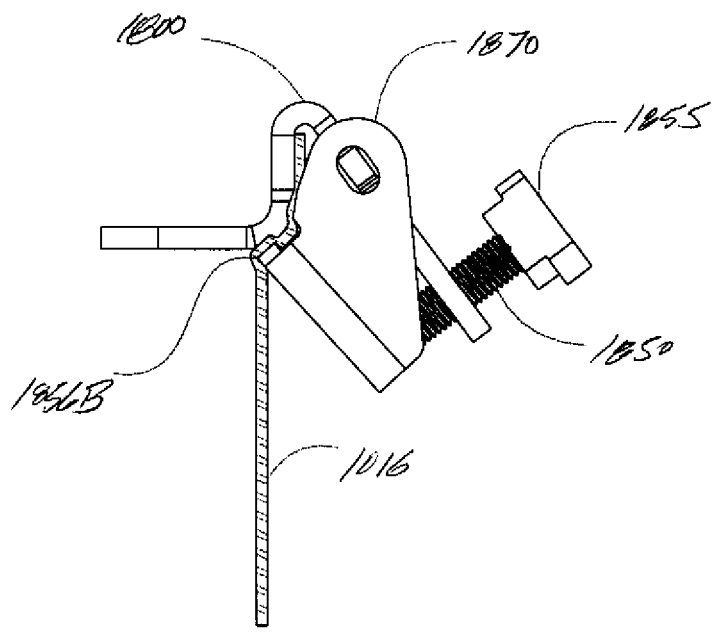
FIG. 28B is a side view of another example embodiment of a clamp actuating member, fastening shelf and clamp actuating member with sectional view of meter box wall onto which it is installed.

Turning now to FIGS. 27A-27E and FIGS. 28A-28B, other embodiments of the clamp actuating member are illustrated. In one example embodiment, FIGS. 27A and 27B show clamp actuating member 1850, which in an example embodiment, provide a threaded driver with a butterfly head 1855 for easy manual operation. In this configuration, threads 1850 are adapted to engage with an aperture formed in bracket portion to bear against the surrounding member of clamping member 1870 into the fully clamped mode. It should also be noted, that the thread pitch and configuration can also be varied to, for example, increase the force imparting ability of the clamping member and in order to vary the force that may be transferred through the driver to the grip flange and surrounding member. The threaded driver enables the clamp to adjustably close on the meter box wall to accommodate variations of meter box geometries and conditions, as some meter boxes are inadvertently deformed due to repeated use and others are deformed by abuse and misuse. As such, the bracket may be configured to support a thumb screw, for example as shown in FIGS. 27A-27E and FIGS. 28A-28B. The thumb screw may have a variety of configurations as noted. In some embodiments, the exterior may also be unknurled and without any readily engageable surface to prevent unauthorized loosening of the screw without a proper tool or the like. Other example embodiments include a round, knurled head 1855 as shown in FIG. 27C or other geometry facilitating manual operation (or a smooth exterior surface explained further herein). Some example embodiments include slots, sockets or protrusions formed in the head 1855 so as to accommodate various tools such as a hex socket for a hex wrench, a slot for a flat head screw driver, a double slot for a Philips screw driver, a socket for a Torx™ wrench, or other configurations that would suitably accommodate a tool or the like. Other example embodiments of 1850 may include, for example, standard screws such as a socket headed cap screw. In one example embodiment, a Shear-Loc™ Thumb Screw Knob with a desired socket head cap screw may be used (e.g., Model K03B-2528-0.75S). FIG. 27D and FIG. 27E show exploded views of an example embodiment. FIG. 28E shows threaded hole 1805 where a threaded driver engages with fastening shelf 1800. Referring to FIG. 28A and FIG. 28B, a further example embodiment is shown in the fully clamped mode comprising clamping member 1870 with at least one protuberance or protrusion 1856B only (and in other embodiments with 1856A not shown), as well as actuating member 1850, and fastening shelf 1800. FIG. 28B shows the clamping member 1870 affixed to a meter box wall 1016. It should also be recognized that an advantage of using a threaded member, in example embodiments, enables accommodation of a range of material thickness by virtue of the variable adjustability of the threaded member.

In another example embodiment, modified clamping surfaces are adapted to create a contour around which the thin walls of the enclosure must deform and comply. The cooperating components thus improve the clamping hold on thin steel that is typically painted, which generally presents a high lubricity surface.

It should also be further noted that the clamp actuating member shown in FIGS. 27A-28B is adjustable to impart various clamping forces as desired (and as noted with regard to those in FIGS. 22A-26B). As briefly noted, it will be appreciated that this variable clamping ability enables a user to apply a desired force as needed for different types of meter boxes and conditions. For example, after using a particular box in the field, the walls may become damaged or bent making it more difficult to attach and secure many conventional clamping devices thereto. However, with the variable clamping ability, further force may be imparted to a wall that is bent to enhance the clamping against the wall. In addition, as noted with regard to use of various types of reinforcing materials, even further enhanced clamping may be achieved as will be explained further herein.

In another example embodiment, the fastening shelf 1030 comprises structure adapted for functional cooperation with the lock housing for securing the clamping member to a meter box as briefly noted. The fastening shelf 1030 comprises a first securing means and the lock housing comprises a second securing means. In an example embodiment. the fastening shelf 1030, is shown in FIGS. 21A-21C. The first securing means comprises a portion of the fastening shelf through which an aperture has been formed. In some embodiments, the aperture is approximately cylindrical in shape and adapted to receive at least a portion of a lock.

Referring now to FIGS. 23A-23C, in an example embodiment, the second securing means comprises a portion of the lock housing through which an aperture has been formed. As with the fastening shelf, in some embodiments, the aperture is also approximately cylindrical in shape and adapted to receive at least a portion of a lock. In some embodiments, the lock includes a plunger lock. In other embodiments the lock includes a barrel lock such as a high security, rotationally actuated disk and tumbler barrel lock and in other embodiments, a SnapLock explained further herein. Such a lock includes a shank having at least one retaining member. The lock is insertable into the housing and adapted to the secure lock housing to the fastening shelf so as to in turn secure a meter box cover to a meter box base. In an example embodiment, a means for interlocking the clamping member and housing is provided. The shelf member and lock housing are adapted to intercooperate so as to secure the clamping member and in turn secure the cover to the meter box base.

For example, in one example embodiment, during installation, the clamping member is fastened into place using a threaded clamp actuating member, for example, such as screw-type member, or thumb screw, or as shown in FIGS. 27A-28B, example embodiments of which are described herein, adapted to be rotationally actuated to contact the surrounding member and pivot the surrounding member towards engagement with the wall 1016. In some embodiments, the clamp actuating member comprises a fastening lever as shown in FIGS. 21A-26B, example embodiments of which are described herein. Once the clamping member is secured as noted herein, the meter box cover 1012 is installed such that the clamp actuating member and one end of clamping member are disposed entirely inside an enclosed portion of closed meter box 1016, while the fastening shelf 1030 remains disposed outside the meter box. In another embodiment, fastening shelf 1030 fits inside a slot or other opening in lock housing 1032, and the meter box 1011 and box cover 1012 are fastened together by a lock such as that described herein (e.g., a plunger type or rotationally actuated barrel lock fastener) inserted through both an aperture 1033 formed in a body portion of lock housing 1032 and an aperture 1031 formed in a body portion of the fastening shelf 1030. In some embodiments, this arrangement is similar to that described with respect to FIGS. 1-7C.

As seen in FIGS. 23A-23C, (in a similar manner as FIGS. 2 and 3), but using clamping member 1010 and lock housing 1032 (instead of items 80 and 70 respectively), according to a further example embodiment, a fully installed meter box security apparatus comprises a meter box having a box cover installed over the head of watthour meter, and a lock housing fastened to a fastening shelf 1030. A plunger type fastener 1090 is inserted into an aperture (similar to item 82 in FIG. 2) formed in a body portion of lock housing 1032 and then through an aperture formed in a body portion of the fastening shelf 1030, thereby securing the lock housing to the clamping member 1010. Lock housing arm (similar to item 100) in turn holds a meter box cover 1012 securely in place so that the meter cannot be tampered with.

In another non-limiting example embodiment, the fastening shelf is integrally formed with the bracket portion of the clamping member, however, in other embodiments, the fastening shelf or other structures of the clamping member may be formed from separate bracket flanges, members and components as noted above, fastened together.

Referring again to FIGS. 21A-21C, in use, an example embodiment is shown wherein the clamping member 1010 is in a fully clamped mode. When fully clamped and secured to meter box 1011, as shown in FIG. 22A, it will be appreciated that four clamping engagements are created, outside and around the fastening shelf member 1046 of fastening shelf 1030. In addition, in an example embodiment, the bracket comprises a body portion, with the body portion comprising at least first and second flanges defining a space therebetween. The surrounding member 1036 of clamp 1034 is adapted to move outside and around the space that separates the first and second flanges, referred to as a bracket portion flange and a bracket flange. Also, in an example embodiment, the surrounding member comprises at least one engagement surface being disposed substantially outside the space defined by the at least two flanges. Moreover, in a further embodiment, the surrounding member further comprises first and second support panels first adapted to carry the grip flange such that the first and second support panels and the grip flange are adapted for pivotable movement substantially outside the space defined by the first and second flanges.

In an example configuration, the side wall 1016, including the upper, angled, and lower portions 1018, 1020, 1022, respectively, is formed from metal described further herein, and all four clamping engagements result from clamping member 1010 deforming the side wall 1016, which resists deformation with spring force; for example, various components of the clamping member have a certain elastic property such that a given component when used to impart a clamping force would, in effect, spring back to its original form after the clamping force is removed. In this embodiment, as shown in FIG. 22B, clamping occurs in the region of the wall between bracket flange 1050 and engagement surfaces 1040A, 1040B of the surrounding member 1036 that twice deform wall 10 of meter box 1011. The clamping by grip surface 1044 shown in FIG. 22C1 occurs in the region of the wall between the surface of the shelf flange 1048 and gripping protuberances 1056A, 1056B that twice deform wall 1022 of meter box 1011. The box wall, in some embodiments, could be characterized as having a plastic property in that wall regions, when subject to a clamping force, would be permanently deformed and not spring back to their original shape after the force is removed. It should be appreciated that, in an example embodiment, the elasticity feature of the material fosters suitable toughness of the components and helps to avoid premature brittle failure of components when subjected to clamping loads. In addition, the material is suitably rigid such that plastic deformation occurs on the meter box wall rather than the components of the clamping member.

Referring again to FIGS. 22A-22C, clamping engagement surfaces and gripping protuberances are shown extending into the side wall. Surface 1044 is shown substantially flush with wall 1020. It will be appreciated that the various embodiments provide an effective system for readily attaching the clamping member to box wall without having to instead drill into the side wall of the box to attach a clamping member and secure the cover to the box. Such a non-drill system, enables a user to more quickly secure a meter box as noted.

In addition, another example embodiment, a method is provided for resisting tampering with a meter box, wherein the box includes at least a cover and a base, the base comprising a plurality of walls, wherein at least one of the plurality of walls comprises a side wall comprising an upper portion, a lower portion, and an angled portion disposed proximately between the upper portion and lower portion of the side wall, and the method includes at least: mounting a clamping member on a side wall of a meter box, wherein the clamping member includes at least a bracket adapted to be mounted on a side wall of a meter box, wherein the clamping member further comprises a clamp comprising a surrounding member adapted for pivotable movement outside and around at least a part of the bracket of the clamping member, and wherein the surrounding member further comprises a grip flange, wherein the clamping member further comprises a clamp actuating member adapted to transmit a force to the surrounding member. In the above example embodiment, the clamping member further comprises a fastening shelf comprising a first securing means, wherein the fastening shelf further comprises a fastening shelf member comprising a shelf flange, wherein at least a portion of the grip flange is adapted to be disposed in substantially offset opposing relation with respect to the shelf flange. The method further includes at least: actuating the clamping member in order to transmit a force to the side wall; opposing the actuating of the clamping member, wherein a clamping force is transmitted to the side wall; (and in some embodiments, concentrating at least some of the clamping force transmitted to the side wall); offsetting the opposing of the clamping force transmitted to the side wall; providing a lock housing comprising a second securing means; disposing the lock housing in functional cooperation with the clamping member, and securing the clamping member using the lock housing. It should be noted that in a further example embodiment, the clamping member and housing may be mounted and installed from a location entirely outside of the meter box. The method may also include interlocking the clamping member fastening shelf and lock housing with a suitable lock (such as a barrel lock, plunger lock, keyless insertion lock (also referred to as the "SnapLock", such as that provided in application Ser. No. 13/070,456, incorporated by reference herein)) to secure the cover to the meter box base. The method may further comprise rotating the clamp actuating member about a rotational axis established by disposition of an engagement member disposed on a body portion of said clamping member, which in some embodiments may be a lever (or toggle) or a threaded clamp actuating member. In another embodiment, the clamp actuating member further comprises a threaded drive member disposed proximal the first end of the body portion of the bracket and further comprising rotating the threaded drive member about a rotational axis, and further comprising driving the pivotable surrounding member about a pivotal axis established by disposition of the grip surface on the pivotable surrounding member, and then further comprising disposing the grip surface, wherein the location of gripping against the side wall is established by disposition of the grip surface on the pivotable surrounding member by a distance R1 (as indicated in FIG. 28A) to provide a configuration and such that moment arm of the grip surface with respect to the bracket members may be maximized. In another embodiment, the method further includes at least the step of delivering an input force to one end of the clamp actuating member so that the clamp actuating member rotates about a rotational axis established by disposition of an engagement member on the clamping member; and then converting the input driving force into a mechanical clamping force that is greater than the input force. Note that this is accomplished in some embodiments with a levered clamp actuating member and in others with a threaded clamp actuating member. In another further embodiment, the method further includes engaging an extension tool, from outside the box, with the distal end (or the engageable end, such a socket head screw or as noted), of the threaded drive member, disposed inside the box, in order to deliver an input force to the drive member (e.g., screw head) wherein the clamp actuating member may be actuated from a location outside the meter box. In another example embodiment, a portion of the clamping member is reinforced by through hardening. In a further embodiment, second securing member comprises a lock receptacle comprising a rotation restricting stop surface. In still a further embodiment, the rotation restricting stop surface of the lock receptacle is adapted to receive a barrel lock comprising a body having a rotation restricting stop surface cooperative with the rotation restricting stop surface of the lock receptacle to prevent rotation of a barrel lock. In a further example embodiment, the rotation restricting stop surface of the lock receptacle is removeable from the second securing member.

In another example embodiment, the clamping member, as well as the housing in some embodiments, may be formed from a higher carbon steel that is through hardened and tempered to provide significant structural strength and, thereby, improve the ability of the clamping member to hold a high-force clamp on side wall of an enclosure, such as a meter box in some example embodiments. In other example embodiments of the invention, a metal stamping operation performed on fully annealed forms draw quality 1050 carbon steel sheet metal is used to form the clamping members. The parts are then assembled and closed in a final forming operation. The assembly is then heat treated and tempered in oil to a Rockwell C hardness specification range of about 40-43, in a non-limiting example embodiment, then plated with cadmium chromate for corrosion resistance. However, a broader range may be from about 37 to 53 Rockwell Hardness in a non-limiting example embodiment. It should also be noted, however, that the mechanical properties of suitable rigidity and toughness may also be achieved using many alternative sheet metals. While some stainless steels are mechanically suitable, such a material may not be as cost-effective. Typical aluminum is generally mechanically unsuitable. Plain carbon steels are typically the most economical and, therefore, ideally suited in some example embodiments. Plain low carbon steels (<0.25% carbon) are highly ductile and hardening is usually done as a surface treatment for wear resistance. Carburizing a low carbon steel for a long period of time can create a thick case depth that can substantially improve the mechanical properties of the part or component and make it suitable for this design and configuration, but the required treatment time typically renders this process less economical than using a higher carbon steel. Plain medium carbon steels (<0.25% to 0.55% carbon) are usually used in the hardened and tempered condition. In an example embodiment, a suitable material (from this broad class) is 1050, which has a carbon content range of about 0.470-0.55% carbon. Achievable hardness correlates with carbon. Steel with 0.25% carbon could achieve the hardness desired, but would be too brittle. The higher carbon of 1050, which can achieve HRC >60, allows for significant tempering. This steel is readily available, economic and compatible with manufacturing processes. This material is then subject to a heat treatment that suits all requirements. Other example embodiments may include steel with carbon content in the range of about 0.40% to 0.45%. As stated above, material selection including 1050 plain carbon steel is ideally cost-effective. It should also be noted that alloying materials could be included such as nickel, silicon, manganese, chromium molybdenum, vanadium and boron which can increase hardenability. As such, carburized, through carburized, tool steel, and microalloy materials may be used in some example embodiments.

The clamping member, in one example embodiment, is formed from a material, for example as noted above, that is suitably rigid and tough so as to withstand various levels of clamping force imparted to a side wall using the clamping member. With such a configuration, a side wall may be deformably clamped between the surrounding member 1036 and fastening shelf, gripping at least a portion of the side wall of a meter box, wherein the at least a portion of the side wall, for example as shown in FIGS. 22A-22B and 21C and noted earlier, is flexurally and deformably captured between the offset protuberances and the shelf flange. In addition, at least a portion of the side wall may be flexed (or deflected) and deformed to conform in part to the configuration or shape of the at least two offset protuberances as shown in FIGS. 22C1-22C3. As also noted earlier, it will be appreciated that the clamp actuating member and other components of the clamping member, in another example embodiment, are ideally formed from a through-hardened material, as noted above regarding use of higher carbon steel, having suitable rigidity, strength, and toughness so as to be able to impart sufficient clamping force. That is, with such rigidity, strength, and toughness, the clamp actuating member can impart an enhanced clamping force against the wall. In addition, such a configuration allows for a threaded clamping actuating member to be further torqued to accommodate thicker wall materials, or damaged or irregular wall surfaces, if more force is needed to secure the clamping member to the wall. It will be further appreciated that the clamp actuating member, in another example embodiment, comprises a engagement element, slot or aperture, such as that shown in FIGS. 24A-24B and 26A-26B, which is adapted to receive a tool. The tool may be used to engage the engagement element to further rotate the clamp actuating member and further drive and pivot the surrounding member 1036 to bear against the wall with additional force so as to impart further additional clamping force against the wall as desired. With such a configuration, the gripping protuberances of the grip member may be forced against the wall and in some embodiments, as briefly noted earlier, may penetrate and deform the wall so as to provide further enhanced clamping force. In addition, with this configuration, the clamping member also provides means for suitably resisting deformation of structures of the clamping member itself, such as for example, the force-bearing opposing member or flange which in some embodiments is through-hardened and reinforced as noted herein. In this way, the clamping member is adapted to bear against the wall, in some embodiments, such that when, for example, a translational tampering force is applied to the clamped clamping member, the protuberances will scar the wall material and effectively dig in as noted earlier. That is, the teeth penetration into the wall material would further deepen or, in effect, plow and build up material, to create an anti-sliding effect. As such, translational movement of the clamping member is effectively resisted. In some embodiments, the clamping force imparted is so effective that prior to device failure the meter box may be pulled away from the wall to which it is attached by anchor bolts or the like. In addition, it should also be recognized, that the reinforcing and enhanced gripping capability of the clamping member, enables the size, shape and configuration of the clamping member to be relatively smaller in comparison to various other clamping devices. As such, the clamping member, in such embodiments, occupies less wall space on the meter box providing a user with more working space in and around the clamping member. This also more readily allows for use of multiple clamping in tight spaces or along the side wall to further improve over meter box security and for use in areas where the is a substantial problem with tampering and utility revenue theft.

Figure 30A:
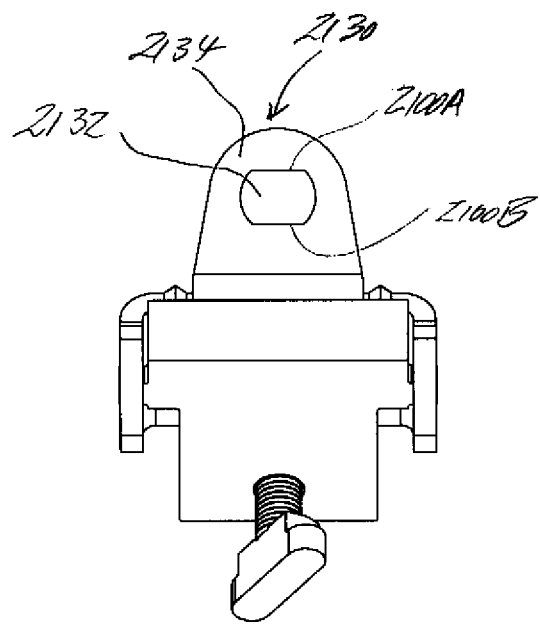
FIG. 30A and FIG. 30B are example embodiments of a clamp actuating member and clamping member, fastening shelf and clamp actuating member.
Figure 30B:
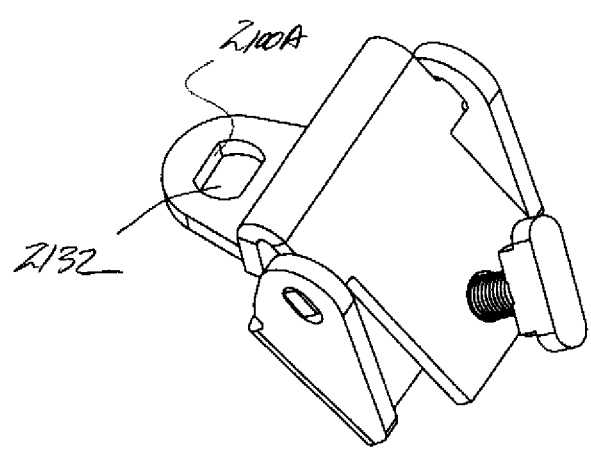
Figure 32A:
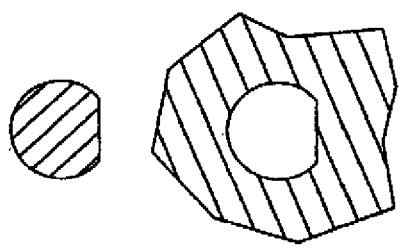
FIGS. 32A-32H show complimentary shapes for the barrel lock shank and lock receptacle to prevent rotation of the lock.
Figure 32B:
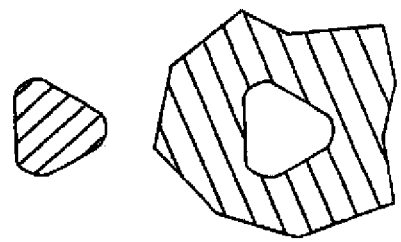
Figure 32C:
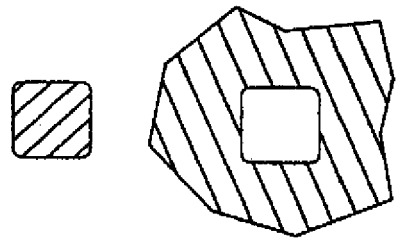
Figure 32D:
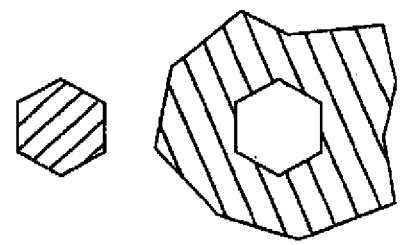
Figure 32E:
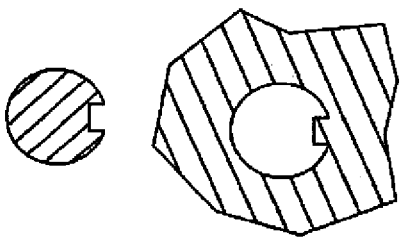
Figure 32F:
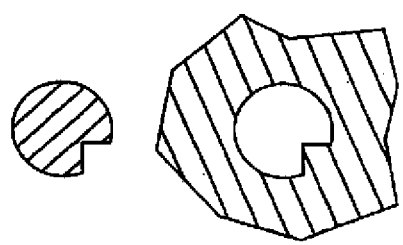
Figure 32G:
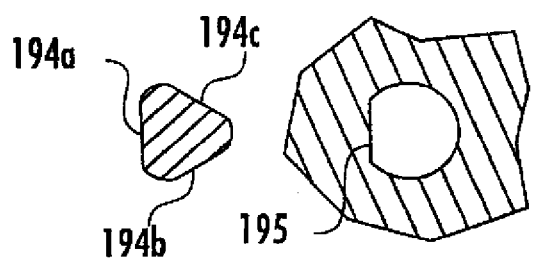
Figure 32H:
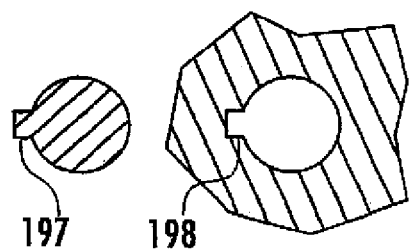

Referring now to FIGS. 30A-31C, a system and method is shown for preventing rotation of a lock, such as a rotationally actuated barrel lock in some embodiments, used with the clamping member and lock housing. The fastening shelf 2130, shown in FIGS. 30A and 30B, includes a lock receptacle for receiving a barrel lock as noted. The barrel lock is adapted to include at least one rotation restricting stop surface or flat on its shank or body which is cooperative with at least one rotation restricting complementary stop surface or flat formed on the aperture of the fastening shelf, or in other embodiments within the aperture of the lock housing. For example, in a non-limiting example embodiment as shown in FIGS. 30A-30B, rotation restriction stop surfaces 2100A and 2100B are disposed or formed on the aperture of the fastening shelf 2130. When the fastening shelf end 2134 is inserted into the lock housing slot, the lock receiving aperture 2132 of the fastening shelf and the lock receiving aperture of the lock housing line up to form the lock receptacle in the housing portion, also similar to that described with respect to FIGS. 1-7C. The barrel lock can then be inserted into the lock receptacle. As noted, the barrel lock has a shank portion with flats thereon complementary with flats on the lock receiving aperture of the lock receptacle (similar to that disclosed in FIGS. 3-10 and 12-13 of U.S. Pat. No. 7,213,424, in its entirety, incorporated by reference herein). In addition, the flats may comprise any of various configurations (as provided in FIGS. 17a-17h in the above-referenced patent) and as provided herein in FIGS. 32A-32H. As shown in FIG. 32G, the lock shank comprises three flats 194a, 194b, 194c, and the lock receptacle comprises a single flat 195. Although these shapes are certainly not identical, such a flat 195 could engage any of the flats 194a through 194c to prevent the barrel lock from rotating, and thereby provide a desired anti-rotation function. Referring to the figures as noted above, the lock receiving aperture 2132 in the fastening shelf has internal flatted areas 2100A, 2100B which engage the flats on the barrel lock, thus preventing the barrel lock from rotating when engaged by a key. In other embodiments, any of the lock receiving apertures which make up the lock receptacle could include the internal flats to engage the barrel lock.

In addition, FIGS. 31A-31C, also show another embodiment including a removable clip adapted to provide at least one rotation restricting complementary stop surface or flat on the aperture of the fastening shelf. Also, multiple clips could be used to provide further flats as well. With such a configuration, the fastening shelf 2130 is convertible to include an anti-rotation or rotation restriction feature or to remove same so as to allow a barrel lock, with or without flats, to freely spin in the aperture.

In an example embodiment, the rotation restricting stop surface of the lock receptacle is adapted to receive a barrel lock comprising a body having a rotation restricting stop surface cooperative with the rotation restricting stop surface of the lock receptacle to prevent rotation of a barrel lock. In another example embodiment, the second securing member described above comprises a lock receptacle comprising a rotation restricting stop surface. In a further embodiment, as noted earlier, the rotation restricting stop surface of the lock receptacle is adapted to receive a barrel lock comprising a body having a rotation restricting stop surface cooperative with the rotation restricting stop surface of the lock receptacle to prevent rotation of a barrel lock. Other embodiments further comprise a rotationally-actuated barrel lock. In addition, as noted, in some embodiments, the rotation restricting stop surface of the lock receptacle is removeable from the second securing member.

Figure 29C:
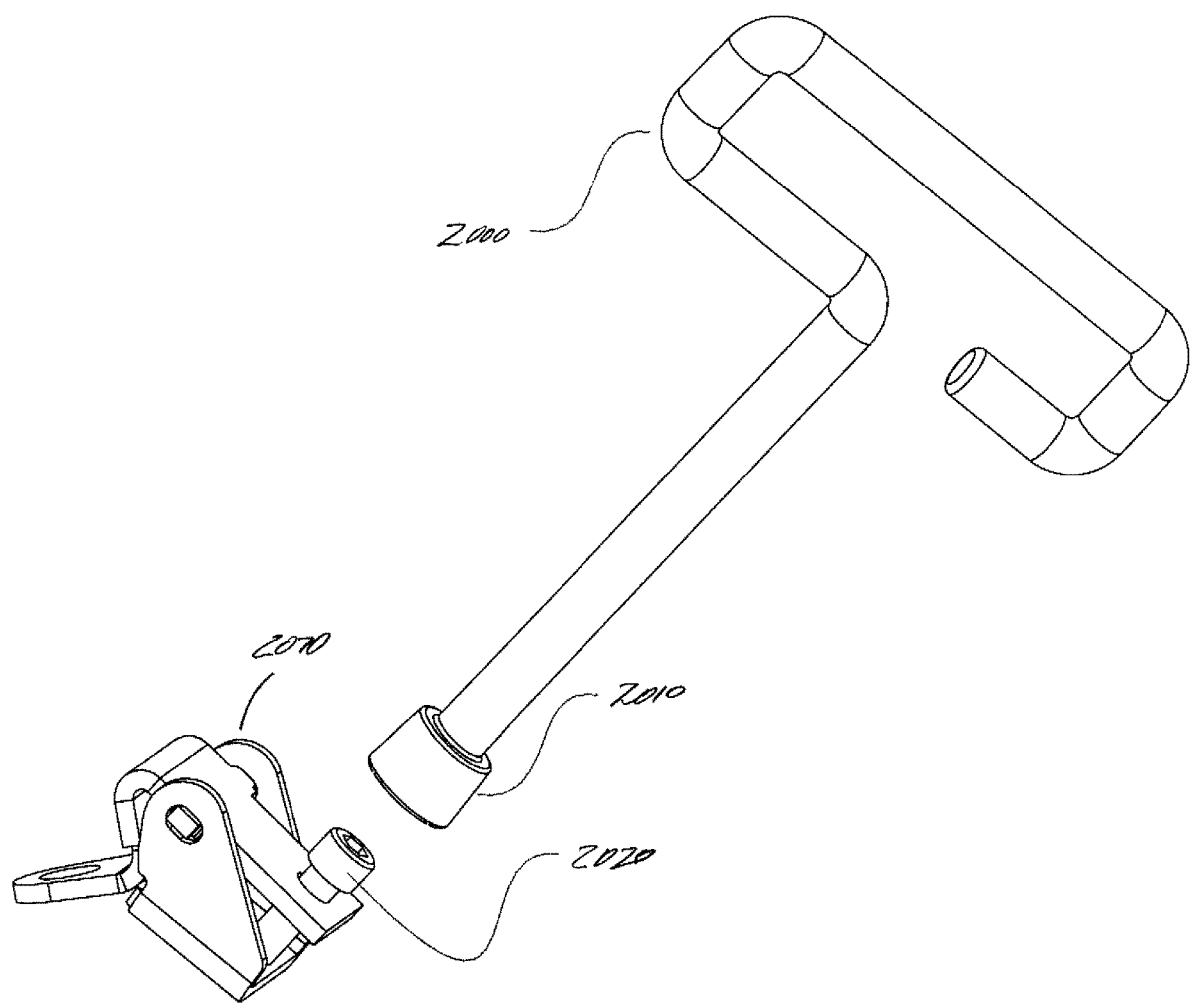
Figure 29D:
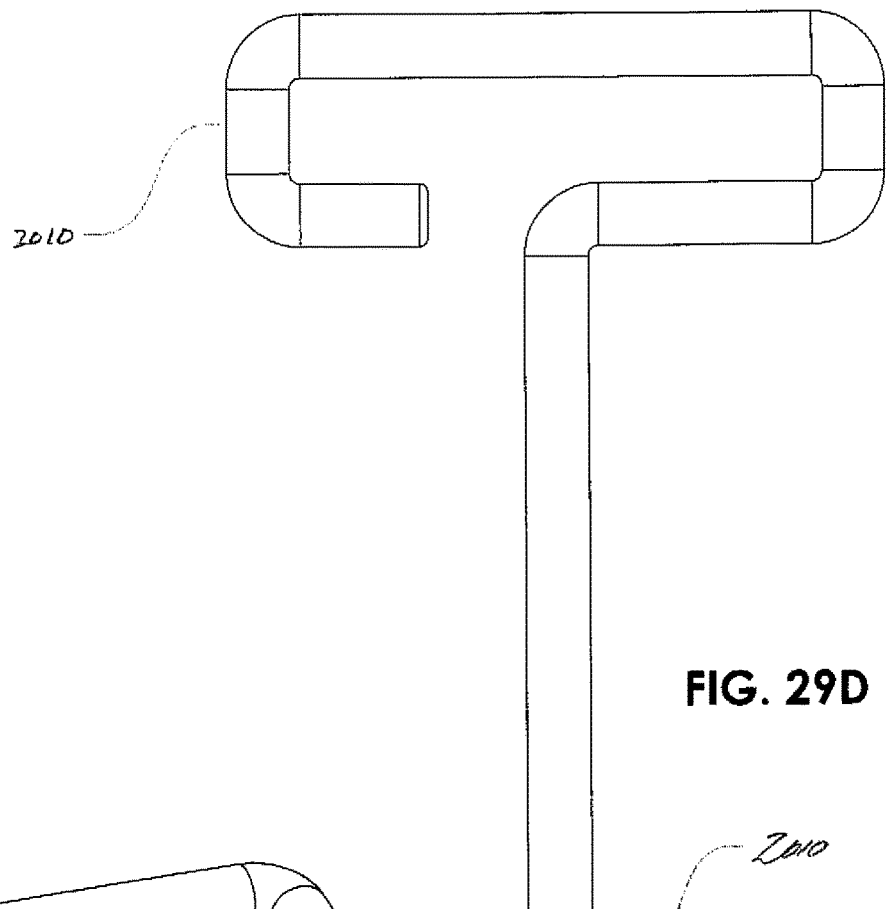
FIG. 29D to 29G are perspective views of example embodiments of an insulated driving tool.
Figure 29E:
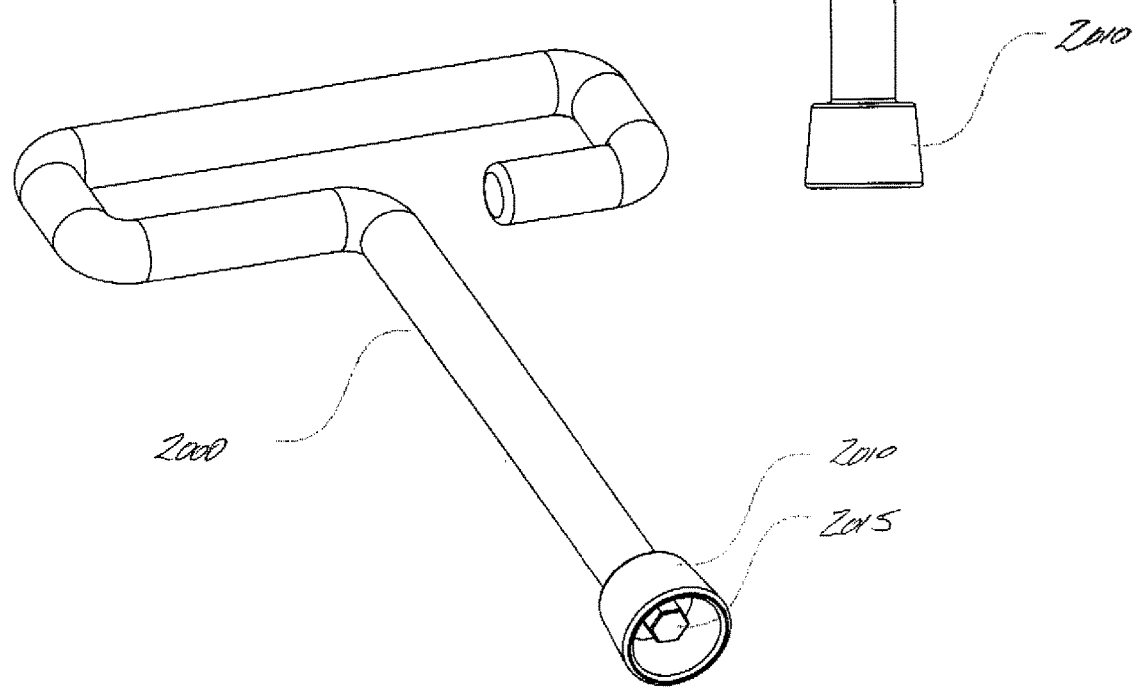

Turning now to FIGS. 29A-29G, in another embodiment, an insulated tool is provided and is used to turn, in an example embodiment, a threaded clamp actuating member. As shown in the embodiment of FIGS. 29A-29E, the threaded clamp actuating member comprises a socket headed cap screw. The tool is ideally formed from steel, like for example typical hex drivers, but, in some embodiments, the tool is fully insulated except, in some embodiments, in the region where the driver must enter the socket headed cap screw. A non-conductive bell shaped structure 2010 inhibits inadvertent access to the exposed surface and facilitates alignment of the tool with the socked headed cap screw. As discussed, FIG. 29A shows the clamp with threaded clamp actuating member 2020 comprising a socket headed cap screw. The outer surface of the head in one example embodiment is smooth, so as to be difficult to engage and turn, in order to prevent tampering and attack by means of an unauthorized tool being used to contact the outer surface and turn the screw. FIG. 29B shows the clamping member 2070 with tool 2000 engaged with member 2020 to enable actuation by a user. FIG. 29C shows the clamping member 2070 with the tool 2000 aligned with member 2020. FIG. 29D shows the tool 2000 and bell shaped structure 2010. FIG. 29E shows the tool 2000 and bell shaped structure 2010 and exposed hex driver 2015. The driver and screw are shown having a hex configuration but could be Torx™, anti-tamper, Phillips, flat head or any other practical mating configuration that enables torque transfer.

Figure 29F:
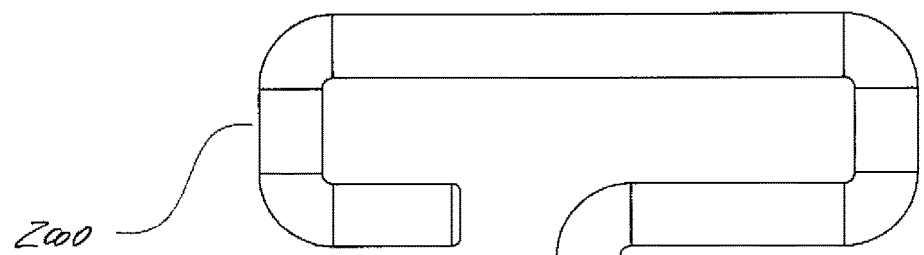
Figure 29G:
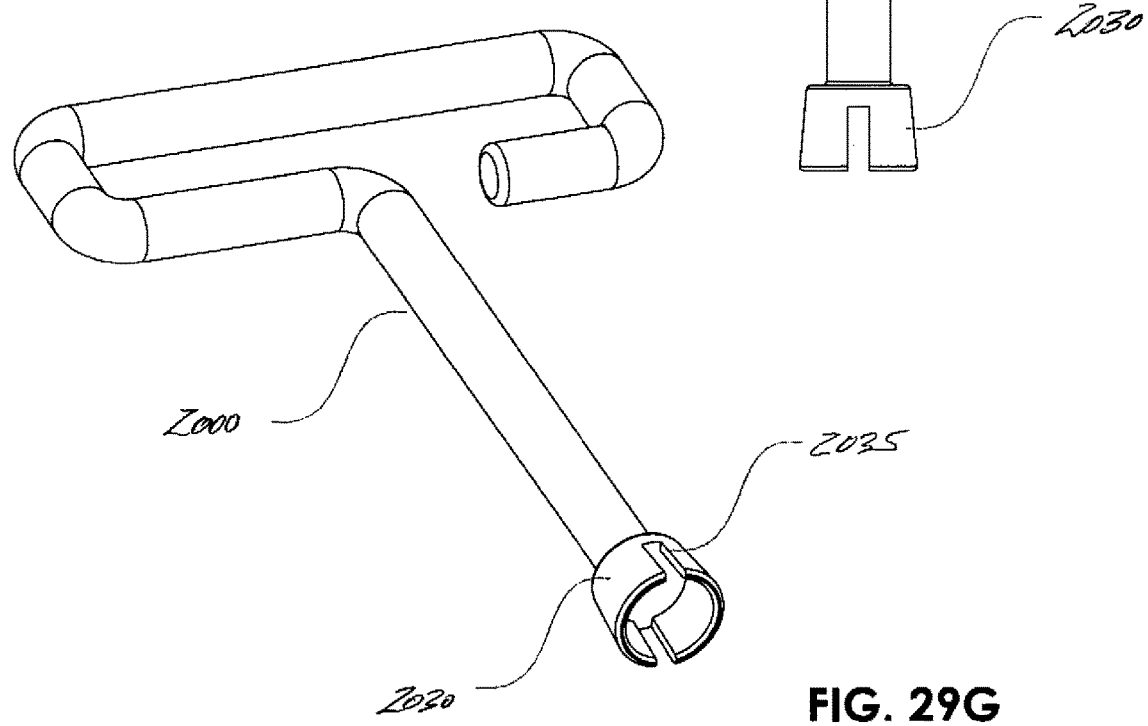

Turning now to FIGS. 29F-29G, in another embodiment, an insulated tool is provided and is used to turn a threaded clamp actuating member having a wing nut, butterfly or other type of rotationally actuated type of threaded member used in the present invention. Such a tool may also be sized and dimensioned, for example with respect to the depth and width of the structure 2030, or slots or openings formed in the structure 2030, which may have a bell or any other shape and configuration such that it could be modified for use as noted herein as well as for use with other devices. Such a tool may be used with any type of threaded member known to persons if ordinary skill in the art. As shown in the embodiment of FIGS. 29F-29G, the tool may readily be used with a wing nut type threaded member. The tool is ideally formed from steel, like for example other typical drivers or torquing tools, but, in some embodiments, the tool is fully insulated except in the region where the driver engages the head of the threaded member. A non-conductive structure 2030, bell shaped in some embodiments, inhibits inadvertent access to the exposed surface and facilitates alignment of tool with the head of the threaded member.

It should be understood that while descriptions and application representations apply to meter boxes, these devices could be used on many enclosures of similar configuration and design that may contain wires or other valuable material that must be protected from theft or tampering. Such applications may include traffic light enclosures, substation enclosures or the like.

It should be noted that the design described does not limit the scope of the embodiments of invention; the number of various elements may change, or various components may be added or removed to the above-described concept.

The foregoing disclosure and description of embodiments of the invention is illustrative and explanatory of the above and variations thereof, and it will be appreciated by those skilled in the art, that various changes in the design, organization, order of operation, means of operation, equipment structures and location, methodology, the use of mechanical equivalents, such as different types of components than as illustrated whereby different steps may be utilized, as well as in the details of the illustrated construction or combinations of features of the various elements may be made without departing from the spirit of the embodiments of the invention. As well, the drawings are intended to describe various concepts of embodiments of the invention so that presently preferred embodiments of the invention will be plainly disclosed to one of skill in the art but are not intended to be manufacturing level drawings or renditions of final products and may include simplified conceptual views as desired for easier and quicker understanding or explanation of embodiments of the invention. As well, the relative size and arrangement of the components may be varied from that shown and the embodiments of the invention still operate well within the spirit of the embodiments of the invention as described hereinbefore and in the appended claims. Thus, various changes and alternatives may be used that are contained within the spirit of the embodiments of the invention. It is therefore desired that the invention not be limited to these embodiments, and it is intended that the appended claims cover all such modifications as fall within the true spirit and scope of the invention.

Accordingly, the foregoing specification is provided for illustrative purposes only, and is not intended to describe all possible aspects of the example embodiments of the invention. It also will be appreciated by those skilled in the art, that certain various changes in the ordering of steps, ranges, interferences, spacings, components, hardware, and/or attributes and parameters, as well as in the details of the illustrations or combinations of features of the methods and system discussed herein, may be made without departing from the spirit of the embodiments of the invention. Moreover, while various embodiments of the invention have been shown and described in detail, those of ordinary skill in the art will appreciate that changes to the description, and various other modifications, omissions and additions may also be made without departing from either the spirit or scope thereof.

What is claimed is:

1. An apparatus for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the apparatus comprising:
   a clamping member comprising a bracket adapted to be mounted on a side wall of a meter box, wherein the clamping member further comprises;
      a clamp comprising a surrounding member adapted for pivotable movement outside at least a part of the bracket of the clamping member, and wherein the surrounding member further comprises a grip flange comprising a grip surface engageable with side wall;
      a clamp actuating member adapted to transmit a force to the surrounding member;
      a fastening shelf comprising a first securing means, and wherein the fastening shelf further comprises a fastening shelf member comprising a shelf flange, and wherein at least a portion of the grip flange is adapted to be disposed in substantially offset opposing relation with respect to the shelf flange, and wherein at least the grip surface is moveable outside at least a part of the bracket; and
   a lock housing comprising a second securing means.

2. The apparatus of claim 1, wherein the shelf flange has a given width, and wherein the grip surface comprises first and second protuberances selectively spaced apart wider than the width of the shelf flange.

3. The apparatus of claim 1, wherein the fastening shelf member further comprises a bracket flange, and wherein the surrounding member further comprises first and second support panels disposed in substantially offset opposing relation with respect to the bracket flange.

4. The apparatus of claim 3, wherein the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

5. The apparatus of claim 4, wherein at least a portion of the side wall is flexed when clamped between the surrounding member and the fastening shelf member.

6. The apparatus of claim 1, wherein at least a portion of the clamping member is reinforced by through hardening.

7. The apparatus of claim 1, wherein the second securing means comprises a lock receptacle comprising a rotation restricting stop surface.

8. The apparatus of claim 7, wherein the rotation restricting stop surface of the lock receptacle is dapted to receive a barrel lock comprising a body having a rotation restricting stop surface cooperative with the rotation restricting stop surface of the lock receptacle to prevent rotation of a barrel lock.

9. The apparatus of claim 8, further comprising a rotationally-actuated barrel lock.

10. The apparatus of claim 7, wherein the rotation restricting stop surface of the lock receptacle is removeable from the second securing means.

11. The apparatus of claim 1, wherein the clamp actuating member comprises a rotationally actuated threaded member.

12. The apparatus of claim 1, wherein the bracket comprises a body portion, the body portion comprising at least two flanges defining a space therebetween.

13. The apparatus of claim 12, wherein the surrounding member comprises at least one engagement surface being disposed substantially outside the space defined by the at least two flanges.

14. The apparatus of claim 12, wherein the surrounding member further comprises first and second support panels first adapted to carry the grip flange and wherein first and second support panels and the grip flange are adapted for pivotable movement substantially outside the space defined by the at least two flanges.

15. The apparatus of claim 1, further comprising a plunger type fastener.

16. The apparatus of claim 1, further comprising a plunger type fastener, and then securing the plunger type fastener by means of a retaining member.

17. An apparatus for resisting tampering with a meter box, the meter box comprising a cover and a base, the base comprising a plurality of walls, the apparatus comprising:
 a clamping member comprising a bracket configured to be mounted on a side wall of a meter box, wherein the clamping member further comprises;
  a clamp comprising a surrounding member configured for pivotable movement outside at least a part of the bracket of the clamping member, and wherein the surrounding member further comprises a grip flange comprising a grip surface engageable with the side wall;
  a clamp actuating member configured to transmit a force to the surrounding member;
  a fastening shelf comprising a fastening shelf member and a first securing means, and wherein at least a portion of the grip flange is disposed in substantially offset opposing relation with respect to at least a portion of the fastening shelf member, and wherein at least the grip surface is moveable outside at least a part of the bracket; and
 a lock housing comprising a second securing means.

18. The apparatus of claim 17, and wherein the fastening shelf further comprises a fastening shelf member comprising a shelf flange.

19. The apparatus of claim 18, wherein the shelf flange has a given width, and wherein the grip surface comprises first and second protuberances selectively spaced apart wider than the width of the shelf flange.

20. The apparatus of claim 19, wherein the fastening shelf member further comprises a bracket flange, and wherein the surrounding member further comprises first and second support panels disposed in substantially offset opposing relation with respect to the bracket flange.

21. The apparatus of claim 20, wherein at least one of the plurality of walls comprises a side wall comprising an upper portion, a lower portion, and an angled portion disposed between the upper portion and lower portion of the side wall, wherein the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

22. The apparatus of claim 21, wherein at least a portion of the side wall is flexed when clamped between the surrounding member and the fastening shelf member.

23. The apparatus of claim 17, wherein at least a portion of the clamping member is reinforced by through hardening.

24. The apparatus of claim 17, wherein the second securing means comprises a lock receptacle comprising a rotation restricting stop surface.

25. The apparatus of claim 24, wherein the rotation restricting stop surface of the lock receptacle is adapted to receive a barrel lock comprising a body having a rotation restricting stop surface cooperative with the rotation restricting stop surface of the lock receptacle to prevent rotation of a barrel lock.

26. The apparatus of claim 25, further comprising a rotationally-actuated barrel lock.

27. The apparatus of claim 24, wherein the rotation restricting stop surface of the lock receptacle is removeable from the second securing means.

28. The apparatus of claim 17, wherein the clamp actuating member comprises a rotationally actuated threaded member.

29. The apparatus of claim 17, wherein the bracket comprises a body portion, the body portion comprising at least two flanges defining a space therebetween, and wherein the surrounding member comprises at least one engagement surface being disposed substantially outside the space defined by the at least two flanges.

30. The apparatus of claim 29, wherein the surrounding member further comprises first and second support panels first adapted to carry the grip flange and wherein first and second support panels and the grip flange are adapted for pivotable movement substantially outside the space defined by the at least two flanges.

31. The apparatus of claim 17, further comprising a plunger type fastener, and then securing the plunger type fastener by means of a retaining member.

32. A method for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the method comprising:
 providing a clamping member comprising a bracket configured to be mounted on a side wall of a meter box, wherein the providing the clamping member further comprises;
  disposing a clamp on the clamping member, the clamp comprising a surrounding member, wherein the surrounding member is configured to pivotally move outside at least a part of the bracket of the clamping member, and disposing a grip flange on the surrounding member, the grip flange comprising a grip surface engageable with the side wall;
  providing a clamp actuating member configured to transmit a force to the surrounding member;
  providing a fastening shelf comprising a first securing means, and wherein the fastening shelf further comprises a fastening shelf member comprising a shelf flange, and disposing at least a portion of the grip flange in substantially offset opposing relation with respect to the shelf flange, and wherein at least the grip surface is moveable outside at least a part of the bracket; and
 disposing a second securing means on a lock housing.

33. The method of claim 32, and dimensioning the shelf flange with a given width, and positioning first and second protuberances on the grip surface wherein the first and second protuberances are selectively spaced apart wider than the width of the shelf flange.

34. The method of claim 32, wherein the fastening shelf member further comprises a bracket flange, and wherein the surrounding member further comprises first and second support panels disposed in substantially offset opposing relation with respect to the bracket flange.

35. The method of claim 34, and disposing at least first and second engagement surfaces on the first and second panels respectively, wherein the at least first and second engagement surfaces are disposed to engage the upper portion of the wall, and wherein the at least a portion of the grip flange is adapted to engage the angled portion of the wall, wherein the surrounding member is adapted to simultaneously distribute a plurality of clamping engagement forces to the wall.

36. The method of claim 33, and flexing at least a portion of the side wall when clamping the at least a portion of the side wall between the surrounding member and the fastening shelf member.

37. The method of claim 32, wherein at least a portion of the clamping member is reinforced by through hardening.

38. The method of claim 32, wherein the second securing means comprises a lock receptacle comprising a rotation restricting stop surface.

39. The method of claim 38, wherein the rotation restricting stop surface of the lock receptacle is adapted to receive a barrel lock comprising a body having a rotation restricting stop surface cooperative with the rotation restricting stop surface of the lock receptacle to prevent rotation of a barrel lock.

40. The method of claim 39, further comprising a rotationally- actuated barrel lock.

41. The method of claim 38, wherein the rotation restricting stop surface of the lock receptacle is removeable from the second securing means.

42. The method of claim 32, wherein the clamp actuating member comprises a rotationally actuated threaded member.

43. The method of claim 32, wherein the bracket comprises a body portion, the body portion comprising at least two flanges defining a space therebetween, wherein the surrounding member comprises at least one engagement surface being disposed substantially outside the space defined by the at least two flanges.

44. The method of claim 43, wherein the surrounding member further comprises first and second support panels first adapted to carry the grip flange and wherein first and second support panels and the grip flange are adapted for pivotable movement substantially outside the space defined by the at least two flanges.

45. The method of claim 32, further comprising a plunger type fastener, and then securing the plunger type fastener by means of a retaining member.

46. An apparatus for resisting tampering with a meter box, the meter box comprising a cover and a base, the base comprising a plurality of walls, wherein at least one of the plurality of walls comprises a side wall comprising an upper portion, a lower portion, and an angled portion disposed between the upper portion and lower portion of the side wall, the apparatus comprising:
  a clamping member comprising a bracket adapted to be mounted on a side wall of a meter box, wherein the clamping member further comprises;
    a clamp comprising a surrounding member adapted for pivotable movement outside at least a part of the bracket of the clamping member, and wherein the surrounding member further comprises a grip flange comprising a grip surface engageable with the side wall;
    a clamp actuating member adapted to transmit a force to the surrounding member;
    a fastening shelf comprising a first securing means, and wherein the fastening shelf further comprises a fastening shelf member comprising a shelf flange, the shelf flange comprising a given width, and wherein the grip surface comprises first and second protuberances selectively spaced apart wider than the given width of the shelf flange, and wherein at least a portion of the grip flange is adapted to be disposed in substantially offset opposing relation with respect to the shelf flange, at least the grip surface being moveable outside at least a part of the bracket, and wherein the fastening shelf member further comprises a bracket flange, the surrounding member further comprising first and second support panels disposed in substantially offset direct opposing relation with respect to the bracket flange; and
  a lock housing comprising a second securing means.

47. The apparatus of claim 46, wherein the first and second panels comprise at least first and second respective engagement surfaces adapted to engage the upper portion of the wall, and wherein the at least a portion of the grip flange is adapted to engage the angled portion of the wall, wherein the surrounding member is adapted to simultaneously distribute a plurality of clamping engagement forces to the wall.

48. The apparatus of claim 47, wherein at least a portion of the side wall is flexed when clamped between the surrounding member and the fastening shelf member.

49. The apparatus of claim 46, wherein at least a portion of the clamping member is reinforced by through hardening.

50. The apparatus of claim 46, wherein the second securing means comprises a lock receptacle comprising a rotation restricting stop surface, wherein the rotation restricting stop surface of the lock receptacle is adapted to receive a barrel lock comprising a body having a rotation restricting stop surface cooperative with the rotation restricting stop surface of the lock receptacle to prevent rotation of a barrel lock.

51. The apparatus of claim 50, further comprising a rotationally-actuated barrel lock.

52. The apparatus of claim 50, wherein the rotation restricting stop surface of the lock receptacle is removeable from the second securing means.

53. The apparatus of claim 50, wherein the clamp actuating member comprises a rotationally actuated threaded member.

54. The apparatus of claim 46, wherein the bracket comprises a body portion, the body portion comprising at least two flanges defining a space therebetween, wherein the surrounding member comprises at least one engagement surface being disposed substantially outside the space defined by the at least two flanges.

55. The apparatus of claim 54, wherein the surrounding member further comprises first and second support panels first adapted to carry the grip flange and wherein first and second support panels and the grip flange are adapted for pivotable movement substantially outside the space defined by the at least two flanges.

56. The apparatus of claim 46, further comprising a plunger type fastener, and then securing the plunger type fastener by means of a retaining member.

* * * * *